United States Patent
Carducci et al.

(10) Patent No.: US 6,797,639 B2
(45) Date of Patent: Sep. 28, 2004

(54) DIELECTRIC ETCH CHAMBER WITH EXPANDED PROCESS WINDOW

(75) Inventors: James D Carducci, Sunnyvale, CA (US); Hamid Noorbakhsh, Fremont, CA (US); Evans Y Lee, Milpitas, CA (US); Bryan Y Pu, San Jose, CA (US); Hongching Shan, Cupertino, CA (US); Claes Bjorkman, Mountain View, CA (US); Siamak Salimian, Sunnyvale, CA (US); Paul E Luscher, Sunnyvale, CA (US); Michael D Welch, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 10 days.

(21) Appl. No.: 10/254,969

(22) Filed: Sep. 24, 2002

(65) Prior Publication Data

US 2003/0038111 A1 Feb. 27, 2003

Related U.S. Application Data

(62) Division of application No. 09/704,972, filed on Nov. 1, 2000, now abandoned.

(51) Int. Cl.[7] .......................... H01L 21/00; H05H 1/00; C23C 16/00
(52) U.S. Cl. .................... 438/710; 216/67; 156/345.47; 156/345.29; 118/723 E; 118/715
(58) Field of Search ................ 438/710–711, 714, 438/715, 723, 724, 728; 216/67, 78, 79; 156/345.47, 345.29, 345.33, 345.34, 345.49; 118/703 E, 715, 723 MR, 723 I

(56) References Cited

U.S. PATENT DOCUMENTS 4,033,287 A 7/1977 Alexander, Jr. et al. . 118/723 E (List continued on next page.)

FOREIGN PATENT DOCUMENTS

| EP | 0 512 936 A1 | 11/1992 |
| EP | 0 942 060 A1 | 9/1999 |
| JP | 10-209257 | 8/1999 |
| JP | 02000012285 A | 1/2000 |

OTHER PUBLICATIONS

Patent Abstracts of Japan. Publication No. 0189928. Sep. 27, 1985 (Fujitsu).

Patent Abstracts of Japan. Publication No. 403281780. Dec. 12, 1991 (Hitaghi).

Patent Abstracts of Japan. Publication No. 09191002 A. Jul. 22, 1997 (Fukuda Seiichi).

Patent Abstracts of Japan, Publication No. 11176920, Feb. 7, 1999 (Shin Etsu Chem Co Ltd).

Chatterjee, R., Karecki, S., Pruette, L., and Reif, R., "Evaluation of Unsaturated Fluorocarbons for Dielectric Etch Applications," *Electrochemical Society Proceedings*, vol. 99–30. 1999, pp. 251–262.

*Primary Examiner*—Parviz Hassanzadeh
(74) *Attorney, Agent, or Firm*—Robert M. Wallace; Joseph Bach

(57) ABSTRACT

A capacitively coupled reactor for plasma etch processing of substrates at subatmospheric pressures includes a chamber body defining a processing volume, a lid provided upon the chamber body, the lid being a first electrode, a substrate support provided in the processing volume and comprising a second electrode, a radio frequency source coupled at least to one of the first and second electrodes, a process gas inlet configured to deliver process gas into the processing volume, and an evacuation pump system having pumping capacity of at least 1600 liters/minute. The greater pumping capacity controls residency time of the process gases so as to regulate the degree of dissociation into more reactive species.

30 Claims, 28 Drawing Sheets

U.S. PATENT DOCUMENTS

| | | |
|---|---|---|
| 4,842,683 A | 6/1989 | Cheng et al. ................ 156/345 |
| 4,924,807 A | 5/1990 | Nakayama et al. ......... 118/725 |
| 4,980,204 A | 12/1990 | Fuji et al. ................ 427/255.2 |
| 5,070,814 A | 12/1991 | Whiffen et al. ............. 118/715 |
| 5,105,761 A | 4/1992 | Charlet et al. ....... 118/723 ME |
| 5,194,550 A | 3/1993 | Rance et al. ........... 526/318.25 |
| 5,244,501 A | 9/1993 | Nakayama et al. ......... 118/725 |
| 5,282,899 A | 2/1994 | Balmashnov et al. ....... 118/723 |
| 5,338,399 A | 8/1994 | Yanagida ................... 156/662 |
| 5,366,590 A | 11/1994 | Kadomura .................. 156/662 |
| 5,368,685 A | 11/1994 | Kumihashi et al. ......... 156/643 |
| 5,698,062 A | 12/1997 | Sakamoto et al. ..... 156/345.44 |
| 5,753,132 A | 5/1998 | Shamouilian et al. ......... 216/33 |
| 5,788,799 A | 8/1998 | Steger et al. ................ 156/345 |
| 5,798,016 A | 8/1998 | Oehrlein et al. ............ 156/345 |
| 5,843,847 A | 12/1998 | Pu et al. ..................... 438/723 |
| 5,870,271 A | 2/1999 | Herchen .................... 361/234 |
| 5,886,863 A | 3/1999 | Nagasaki et al. ........... 361/234 |
| 5,888,309 A | 3/1999 | Yu .............................. 134/1.2 |
| 5,980,687 A | 11/1999 | Koshimizu .................. 156/345 |
| 6,014,943 A | 1/2000 | Arami et al. ............ 118/723 E |
| 6,063,199 A | 5/2000 | Sajoto et al. ................ 118/715 |
| 6,073,577 A | 6/2000 | Lilleland et al. ............ 118/723 |
| 6,108,189 A | 8/2000 | Weldon et al. .............. 361/234 |
| 6,122,159 A | 9/2000 | Arai et al. ................... 361/234 |
| 6,165,910 A | 12/2000 | Flanner et al. .............. 438/743 |
| 6,166,897 A | 12/2000 | Matsunaga .................. 361/234 |
| 6,174,451 B1 * | 1/2001 | Hung et al. ................... 216/67 |
| 6,230,651 B1 | 5/2001 | Ni et al. ..................... 118/723 |
| 6,251,216 B1 | 6/2001 | Okamura et al. ........... 156/345 |
| 6,387,287 B1 * | 5/2002 | Hung et al. ................... 216/67 |
| 6,403,491 B1 * | 6/2002 | Liu et al. .................... 438/710 |
| 2003/0000913 A1 * | 1/2003 | Hung et al. ..................... 216/2 |

* cited by examiner

DIELECTRIC ETCH CHAMBER WITH EXPANDED PROCESS WINDOW

CROSS REFERENCE TO RELATED APPLICATIONS

This is a division of application Ser. No. 09/704,972, filed Nov. 1, 2000 entitled, "Dielectric Etch Chamber With Expanded Process Window," by James Carducci, et al now abandoned.

BACKGROUND OF THE DISCLOSURE

1. Field of the Invention

The present invention relates generally to a semiconductor wafer processing apparatus. More specifically, the invention relates to a dielectric etch processing chamber having improved thermal and by-product management capabilities, improved control of gaseous species residence time, and an expanded process window including high flow rates and low operating pressures.

2. Background of the Invention

One challenge facing all forms of semiconductor processing is the industry wide progression towards decreasing feature sizes resulting in rapidly shrinking critical dimensions. Current design rules have feature sizes of less than about 0.18 microns and feature sizes below about 0.1 microns are being developed.

Another challenge facing semiconductor processing is the trend towards smaller footprint devices. One approach to achieving a smaller device footprint is to build the device structure vertically and in some devices, fabricating portions of the device in the substrate itself.

These challenges generate a need for processing applications capable of fabricating high aspect ratio structures and structures with critical dimensions approaching the sub-0.1 micron range.

In view of these challenges, minimizing particulate contamination during the myriad processing sequences used to fabricate an electronic device is critical. Chamber components are selected and processes are performed in reduced atmospheres to assist in reducing and managing particles that may be present and/or generated in the processing environment. Of particular importance is the management of films that form within the process chamber during wafer processing.

Films deposited within the processing chamber are major contributors to the total particulate concentrations found within the process chamber. Films typically form on exposed chamber and process kit components during a wide variety of semiconductor processing applications.

During dielectric etch processes, for example, some of the material removed from the layer exposed to the etchant is exhausted from the processing chamber. However, some etch reaction by-products form deposits on exposed chamber surfaces and on surfaces of the etched structure.

The deposits on chamber surfaces increase in thickness as the process cycles are repeated and additional wafers are processed. As the deposit thickness increases, so too does the internal stresses associated with the deposit. Additional stresses are created in these deposits due to differences in thermal expansion rates between the deposit and the chamber surfaces. Conventional etch chambers lack appropriate thermal management techniques to reduce thermally induced stresses between accumulated deposits and chamber components. Eventually, the stresses can cause the deposits to crack, consequently releasing particles into the chamber environment. These film particles may impinge upon the wafer surface, typically creating a defect in the circuit structure on the wafer.

Control of deposit formation on the etch structure is also a critical process consideration. In high aspect ratio dielectric etch processes, for example, the formation of a thin sidewall layer or passivation layer is desired to help maintain sidewall profile control as the depth of the etched feature increases. As feature sizes decrease, however, sidewall profile control becomes increasingly more difficult and possibly unfeasible using conventional plasma etch chambers. Decreasing critical dimensions require increasingly refined control of an expanded range of etch process chemistry parameters not provided by conventional etch chambers.

Therefore, there is a need for a dielectric etch processing apparatus with the capability of providing expanded processing capabilities with improved process parameter control that enables advanced feature dielectric etch processes.

SUMMARY OF INVENTION

The disadvantages associated with the prior art etch chambers and the challenges posed by advanced dielectric etch processes are overcome by embodiments of the present invention of a thermally controlled plasma etch chamber having an expanded process window and improved by product management capabilities. The inventive process chamber is generally a capacitively coupled plasma source chamber and, more specifically, a capacitively coupled chamber operating in an RIE mode and MERIE mode.

An embodiment of an apparatus according to the present invention comprises a capacitively coupled reactor for plasma etch processing of substrates at subatmospheric pressures having a chamber body defining a processing volume, a lid provided upon the chamber body, the lid being a first electrode, a substrate support provided in the processing volume and comprising a second electrode, a radio frequency source coupled at least to one of the first and second electrodes, a process gas inlet configured to deliver process gas into the processing volume, and an evacuation pump system having pumping capacity of at least 1600 liters/minute. The greater pumping capacity controls residency time of the process gases so as to regulate the degree of dissociation into more reactive species, such as free fluorine.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

I. Exemplary Processing System

Figure 1:
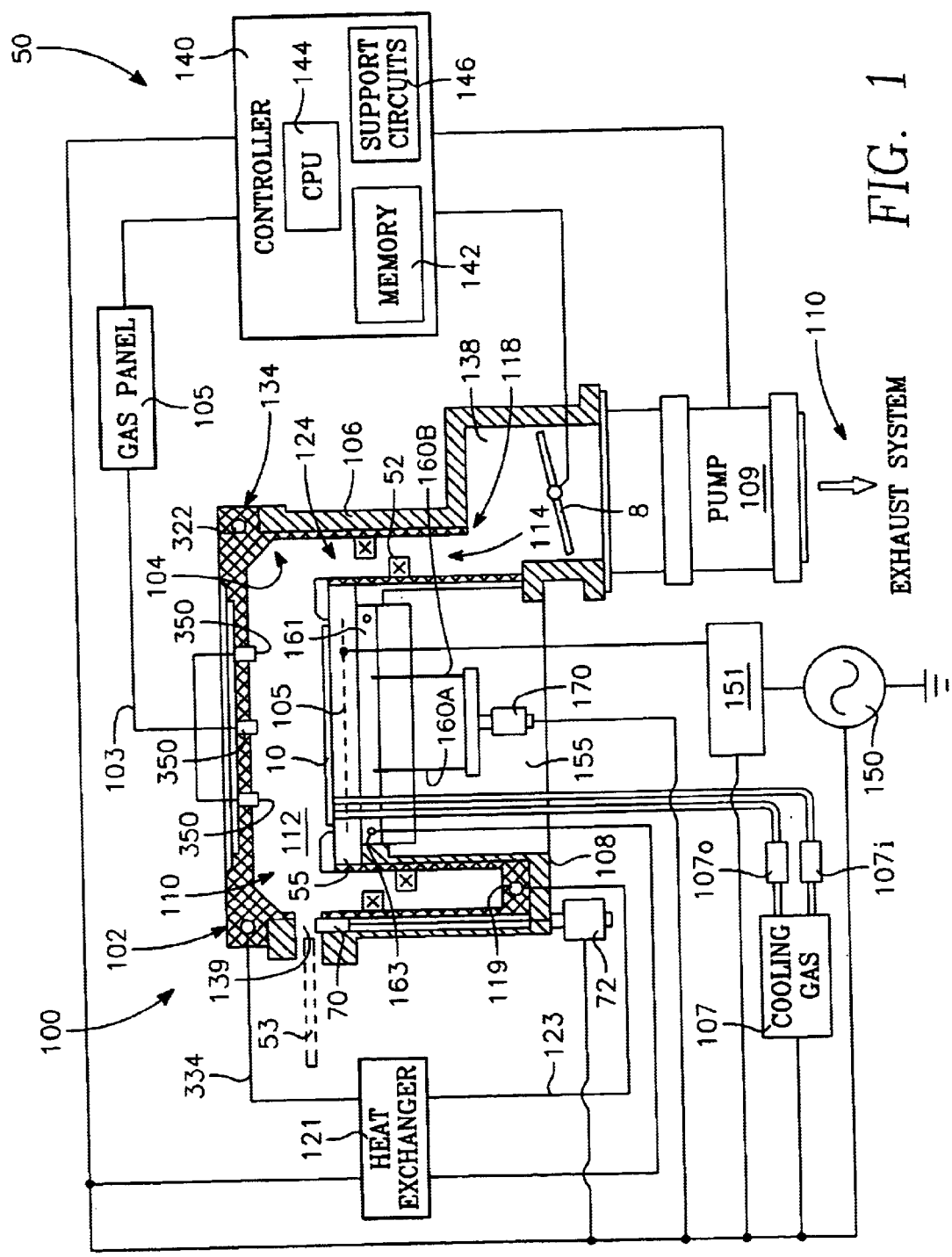
FIG. 1 is a cross-sectional schematic view of a parallel plate semiconductor wafer processing system.

FIG. 1 illustrates an embodiment of the processing apparatus improvements of the present invention in an exemplary processing chamber 100 for processing a substrate 10, such as a semiconductor wafer. The invention will be described below initially with reference to embodiments as used in the exemplary processing system 50 of FIG. 1. However, it should be understood that the description of the inventive features applies to the alternative chamber configurations such as the etch chamber configurations 2800 to 3200 described below with reference to FIGS. 28 to 32. Embodiments of the present invention are particularly advantageous in plasma etch chambers configured for oxide and dielectric etch processes.

An embodiment of the present invention is illustrated in processing system 50 of FIG. 1. Processing system 50 comprises a processing chamber 100, a gas panel 105, a computer controller 140, a heat exchanger or temperature controlled fluid source 121, an RF source 150, a pump 109, an exhaust system 110 and a cooling gas system 107.

The processing chamber 100 includes a circumferential sidewall 106, a bottom wall 108 and a lid assembly 102 that together define a chamber volume 110. A substrate support 124 is disposed on bottom wall 108 for supporting the substrate 10. Generally, the chamber volume 110 is divided into a process volume 112—the upper region of the chamber—and a pumping volume 114—the lower region of the chamber. Chamber liner 104, illustrated as a first liner 134 and a second liner 118, is disposed adjacent to walls 106,108 and lid 102. In an embodiment described in greater detail below, chamber liner 104 includes a plasma confinement means 52 for confining a plasma within process volume 112.

The processing chamber 100 is provided with a slit valve 139 or access port for transferring substrates from a common loadlock or transfer area into the processing region 112. A robot 53 (shown in phantom in FIG. 1) is used to transfer substrates in and out of processing region 112. A slit valve door (not shown) provides a vacuum seal of the slit valve opening 139. A liner door 70 could be a vertically actuated via a pneumatic motor 72 as illustrated in FIG. 1 to cover the opening in the chamber liner 104 adjacent the slit valve opening 139.

Substrate support 124 may use electrostatic force or mechanical clamping force to ensure the substrate 10 remains in place during processing. If electrostatic force is used, substrate support 124 includes electrostatic chuck 55. A lift pin assembly 155 comprises lift pins 160a,b that are elevated through holes in the electrostatic chuck 55 by a pneumatic lift mechanism 170. The robot 53 places the substrate 10 on the lift pins 160a,b, and the pneumatic lift mechanism 170 lowers the substrate 10 onto the receiving surface of electrostatic chuck 55. After the substrate 10 is placed on the electrostatic chuck 55 and prior to conducting a process, an electrode 105 embedded in the electrostatic chuck 55 is electrically biased with respect to the substrate 10 to electrostatically hold the substrate 10.

On completion of the process, the pneumatic lift mechanism 170 raises the lift pins 160a,b to raise the substrate 10 off the receiving surface of electrostatic chuck 55, allowing the substrate 10 to be removed by the robot 53. Before raising the lift pins 160a,b, the substrate 10 is electrically decoupled or de-chucked by dissipating the residual electrical charges holding the substrate 10 to the electrostatic chuck 55.

In the embodiment illustrated in FIG. 1, electrostatic chuck 55 is formed from a dielectric that envelops and electrically isolates the electrode 105 from the substrate 10. Preferably, the dielectric is a ceramic material, such as $Al_2O_3$, AlN, BN, Si, $SiO_2$, $Si_3N_4$, $TiO_2$, $ZrO_2$, codierite, mullite, or mixtures and compounds thereof. In one embodiment, the electrostatic chuck 55 is formed from a high thermal conductivity ceramic material with a resistivity selected for optimal performance in the temperature range that the substrate 10 is maintained. For example, resistivity in the range of between about $5\ e^{10}$ $\Omega$-cm to about $5\ e^{13}$ $\Omega$-cm, for example, have been used where substrate temperatures in the range of between about $-20°$ C. to about $50°$ C. are desired.

An electrode 105 disposed within substrate support 124 couples RF energy into process volume 112. RF energy from RF source 150 is coupled to electrode 105 via impedance matching circuitry 151. Electrode 105 may be formed from an electrically conducting material, such as a metal, for example, aluminum, copper, molybdenum or mixtures thereof. Generally, electrode 105 has a robust construction that allows coupling of up to about 5000 Watts of RF power from RF generator 150. The exact amount of RF power coupled through robust electrode 105 varies depending upon the particular etch process conducted within etch chamber 100.

A backing plate 161 is disposed adjacent to electrostatic chuck 55. The backing plate 161 has internal cooling channels supplied with temperature controlled fluid from heat exchanger 121 via inlet 163. The temperature controlled fluid, such as for example, an ethylene glycol and de-ionized water mixture, circulates through the conduits in the cooling plate. Preferably the electrostatic chuck 55 is attached to the backing plate 161 so as to maximize heat transfer from the electrostatic chuck 55 to the backing plate cooling channels and thence to the temperature controlled fluid.

In another aspect of the present invention, the backing plate 161 is bonded or joined to the electrostatic chuck 55 by a bond layer made from a material having high thermal conductivity. The bond layer can comprise, for example a metal, such as aluminum, copper, iron, molybdenum, titanium, tungsten or alloys thereof, such as for example, titanium diboride. The bond layer eliminates use of bolts for securing the electrostatic chuck 55 to the cooling plate 161 and consequently reduces mechanical stresses on the electrostatic chuck 55. Also, the bond layer has a homogeneous composition that provides more uniform heat transfer rates across the substrate 10, and reduces the differences in thermal impedances that occur at the interface between the cooling plate 161 and the electrostatic chuck 55.

Preferably, the bond layer is ductile and compliant to provide an interface that absorbs the thermal stresses arising from the thermal expansion mismatch between the electrostatic chuck 55 and the cooling plate 161 without damaging the electrostatic chuck 55. While a bonded joint provides uniform heat transfer rates, it is often difficult for a bonded joint to withstand the thermal stresses arising from differences in thermal expansion coefficients of dissimilar materials, such as the electrostatic chuck 55 and the cooling plate 161. An exemplary bond layer is made from a ductile and compliant material that can flex and absorb thermal stresses that arise from the difference in thermal expansion coefficients of the electrostatic chuck 55 and the cooling plate 161. One suitable bonding material consists of a high bond strength, pressure sensitive acrylic adhesive, loaded with titanium diboride and applied to an expanded aluminum carrier. The combination of filler, expanded metal and embossed surface enhances the conformability and thermal performance of the bond.

The temperature of the substrate 10 is controlled by stabilizing the temperature of the electrostatic chuck 55 and providing a cooling gas, such as helium, from cooling gas source 107 to channels formed by the back of the substrate 10 and grooves formed on the receiving surface of electrostatic chuck 55. The cooling gas facilitates heat transfer between the substrate 10 and the electrostatic chuck 55. The space between the backside of the wafer 10 and the receiving surface of the electrostatic chuck 55 is preferably divided into two zones—an inner zone and an outer zone. Separate flow controllers $107_0$ and $107_1$ are used to provide independent cooling gas flow control to the outer and inner zones, respectively. Typically, the desired amount of cooling gas is measured in pressure, generally, in Torr.

Separate zone controllers $107_1$ and $107_0$ allow the zones to be maintained at the same pressure or at different pressures. Adjusting the pressure in the inner and outer zones leads to a corresponding adjustment in the temperature at the center and edge of the substrate 10. Thus, by adjusting the pressure of the inner and outer zones the temperature profile across the substrate 10 is controlled. The temperature across the substrate 10 may be adjusted to compensate for the specific temperature requirements of a particular etch process. For example, the temperature across the substrate may be uniform from center to edge, have a higher edge temperature than center temperature or have a higher center temperature than edge temperature.

During plasma processes, the substrate 10 is heated by plasma in the chamber and the dual zone cooling gas control is used to adjust the substrate temperature. Typically, substrate 10 is maintained in a temperature range of between about −20 to about 150 degrees Celsius with a preferred operating range of about 15 to about 20 degrees Celsius. The inner and outer cooling gas zones can also be operated to induce a thermal gradient across substrate 10. For example, the inner zone and the outer zone cooling gas pressures can be adjusted so that the temperature in the center of the substrate 10 is greater than or less than the temperature at the edge of the substrate 10. In addition, the inner and outer cooling gas zones may be adjusted so that the temperature difference across the center to edge of the substrate 10 is about 5 C. or where the temperature between the center and edge remains nearly constant.

The components of substrate support 124 including cooling plate 161, an electrostatic chuck 55, dual zone backside cooling gas and robust electrode 105 cooperatively operate to remove heat generated during plasma processing operations conducted in chamber 100. The thermal management and temperature control features enable processing operations that employ higher RF powers and higher magnetic fields (for chambers using magnetically enhanced processing) for longer process times because the temperature of substrate 10 can be efficiently controlled even during processes combining both RF power levels above 2500W and magnetic fields greater than 100 G. The temperature control and thermal management capabilities of etch chamber 100 are furthered by the direct temperature control feature of liners 118 and 134 described below in section II entitled "Temperature Controlled Chamber Liner."

Gas panel 105 includes process gas supplies and flow control valves which under the control of computer controller 140 provide process gases to process chamber 100. Process gases from gas panel 105 are provided via piping 103 through lid assembly 102 to a plurality of gas inlets or nozzles 350. A plurality of nozzles 350 are distributed across the lid assembly 102 for providing process gases into processing volume 112 as described in greater detail below in section III entitled "Thermally differentiated Gas Supply System".

In operation, a semiconductor substrate 10 is placed on the substrate support 124 and gaseous components are supplied from the gas panel 105 to the process chamber 100 through nozzles 350 to form a desired gas composition in the processing volume 112. The gas composition is ignited into a plasma in the process chamber 100 by applying RF power from the RF generator 150 to impedance matching circuitry 151 to the electrode 105. The plasma formed from the gas composition is in contact with the temperature controlled surfaces of the lid assembly 102 and the liner 104.

The pressure within the process chamber 100 is controlled using a throttle valve 8 situated between the chamber volume 110 and a vacuum pump 109. In a preferred embodiment, the pump 109 provides a pumping capacity of greater than about 1000 liters per second, preferably between about 1,400 to 2,000 liters per second, and more preferably about 1,600 liter per second. Pump 109 may be a single high capacity vacuum pump or a combination of a vacuum pump and a turbo pump. Under the control of controller 140, the pump 109 and the throttle valve 8 cooperatively operate to provide an advantageously expanded pressure and gas flow rate plasma etch processing regime. In a preferred embodiment, the plasma etch chamber is a thermally controlled etch chamber capable of performing both magnetically enhanced reactive ion etching (MERIE) and reactive ion etching (RIE) etch processes in a low pressure—high total gas flow regime, such as for example, a total gas flow of more than about 350 sccm and a chamber pressure of less than about 80 mT. Preferably, an embodiment of a process chamber according to the present invention enables chamber pressures below about 50 mT with total flow rates of about 1000 sccm.

Plasma etch chambers having embodiments of the present invention are capable of low pressure—low flow dielectric etch processes such as for example, spacer etching and mask open etching generally conducted at pressures of between about 10 mT to about 80 mT with total gas flow rates of from about 40 sccm to about 150 sccm. Plasma etch chambers having embodiments of the present invention are also capable of high-pressure high flow rate dielectric etch processes such as, for example, $C_4F_8$ and $C_2F_6$ based etch processes conducted at pressures of between about 150 mT to about 300 mT and total gas flow rates of between about 350 sccm to about 700 sccm. Plasma etch chambers having embodiments of the present invention are also capable of high total gas flow—low chamber pressure etch processes such as, for example, $C_4F_6$ and $CH_2F_3$ based etching of self aligned and high aspect ratio contacts at pressures of from between about 10 mT to about 120 mT and total gas flow rates of between about 600 sccm to about 900 sccm.

Additionally, plasma etch chambers having embodiments of the present invention enable etch processes in a variety of processing regimes, such as for example, an etch process regime with a total gas flow ranging from about 120 sccm to about 400 sccm at a chamber pressure ranging from about 70 mT to about 120 mT; an etch processing regime with a total gas flow ranging from about 100 sccm to about 450 sccm at chamber pressures ranging from about 20 mT to about 70 mT; and an etch processing regime having total gas flows ranging from about 300 sccm to about 800 sccm at chamber pressures ranging from about 20 mT to about 70 mT. Section VII below entitled "Chamber Process Window And Representative Critical Dielectric Etch Processes" provides additional details of the improved oxide and dielectric etch process window enabled by plasma etch chambers having embodiments of the present invention.

A controller 140 comprising a central processing unit (CPU) 144, a memory 142, and support circuits 146 for the CPU 144 is coupled to the various components of the process chamber 100 to facilitate control of the chamber. To facilitate control of the chamber as described above, the CPU 144 may be one of any form of general purpose computer processors that can be used in an industrial setting for controlling the various chamber components and even other processors in a processing system where computer controlled chamber components are utilized. The memory 142 is coupled to the CPU 144. The memory 142, or computer readable medium, may be one or more of readily available memory such as random access memory (RAM), read only memory (ROM), floppy disk drive, hard disk, or any other form of digital storage, local or remote. The support circuits 146 are coupled to the CPU 144 for supporting the processor in a conventional manner. Support circuits 146 include cache, power supplies, clock circuits, input/output circuitry and subsystems, and the like. A process, such as the etch process, is generally stored in the memory 142, typically as a software routine. The software routine may also be stored and/or executed by a second CPU (not shown) that is remotely located from the hardware being controlled by the CPU 144.

The software routine executes a process, such as an etch process, to operate the chamber 100 to perform the steps of the process. When executed by the CPU 144, the software routine transforms the general purpose computer into a specific process computer (controller) 140 that controls the chamber operation to perform the steps of the process. Although embodiments of the present invention are discussed as being implemented as a software routine, some or all of the method steps that are discussed herein may be performed in hardware as well as by the software controller. As such, the invention may be implemented in software and executed by a computer system, in hardware as an application-specific integrated circuit or other type of hardware implementation, or in a combination of software and hardware.

II. Temperature Controlled Chamber Liner

Temperature controlled chamber components, such as a chamber liner 104 and lid assembly 102, for use in an etch processing system such as processing system 50 may be better appreciated by reference to FIGS. 2–6. Embodiments of the present invention also provide methods for controlling the temperature of chamber components, to substantially improve adhesion of deposits formed on these chamber components.

Figure 2:
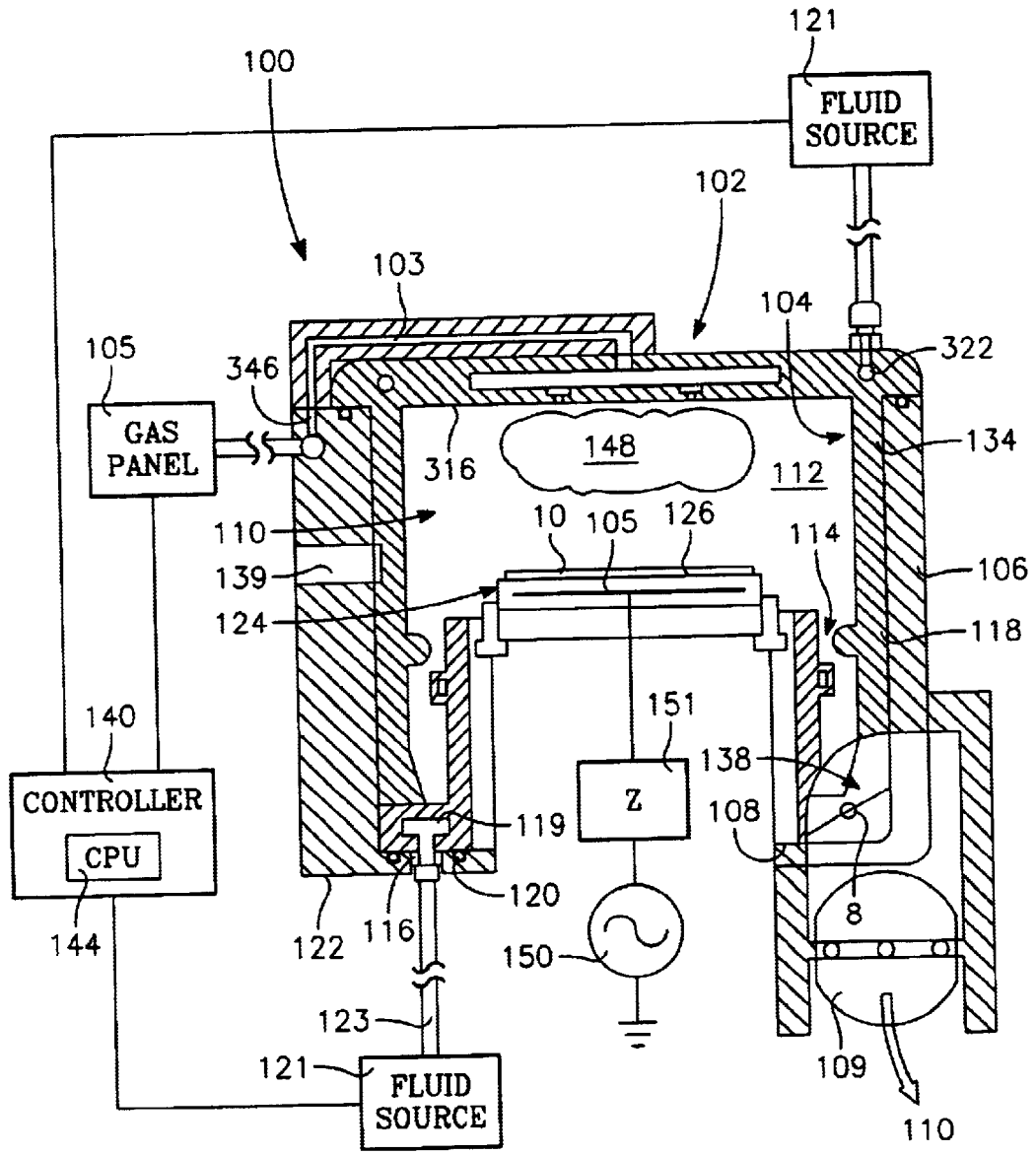
FIG. 2 is a cross-sectional schematic view of a semiconductor wafer processing system illustrating an embodiment of an upper and a lower liner according to the present invention.

FIG. 2 is a cross sectional view of one embodiment of an etch chamber 100 of the present invention having a chamber liner 104. The etch chamber 100 is configured as a parallel plate etch reactor. Generally, the chamber liner 104 comprises a first (first) liner 134, a second (second) liner 118, or both a first liner 134 and a second liner 118. Disposed within each chamber liner 104 is at least one passage formed at least partially therein having an inlet and outlet adapted to flow a fluid through the passage from a temperature controlled, fluid supply system, such as heat exchanger 121. To facilitate description of the liner of the present invention, an embodiment of the liner of the present invention will be described as having a first 134 and a second 118 liner. One of ordinary skill will appreciate that a single piece, removable liner may be fabricated and used in lieu of upper 134 and lower 118 liners. It is also to be appreciated that different sized upper 134 and lower 118 liners may be utilized and that the embodiments illustrated herein are used merely as an aid in describing the present invention. The upper liner 134 and lower liner 118 will now be discussed in turn.

The chamber 100 generally includes an annular sidewall 106, a bottom wall 108, and a lid assembly 102 that define a chamber volume 110. Generally, the chamber volume 110 is bifurcated into a process volume 112 (the upper region of the chamber) and a pumping volume 114 (the lower region of the chamber).

The bottom wall 108 has a pumping port 138 through which excess process gases and volatile compounds produced during processing are exhausted from the chamber 100 to exhaust system 110 by a vacuum pump 109. The bottom wall 108 additionally has two apertures 116 (only one of which is shown in FIG. 2) that provide access to the second liner 118 from the exterior of the chamber 100.

Figure 3A:
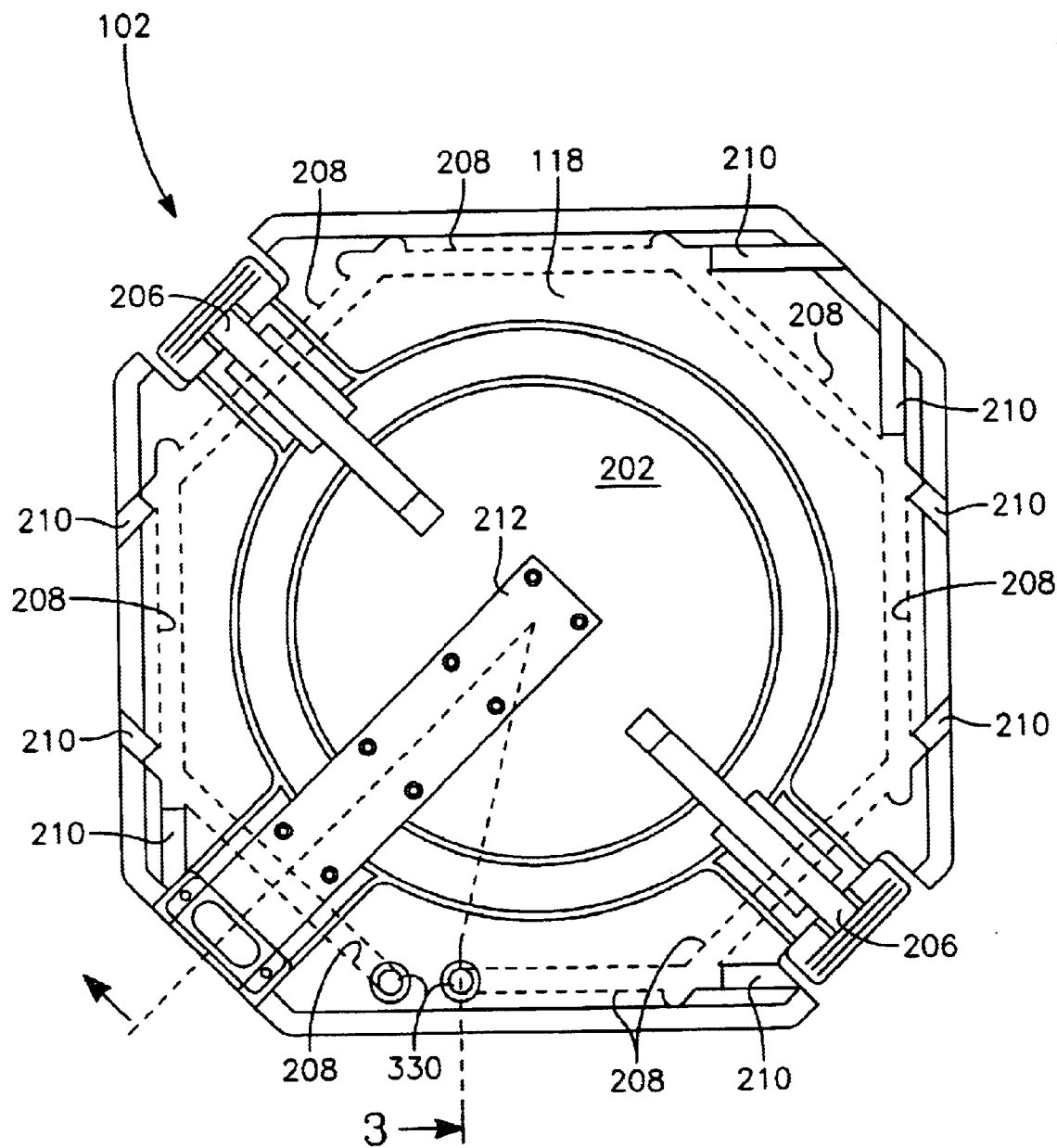
FIG. 3A is a plan view of a lid assembly having the first liner of FIG. 2.
Figure 3B:
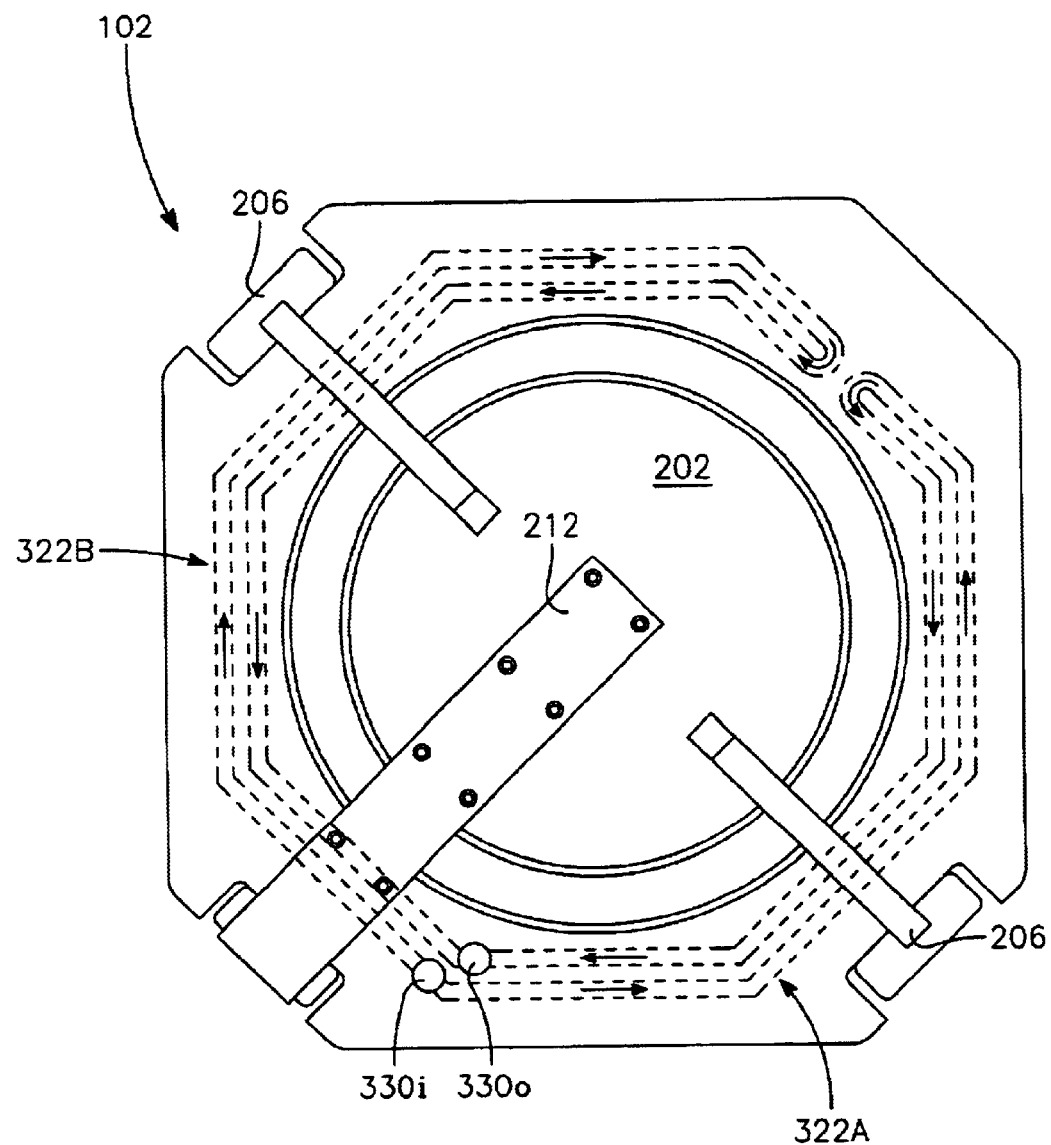
FIG. 3B is a plan view of another lid assembly.
Figure 4:
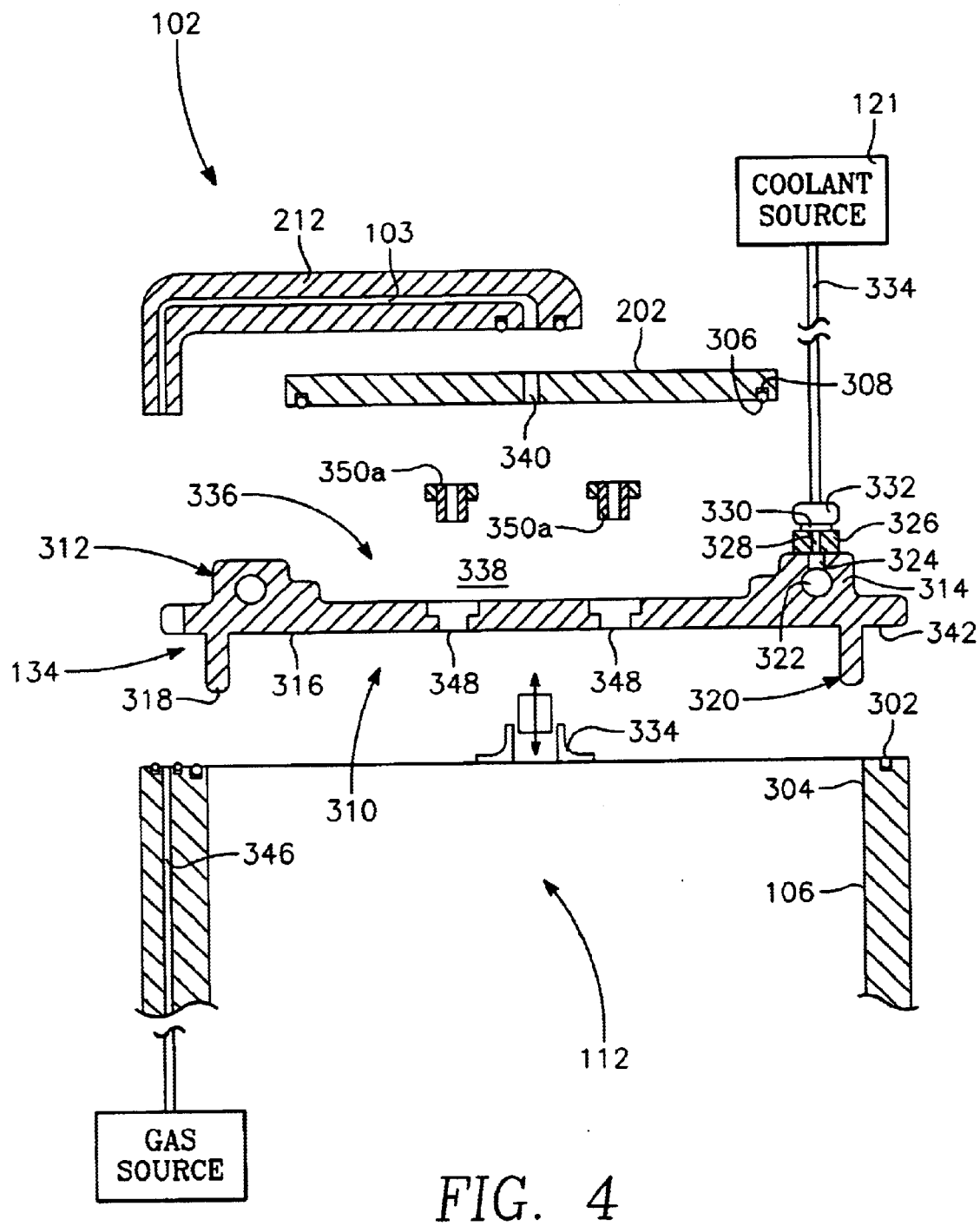
FIG. 4 is a partially exploded elevation of the lid assembly of either FIG. 3A or 3B.

Embodiments of the lid assembly 102 are detailed in the plan views of FIGS. 3A, 3B and cross-sectional view of FIG. 4. In one embodiment illustrated in FIG. 4, the lid assembly 102 comprises the first liner 134 and a lid 202. The first liner 134 has an outwardly extending flange 342 that rests upon the top of the sidewall 106. The various components of lid assembly 102 are appropriately configured to provide a gas tight seal where needed to ensure the vacuum integrity of the processing volume 112. For example, lid assembly 102 may be generally biased downwardly when the lid 202 is clamped in place, the lid assembly 102 exerts a downward force upon the second liner 118 when installed in the processing chamber 100.

Continuing with FIG. 4, the first liner 134 is fabricated from a thermally conductive material, such as for example, anodized aluminum, stainless steel, ceramic or other compatible material. The first liner 134 can be easily removed for cleaning and provides a removable surface on which deposition can occur during processing. The first liner 134 comprises a center section 310 having a dish-shaped top surface 312, and a bottom surface 316. The dish-shaped top surface 312 has a perimeter 314 that is connected to the outwardly extending flange 342. Extending from the bottom surface 316 is a cylindrical liner wall 318. The bottom surface 316 and liner wall 318 have interior surfaces 320 that are exposed to the process volume 112. As described in greater detail below in section IV, the interior surfaces 320 of upper liner 134, or optionally, any liner exposed to process volume 112 may be textured to improve adhesion of deposited films by reducing surface tension in the film.

A fluid passage 322 is disposed within center section 310. The fluid passage 322 may be formed by a number of conventional means such as, for example, forming the fluid passage 322 during casting. Turning briefly to FIG. 3A, another method for forming fluid passage 322 is by drilling a number of intersecting blind holes 208 wherein each hole 208 is sealed by a plug 210, thus forming the fluid passage 322.

Returning to FIG. 4, two bosses 326 (only one of which is shown in FIG. 4) protrude from the surface 312 of the center section 310. Each boss 326 has a center hole 328 that is fluidly coupled to the fluid passage 322 via the respective bore 324.

The fluid passage 322 receives fluid from the heat exchanger or coolant source 121. Like all surfaces exposed to the plasma, first liner 134 is heated by plasma processes conducted in the plasma etch chamber. The fluid regulates the temperature of the first liner 134 by drawing heat conducted through the first liner 134 into the fluid. As the fluid is circulated through the first liner 134 from the fluid source 121, the amount of heat removed form the first liner 134 is controlled, thus permitting the first liner 134 to be maintained at a predetermined temperature.

The fluid, which may be liquid and/or gaseous fluids, is flowed through the fluid passage 322 to provide temperature control to the first liner 134. The fluid is preferably a liquid such as de-ionized water and/or ethylene glycol. Other fluids, such as liquid or gaseous nitrogen or freon, can also be used. Alternatively, the first liner 134 could be uniformly heated using heated fluids.

One skilled in the art will be able to devise alternate configurations for the fluid passage utilizing the teachings disclosed herein. For example, as depicted in FIG. 3B, a lid assembly.202 may comprise a first fluid passage 322A and a second fluid passage 322B. The first and second fluid passages 322 A and B may share a common inlet 330i and a common outlet 330o as illustrated in FIG. 3B. Optionally, additional inlets and outlets may be utilized. The first and second fluid passages 322 A and 322 B double back in a "two tube pass" configuration. Additional tube passes may alternatively be incorporated.

Returning to FIGS. 3A and 4, quick-connect fluid couplings are utilized to fluidly connect a fluid supply 121 and the first liner 134 to facilitate the rapid removal and replacement of the first liner 134 from the chamber 100. Typically, a quick-connect 330 having a male pipe thread-form is threaded into a female thread-form in the center hole 328 of the boss 326. The mating coupling 332 is affixed to the terminal end of a fluid supply line 334. The fluid supply line 334 couples the passage 322 to the fluid supply 121. One advantage of this configuration is that during the change out of the first liner 134, the fluid supply line 334 can be disconnected without the aid of tools. However, other means of coupling the first liner 134 to the fluid supply line 334 (for example, pipe threads, barbed nipples, collet connectors and the like) may also be used. Quick-connects are commercially available and are generally selected based on port size (thread-form and flow capacity) and the brand used in a particular wafer processing facility or fab (for maintenance inventory purposes).

Returning to FIG. 4, the liner wall 318 is sized to slip inside the sidewall 106 with minimal clearance. The liner wall 318 may vary in height, and may, when used without a second liner, extend to the chamber bottom 108. Generally, if both the first liner 134 and second liner 118 are utilized (as shown in FIG. 2), the liners are proportioned to fit inside the chamber 100 to provide the compressive force necessary to seal the second liner 118 to the chamber bottom 108 when the lid assembly 102 is clamped in place.

The liner wall 318 may additionally contain a number of other ports for various purposes. An example of such other ports is a substrate access port to align with the slit opening of the chamber 100.

Returning to FIG. 2, the second liner 118 will now be described. The second liner 118 is disposed in the chamber 100 to surround the substrate support 124 and form a deposition area that can be easily removed and cleaned.

The second liner 118 has a fluid passage 119 in which fluid is provided from the fluid source 121 by a conduit 123. As with the operation of the first liner 134, the fluid regulates the temperature of the second liner 118 by drawing heat conducted through the second liner 118 into the fluid. As the fluid is circulated through the second liner 118 from the fluid source 121, the amount of heat removed form the second liner 118 is controlled, thus permitting the second liner 118 to be maintained at a predetermined temperature.

Figure 5:
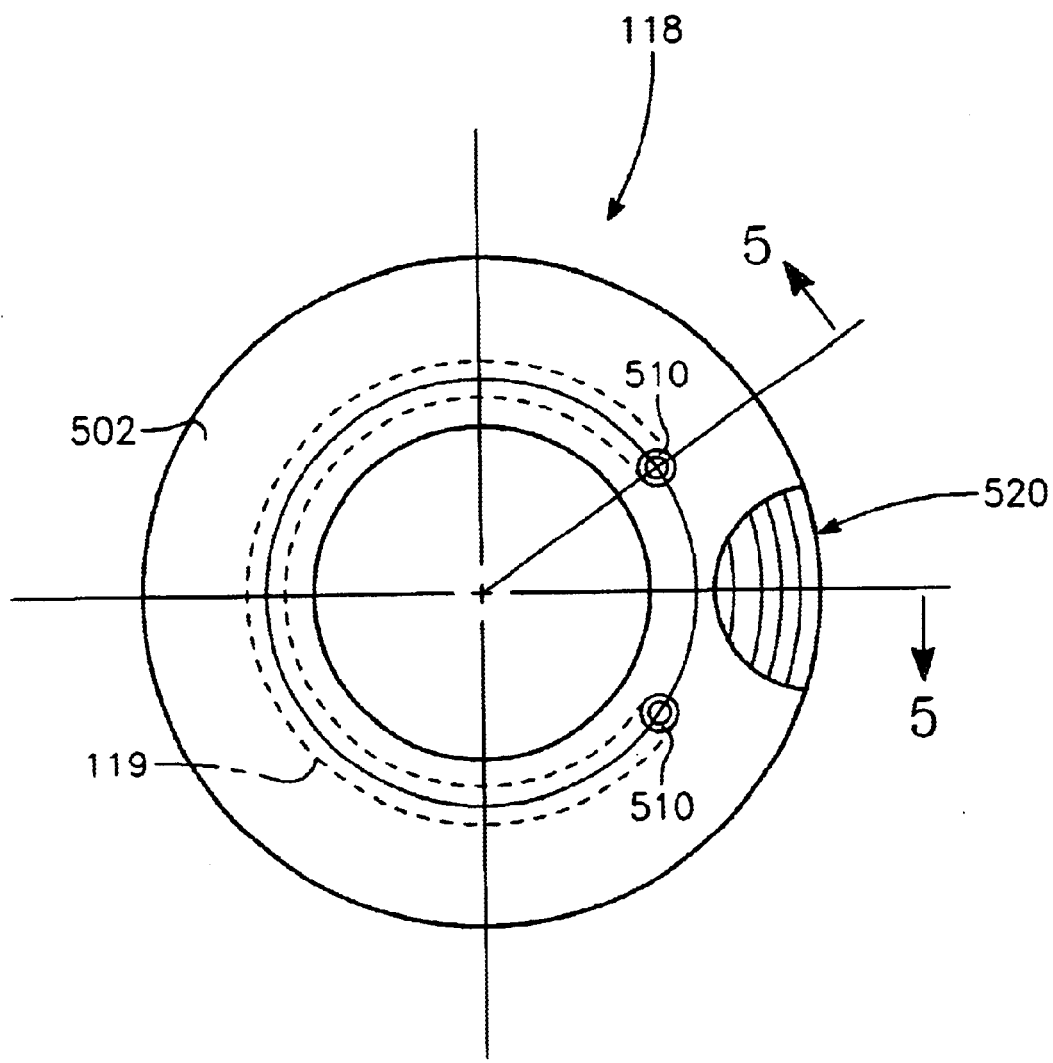
FIG. 5 is plan view of the second liner of FIG. 2.
Figure 6:
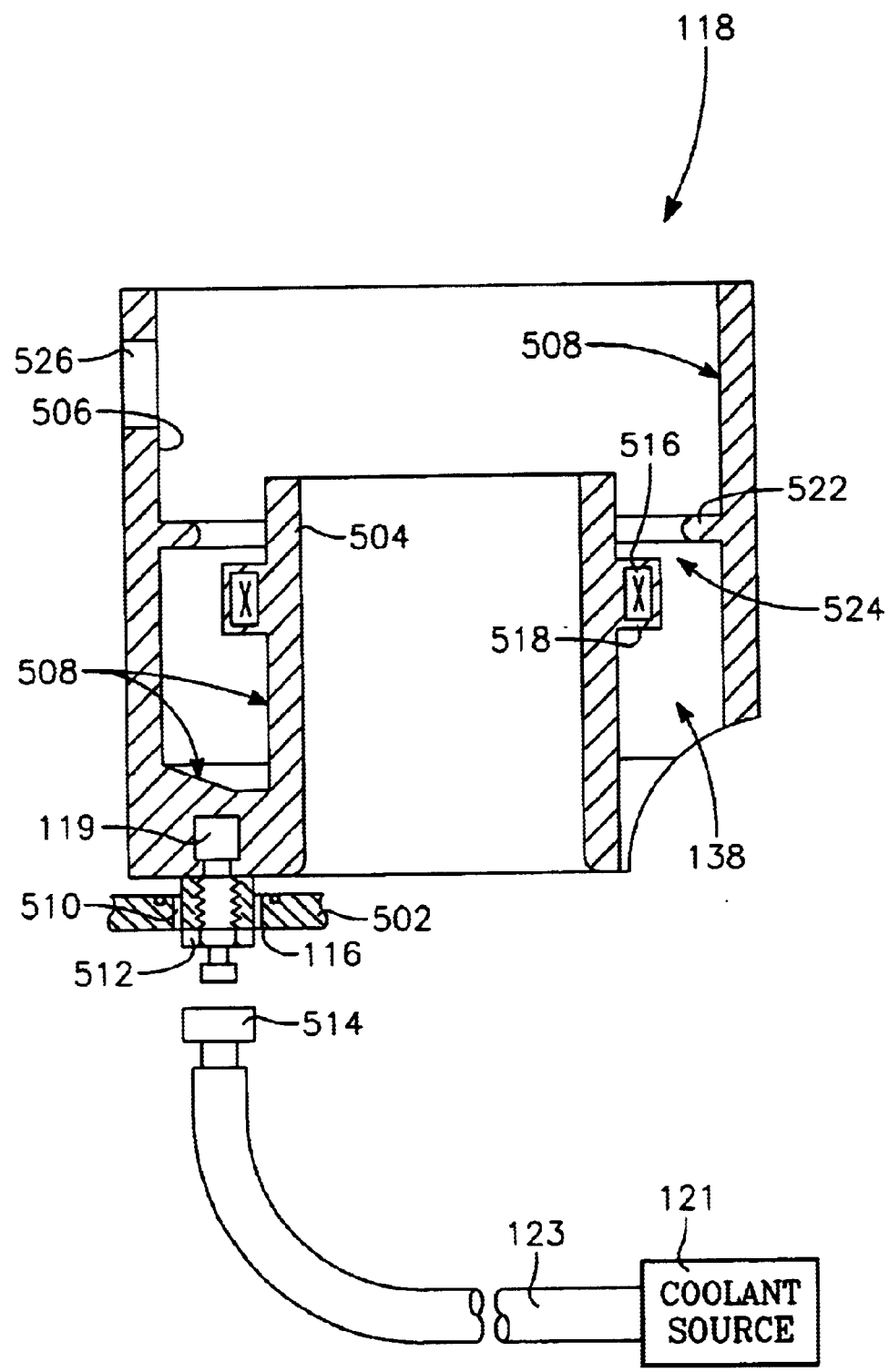
FIG. 6 is a cross-sectional view of the second liner of FIG. 5 taken along section line 5—5.

FIGS. 5 and 6 depict the second liner 118 in greater detail. The second liner 118 is fabricated from a thermally conductive material, for example anodized aluminum, stainless steel, or other compatible material. The second liner 118 comprises a base section 502 connecting an inner wall 504 and an outer wall 506. The interior surfaces 508 of the base section 502, inner wall 504 and outer wall 506 are exposed to the pumping volume 114. As described in greater detail below in section IV entitled "Chamber Surface Alterations to Improve Adhesion," and with regard to the alternative embodiments illustrated in FIG. 8 and FIGS. 13–20, the interior surfaces 508 may be textured to increase improve adhesion of deposited films by reducing surface tension in the film.

The base section 502 contains a fluid passage 119. The fluid passage 119 may be formed by conventional means such as those described above with regard to the first liner 134. In one embodiment, the fluid passage 119 is substantially circular, beginning and ending adjacent to an exhaust port 520 that is disposed through the second liner 118.

Each end of the fluid passage 119 terminates in a boss 510 that protrudes from an exterior surface of the base 502. The boss 510 interfaces with the bottom wall 108 and ensures the proper orientation of the second liner 118 in the chamber 100 (i.e., all ports align). To facilitate the rapid change out of the second liner 118, quick-connect fluid couplings are utilized between the second liner 118 and a conduit 123 that fluidly couples the passage 119 to the fluid source 121.

The inner wall 504 is generally cylindrical and is sized to slip over the substrate support 124 with minimal clearance. The inner wall 504 optionally comprises a plasma containment means 516. Plasma confinement means 516 may be, for example, a containment magnet 516 disposed within a protrusion 518 formed within inner wall 504 and facing the outer wall 506. The protrusion 518 is positioned away from the base on the inner wall 504 so that the plasma containment magnet 516 resides below the substrate support 124 when the second liner 118 is installed. The plasma containment magnet 516 may be a samarium magnet 516. Alternative embodiments of the plamsa confinement feature of the present invention are described in greater detail below in a section entitled Plasma Confinement. (FIGS. 21 to 27.)

The outer wall 506 is generally cylindrical and is sized to define a minimal gap with the chamber walls 106. The outer wall 506 may vary in height, particularly if a first liner 134 is also utilized as described above. The outer wall 506 additionally contains the exhaust port 520 that aligns with the pumping port 138. The exhaust port 520 may partially encompass a portion of the base wall 108. The exhaust port 520 provides fluid access of gases in the pumping volume 114 to the throttle valve 8 and vacuum pump 109.

Figure 28:
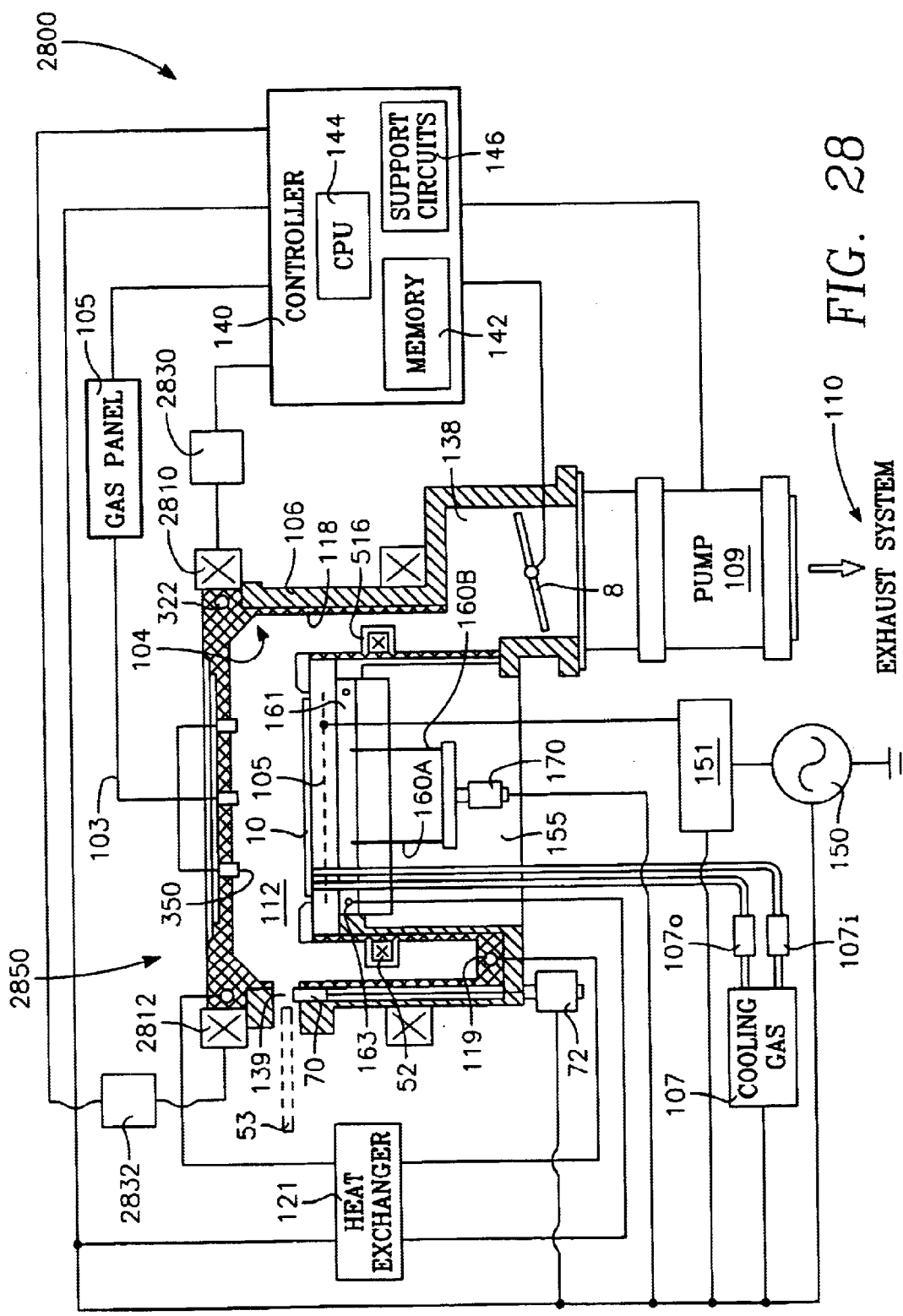
FIG. 28 is a cross-section partial schematic view of an alternative embodiment of the present invention in a capacitively coupled, magnetically enhanced reactive ion etch (MERIE) processing system.

The outer wall 506 may optionally include a throttling ridge 522 extending into the pumping volume 114. The throttling ridge 522 is positioned proximate the protrusion 518 on the inner wall 504 to create an annular flow orifice 524 for controlling the flow of gases moving from the process volume 112 to the pumping volume 114. The outer wall 506 may additionally contain a number of other ports for various purposes. An example of such other ports is a substrate access port 526 that aligns with a slit opening 139 in the sidewall 106 to allow transfer of substrate 10 in and out of the chamber 100. Turning briefly to FIG. 28 which illustrates another embodiment of liner 118, outer wall 506 does not include a throttling ridge 522 and only protrusion 518 extends into pumping volume 114.

The operation of a temperature controlled liner according to the present invention can be illustrated while viewing FIG. 2. In operation, the temperature of the first liner 134 and second liner 118 are controlled by flowing fluid through the passages 119 and 322 within the respective liners 118 and 134, from the fluid source 121. The fluid regulates the temperature of the liners 118 and 134 by transferring heat between the liners 118 and 134 and the fluid. The fluid from the fluid source 121 is controlled in both temperature and rate of flow, thus controlling the amount of heat removed from the liners 118 and 134, and permitting the liners 118 and 134 to be maintained at a predetermined temperature. In an exemplary embodiment, a user provides a set point for liner wall temperature, for example, into controller 140 and controller 140 regulates the amount and temperature of fluid output by heat exchanger 121 to maintain the user input setpoint.

Because the temperature of the liners 118 and 134 is controlled predominantly by the fluid in the passages 119 and 322 and less reliant upon conduction with the chamber walls 106, the liners 118 and 134 are able to maintain a substantially uniform, controllable temperature during a variety of plasma etch process conditions, such as for example, increased RF powers and higher magnetic fields. Thus, by controlling the temperature of the chamber liner 104, the amount of material deposited upon the chamber liner 104 can be better controlled and the stresses within the deposited material can be minimized thereby improving adhesion of the deposited material. Because the temperature controlled liners enables improved adhesion of generated by-products, a wider variety of process gas compositions including deposit forming chemistries such as those encountered in oxide an dielectric etch process may be used with greater confidence. Process engineers have greater latitude in devising etch gas compositions because the byproducts formed by these gas compositions pose less of a contamination threat because of the improved adhesion capability of the liners of the present invention. In this way, the process window of etch chambers having embodiments of the present invention are expanded to include a wider variety of useable etch gas compositions.

III. Thermally Differentiated Gas Supply System

Returning to FIG. 4, an embodiment of the gas distribution system of the present invention will now be described. The top surface 312 of the first liner 134 comprises a center depression 336. The center depression 336 is covered by the lid 202, defining a plenum 338 at least partially between the lid 202 and the center depression 336. The lid 202 additionally has a central hole 340 that allows fluid flow from a passage 344 in a gas feedthrough 212 fastened to the lid 202. The gas feedthrough 212 is sealed to the lid 202 to prevent gas leakage. The gas feedthrough 212 is generally coupled to fluid passages within the sidewall 106 as to allow temperature conditioning of gases being delivered to the plenum 338 from the gas source (not shown). Alternatively, the gas feedthrough 212 may be directly coupled to the gas source.

In one embodiment, the plurality of apertures 348 is disposed at least partially in the center depression 336. The apertures 348 are generally positioned in a polar array about the center of the first liner 134, although other positional locations may be utilized. Each aperture 348 is fitted with a nozzle 350a. The nozzles 350a facilitate distribution of process and other gases from within the plenum 338 to the process volume 112 of the chamber 100. The nozzle 350a is generally fabricated from a non-conductive material, such as quartz, silicon carbide, silicon, aluminum nitride, aluminum oxide, Y2O3, Boron Carbide, or other materials such as sapphire.

Figure 7A:
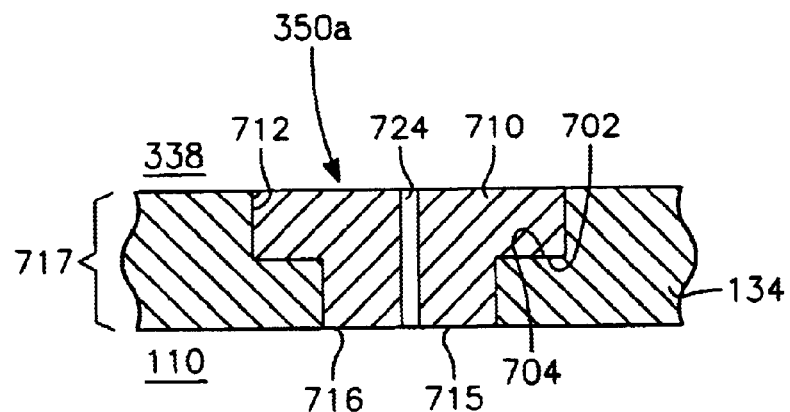
FIGS. 7a–7f are various embodiments of a gas inlet.

FIGS. 7a–7f depict various alternative embodiments of the nozzle 350a that advantageously minimize recirculative gas flows within the chamber. While reference numbers 350 and 350a are used, it is to be appreciated that alternative nozzles 350b to 350f may be used. Turning now to FIG. 7A. In one embodiment of the nozzle illustrated in FIG. 7A, the nozzle 350a includes a mounting portion 717 and a gas delivery portion 715 that is in communication with the chamber volume 110. The mounting portion 717 has a flange 710 extending from the perimeter of the nozzle 350a typically towards the side of the nozzle 350a exposed to the plenum 338. The nozzle 350a additionally comprises a central passage 724 that fluidly couples the plenum 338 to the chamber volume 110. The central passage 724 generally is positioned co-axially to the centerline of the nozzle 350a. Optionally, additional passages may be utilized to fluidly couple the plenum 338 and the chamber volume 110. Additionally, the gas delivery portion of a nozzle may be flush with the first liner 134 as illustrated, for example, in nozzle 350a of FIG. 7A and nozzle 350b of FIG. 7B. Alternatively, the gas delivery portion of a nozzle may extend beyond the first liner 134 as illustrated, for example, in nozzle 350c of FIG. 7C, in nozzle 350d of FIG. 7D, in nozzle 350e of FIG. 7E, and in nozzle 350f of FIG. 7F.

Returning to FIG. 7A, the flange 710 mates with a recess 712 disposed in the first liner 134. Generally, a contact surface 702 of the flange 710 and a mating surface 704 of the recess 712 have a surface finish having a flatness of about 1 mil or less which provides minimal gas leakage between the contact surface 702 and the mating surface 704. A exposed surface 716 of the gas delivery portion 715 may have a smooth or textured surface.

Figure 7B:
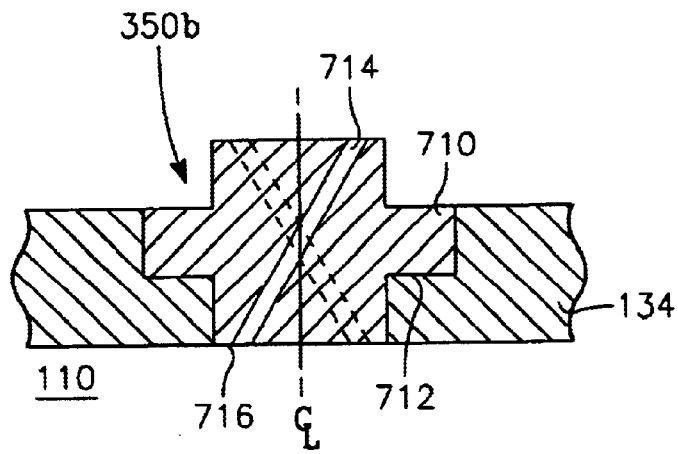

FIG. 7B illustrates another embodiment of a nozzle, a nozzle 350b, that is substantially similar to nozzle 350a with the exception that central passage 724 is optional. The nozzle 350b has a one or more passages 714 that provide fluid communication of the plenum 338 with the chamber volume 110. Generally, the passages 714 are at an angle to the centerline of the nozzle 350b. Optionally, the mounting portion 717 may extend into the plenum 338.

Figure 7C:
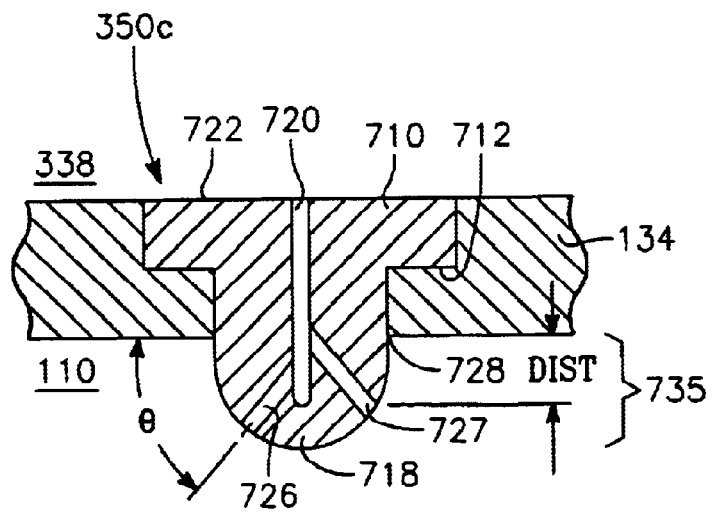

FIG. 7C illustrates another embodiment of a nozzle, a nozzle 350c, that comprises the mounting portion 717 and the gas delivery portion 735. The gas delivery portion has an end 728 proximate the mounting portion 717 and an opposing, distal end 718 that protrudes into the chamber volume 110. The proximate end 728 is generally coplanar or tangent to a surface of the first liner 134 exposed to the chamber volume 110. The gas delivery portion 735 may have a smooth or textured surface finish. A central passage 720 extend at least partially through the nozzle 350c from a side 722 of the mounting portion 717 exposed to the plenum 338. One or more secondary passages 726 fluidly couple the central feed 720 and the chamber volume 110.

Generally, an outlet 727 of each of the secondary passages 726 on the exterior of the gas delivery portion 735 are positioned at least a distance "DIST" from the end 728 of the gas delivery portion 735. Additionally, the secondary passages 726 are orientated at an angle $\theta$ relative to the proximate end 728. In one embodiment, DIST is greater than about 0.25 inches and $\theta$ ranges between about 15 and about 35 degrees.

Figure 7D:
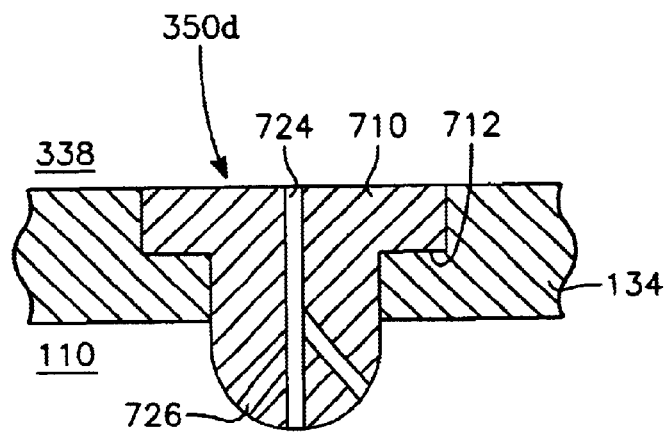

FIG. 7D illustrates another embodiment of the nozzle, nozzle 350d, that is similar to the nozzle 350c. The nozzle 350d, however, additionally comprises a central passage 724 that extends along the centerline of the nozzle 350c, communicating the plenum 338 directly with the chamber volume 110.

Figure 7E:
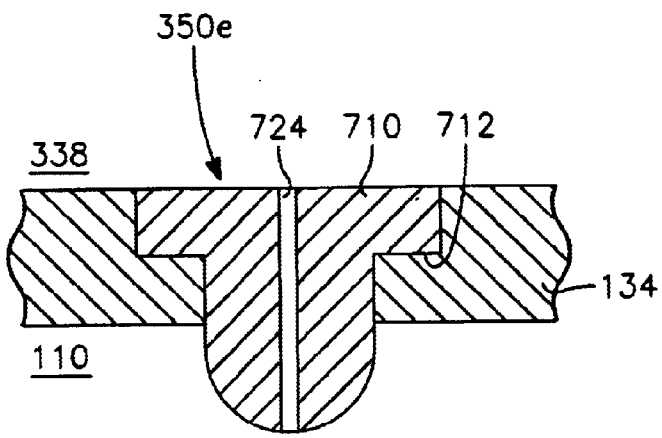

FIG. 7E illustrates another embodiment of a nozzle, a nozzle 350e, that is similar to the nozzle 350d. The nozzle 350e, however, only provides the central passage 724 between the plenum 338 and the chamber volume 110.

Figure 7F:
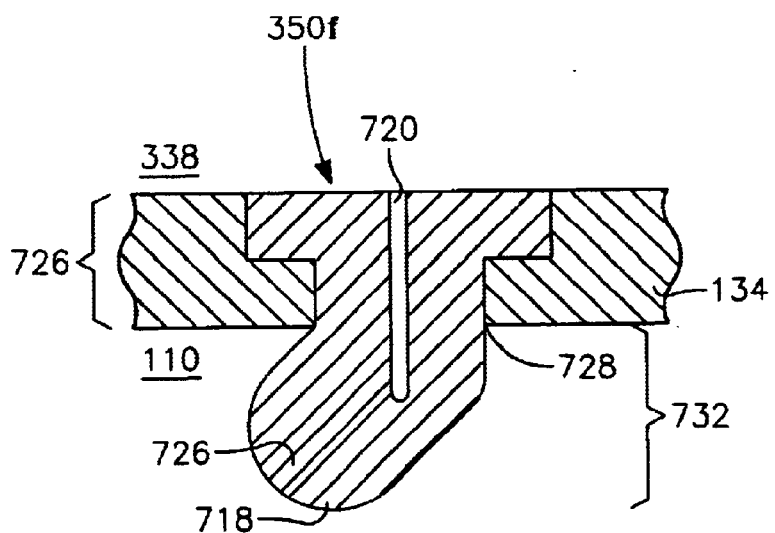

FIG. 7F illustrates another embodiment of the nozzle, a nozzle 350f, that is similar to the nozzle 350c. The nozzle 350f, however, has a mounting portion 717 and a gas delivery portion 732 that is at an oblique orientation to the mounting portion 717. The nozzles 350a–350f have been found to run cleaner (i.e., with reduced processing byproduct buildup) than conventional nozzles due to the proximity to the plasma thereby making the nozzles hotter and discouraging deposition of reaction by-products. Because the gas delivery configuration of the nozzles minimizes flow recirculation within the chamber, the amount of reaction by-products drawn towards the upper regions (i.e., the lid area) of the chamber are reduced.

Common to the nozzles described above is that they have low thermal mass and are not provided with cooling mechanism. Consequently, they heat up during processing to a temperature above that of the cooled lid and liners, so as to thermally differentiate the nozzles from the lid and liners. This helps to dramatically reduce polymer deposition on the nozzles. Optionally, in order to ensure that any polymer that does get deposited on the nozzles, they are provided with surface roughness by bid blasting or by a chemical process.

Additional alternative embodiments of the gas distribution system are illustrated in FIGS. 8–13. In FIGS. 8–13, in lieu of nozzles 350, mini-gas distribution plates 220 having plural gas injection holes 225 are provided in center section 310 of liner 134 to fluidly couple plenum 338 and the chamber volume 110. Like nozzles 350, the area of each of the mini-gas distribution plates 220 facing the plasma is limited so that: (1) the area is contained within a region in which the turbulence from the injected gas in the vicinity of the inlets prevents or impedes polymer accumulation, and (2) the size or thermal mass of the mini-gas distribution plate is sufficiently low to allow rapid plasma-heating of the plate. In order to enhance the gas turbulence across the area of the mini-gas distribution plate 220, the gas injection holes 225 in each mini-gas distribution plate 220 are angled relative to the surface of the plate facing the chamber interior. Preferably, the gas injection holes are angled so that the gas injection streams from adjacent holes cross one another or together form a vortex pattern. In an alternative embodiment of the placement of the mini-gas distribution plates 220, the mini-gas distribution plates 220 extend slightly out from top liner surface 316 to enhance plasma-heating thereof and to enhance gas injection turbulence. Preferably, the mini-gas distribution plates 220 are each a relatively small fraction of the area of the entire ceiling 316.

Each mini-gas distribution plate 220 is formed of a semi-metal such as silicon or a dielectric such as silicon dioxide (quartz) or sapphire, or, alternatively, of a non-conductive material or of a material compatible with processes conducted within processing chamber 100. Each mini-gas distribution plate 220 has plural gas inlets 225 through which process gas is sprayed into the reactor chamber interior. Preferably, the mini-gas distribution plates 220 are thermally insulated from the temperature controlled liner 134, so that they are readily heated by the plasma within the chamber. Each gas distribution plate 220 is sufficiently small relative to the ceiling—has a sufficiently small thermal mass—so as to be rapidly heated by the plasma upon plasma ignition. (For example, the first liner 134 may have a diameter in a range of 9 inches to 14 inches, while a gas distribution plate 220 has an exposed diameter on the order of about 0.25–0.5 inch. As a result, the plasma heats each mini-gas distribution plate 220 to a sufficiently high temperature to prevent any accumulation of polymer thereon. The advantage is that the gas inlets 225 of each mini-gas distribution plate 220, like the inlets of nozzles 350, can be kept clear of polymer.

Preferably, the diameter of each mini-gas distribution plate 220 is sufficiently small so that the entire bottom surface 220a of the gas distribution plate 220 is enveloped within a region of gas flow turbulence of the process gas spray from the inlets 225. Thus, for example, each mini-gas distribution plate 220 has an exposed diameter on the order of about 0.25–0.5 inch. This region has sufficient gas turbulence to retard or prevent the accumulation of polymer on the surface 220a.

Figure 9:
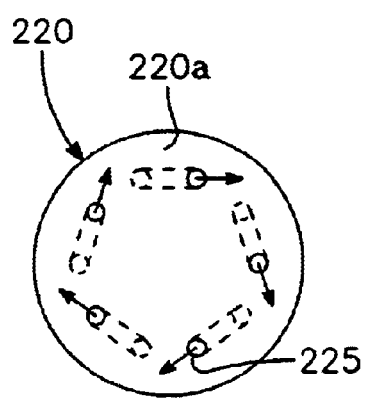
FIG. 9 is a plan view of an individual mini-gas distribution plate of the invention having angled gas inlets providing a preferred vortex pattern of gas spray.
Figure 10:
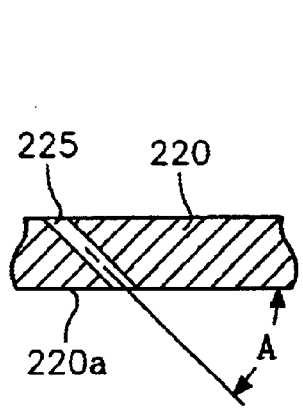
FIG. 10 is a cross-sectional cut-away view corresponding to FIG. 9.
Figure 11:
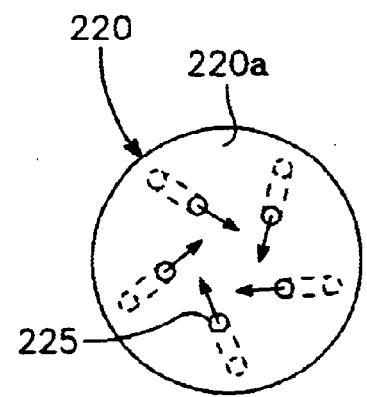
FIG. 11 illustrates an alternative spray pattern corresponding to FIG. 4.

Referring to FIGS. 9 and 10, the gas turbulence around the bottom surface 220a is enhanced by introducing a crossing pattern of gas spray paths from the plural gas inlets 225 of the mini-gas distribution plate 220. The embodiment of FIGS. 9 and 10 provides a vortex pattern (indicated by the arrows of FIG. 9). This is accomplished by drilling each of the gas inlets 225 at an angle A (as illustrated in FIG. 10) relative to the outlet surface 220a of the mini-gas distribution plate 220. Preferably, the angle A is in the range of about 20 degrees to 30 degrees. In an alternative embodiment illustrated in FIG. 11, the gas spray paths of the plural gas inlets 225 are directed at other inlets in order to enhance the gas turbulence. This alternative spray pattern is illustrated by the arrows in FIG. 11.

Figure 12:
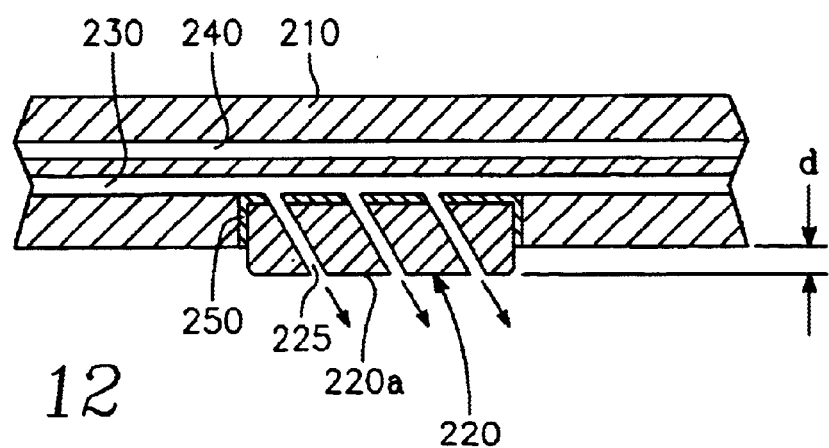
FIG. 12 is an enlarged cut-away cross-sectional view corresponding to FIG. 2.

As a further aid in inhibiting the accumulation of polymer on the mini-gas distribution plates 220, the outlet surface 220a of the plate 220 extends slightly below the surface of the ceiling 210 by a distance d, as shown in FIG. 12. The distance d is preferably about 0.02 inch to 0.03 inch or a fraction of the thickness of the gas distribution plate 220. The enlarged cross-sectional view of FIG. 12 illustrates one exemplary implementation in which the gas inlets 225 are angled holes passing entirely through the mini-gas distribution plate 220. Process gas is supplied to the gas inlets 225 by a common manifold 230 formed in the ceiling 316. A water jacket 240 of the water-cooled ceiling 316 is also shown in the drawing of FIG. 12. Preferably, a thermal insulation layer 250, which may be aluminum nitride for example, is trapped between the mini-gas distribution plate 220 and the ceiling 316.

In an embodiment where controlled polymer accumulation is desired such as an oxide etch process for example, the first liner 134 is maintained at a sufficiently low temperature so that polymer accumulates on the exposed surfaces of the first liner 134 as a very hard film which is virtually immune from flaking or contributing contamination to the chamber interior. The thermally differentiated mini-gas distribution plates 220 and nozzles 350 are heated by the plasma to a sufficiently high temperature to inhibit accumulation of polymer thereon. Thus, the gas inlets 225 are kept clear of any polymer. The small size of the mini-gas distribution plates 220 and nozzles 350 enables the plasma to efficiently heat them to a temperature above a polymer deposition temperature. The small size also permits the concentration of gas inlets over the small surface 220a to provide sufficient gas turbulence to further inhibit the accumulation of polymer on the surface 220a, inlets 225, or nozzles 350. The gas turbulence is enhanced by providing a crossed or vortex pattern of gas spray paths from each of the gas inlets 225 of the mini-gas distribution plate 220, and having the outlet surface 220a below the ceiling 316.

Another advantage of the minimized size nozzle is that because the nozzles size is small relative to the temperature controlled lid, plasma formed in the processing volume will likely contact the temperature controlled lid surface thereby improving byproduct adhesion to the lid as described above. The combination of all of the foregoing features prevents any observable accumulation of polymer on any portion the mini-gas distribution plate 220 or the various nozzle embodiments.

Figure 8:
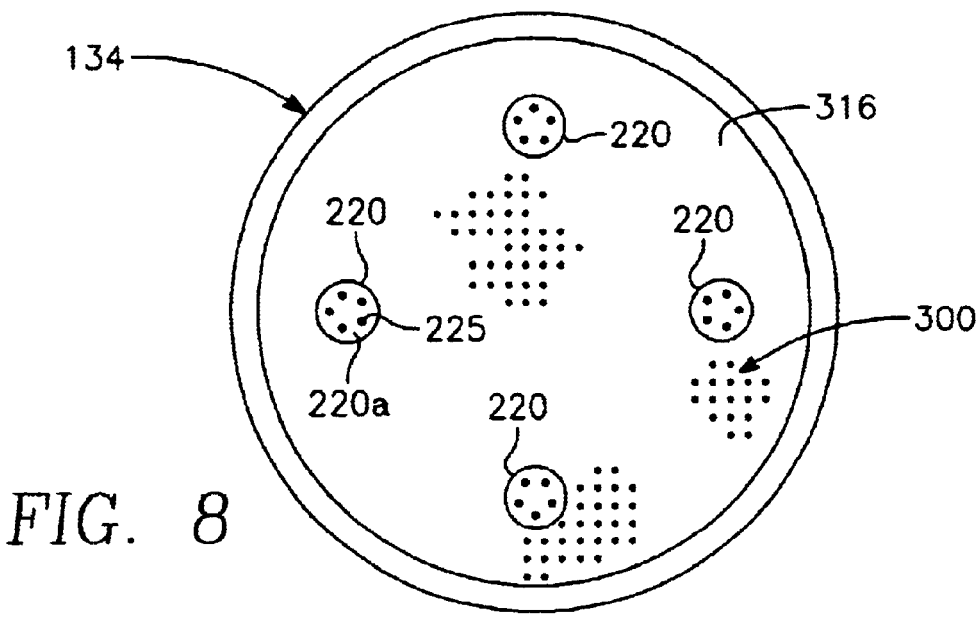
FIG. 8 is a plan view of the ceiling interior surface corresponding to FIG. 2.

FIG. 8 illustrates an embodiment where there are four mini-gas distribution plates 220 mounted on the first liner 134 at four symmetrically spaced locations overlying the periphery of the wafer 10. FIG. 8 also illustrates a plurality of semi-spherical bumps formed on the surface of the ceiling. These bumps are about 0.5 to about 1.5 mm high and are spaced about 1 mm apart. Bumps 300 are yet another alternative embodiment of the chamber surface texturing described in more detail below in the next section entitled "Chamber Surface Alterations to Improve Adhesion". Of course, additional mini-gas distribution plates 220 or nozzles 350 may be provided in other embodiments, or their placement modified from the arrangement illustrated in FIG. 4 and 8.

IV. Chamber Surface Alterations to Improve Adhesion

Another advantage of the present invention is the use of chamber surface topography to improve the adhesion of by products deposited on chamber surfaces. For example, in a conventional fluorocarbon based plasma etch of oxide features, polymeric byproduct formation is common. Referring to FIG. 2, for example, by-product deposition would occur on the surfaces of the two liners 118, 134 and lid 102 exposed to the plasma 148. After the deposits accumulate to a certain thickness, the deposits will begin to flake off the lid and the chamber liners, thereby contaminating the semiconductor devices being fabricated.

It is believed this aspect of the present invention further improves adhesion of reaction byproducts or other material deposited on surfaces within the process chamber that are exposed to process gases, thereby allowing the chamber to be operated for longer time intervals between cleaning such surfaces. Moreover, the improved byproduct adhesion capability promotes the use of expanded process gas compositions-including those with high rates of byproduct formation. Specifically, chamber interior surfaces such as the surface of the temperature controlled liner and lid, are fabricated with a surface contour or "texture" having topographical features—i.e., alternating protrusions and depressions (peaks and troughs)—whose width, spacing, and height dimensions are between 100 microns (0.1 mm) and 100 mm, and preferably in the range of 500 microns (0.5 mm) to 8000 microns (8 mm). In contrast, the average roughness of surfaces treated by conventional bead blasting is about 4 to 6 microns (0.15 to 0.23 mil), which is at least 16 times smaller than the features of the invention.

By "topographical feature" or "elevation feature" of the surface we mean an area whose elevation deviates from the average surface elevation. A topographical feature can be either a convex protrusion or a concave depression. The "height" of a feature is the peak-to-trough deviation in elevation. If the feature is a concave depression, the "height" of the feature is the depth of the depression.

It is believed that our textured surface improves adhesion of the deposited material for at least two reasons. One reason is that vertical contours (contours perpendicular to the average surface plane) increase compressive forces within the deposited film in a direction normal to the surface, thereby resisting cracking of the film due to thermal expansion and contraction. A second reason is that a textured surface has a greater surface area for the material to bond to than a flat surface.

The surface area increases in proportion to the depth of the depressions or the height of the protrusions. While increasing the height dimension in order to increase the surface area by improves adhesion of deposited material, increasing the height beyond a certain value can become disadvantageous. First, an excessive height dimension can make the textured surface harder to clean. Secondly, if the textured surface is a thin, removable chamber lid or liner rather than a comparatively thick chamber wall, an excessive height dimension can reduce the strength and rigidity of the lid or liner, making it more susceptible to accidental damage.

The texturing of our invention can be applied to the surface of any component of the process chamber. (By "component" we mean any object in or on the chamber.) The texturing preferably should be applied to any large surface that is exposed to the process gases in the chamber interior and that is either above or near the wafer. The chamber surfaces for which it is most important to provide the texture of the invention typically are the lower surface of the chamber roof (i.e., interior surfaces of the chamber lid 102) and the liners 134 and 118. Since the chamber roof is directly above the wafer being processed, any particles that flake off of the roof probably will fall on the wafer, thereby causing a defect in the wafer. Since the chamber side wall or lining is very close to the perimeter of the wafer, there also is a high risk that particles flaking off the side wall or lining will fall on the wafer. It is much less important to provide textured surfaces on chamber components positioned below the wafer, since particles flaking off of such surfaces are unlikely to deposit on the wafer.

Different shapes and dimensions of depressions and protrusions in the exposed surfaces of the chamber roof and side wall lining were tested. All shapes tested greatly improved adhesion of deposited material compared with either smooth, untreated surfaces or surfaces roughened by bead blasting.

Figure 13:
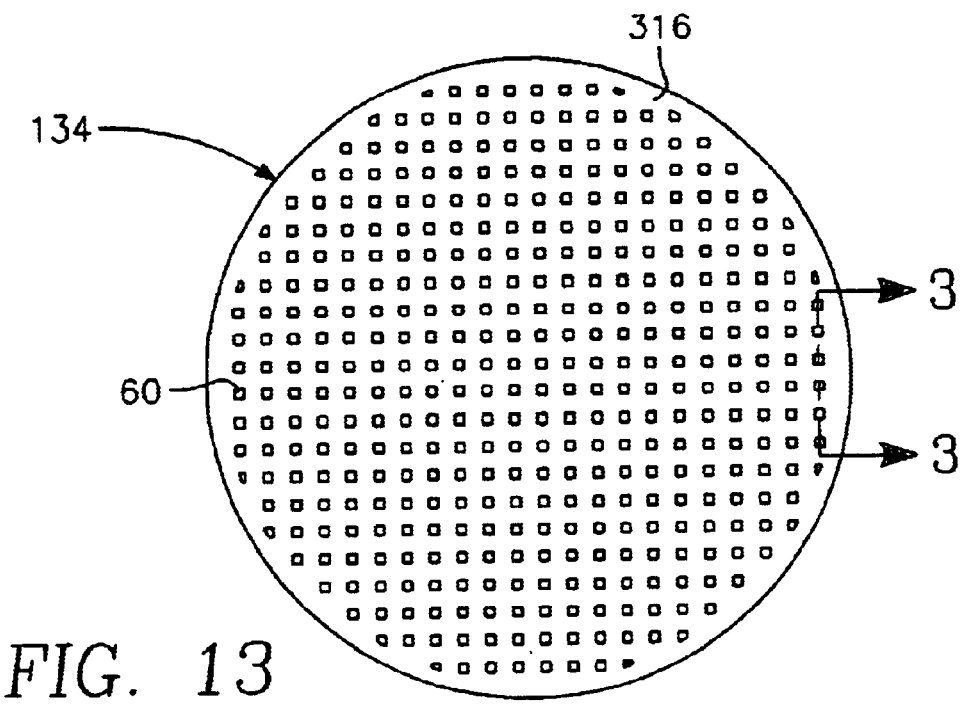
FIGS. 13 and 14 are top and sectional views, respectively, of a plate in which has been formed a texture consisting of square protrusions.
Figure 14:
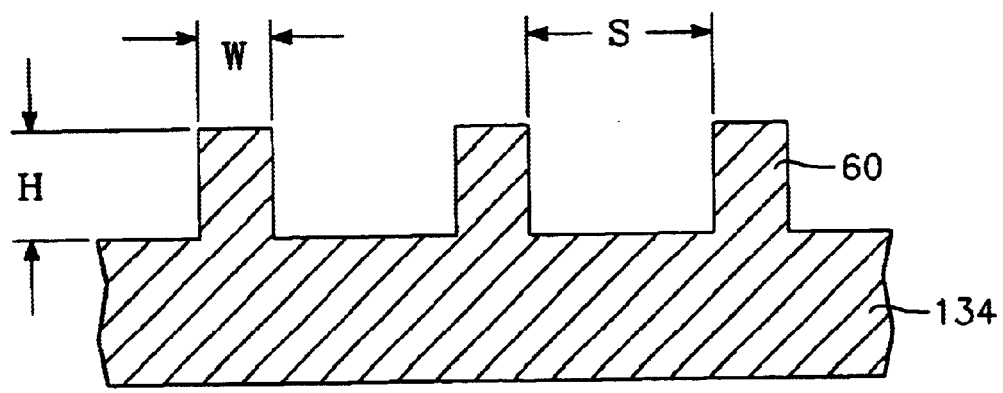
Figure 15:
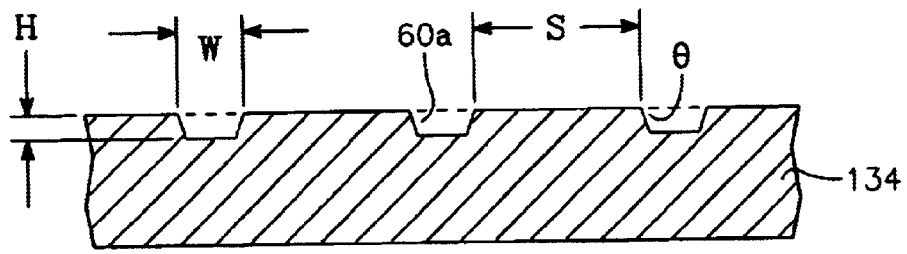
FIG. 15 is a sectional view of an alternative to the embodiment of FIG. 14 in which the sides of the square depressions are formed at an oblique angle.
Figure 16:
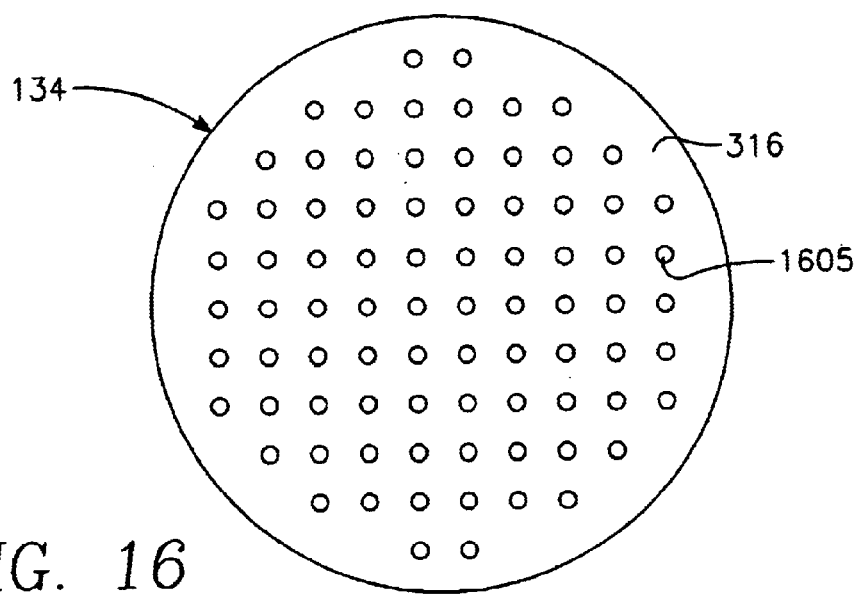
FIGS. 16 and 17 are top and sectional views, respectively, of an alternative embodiment in which the depressions are hemispherical in shape.
Figure 17:
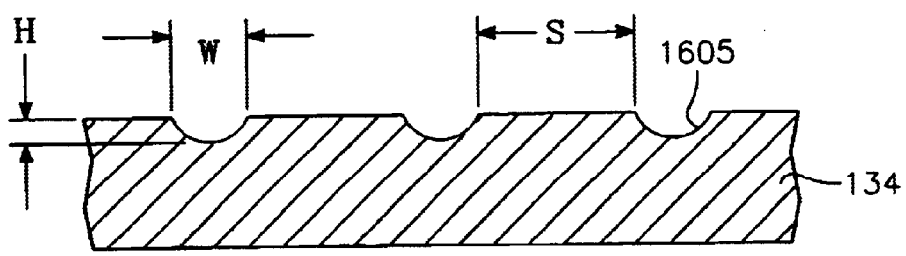

Viewed in conjunction with FIG. 4, FIGS. 13 and 14 are top and sectional views, respectively, of a portion of the lower surface 316 of a liner 134 having a texture 60 consisting of a 2-dimensional array of square protrusions 60. For clarity, apertures 348 and nozzles 350 have been omitted. The protrusions have height H, width W, and spacing S between adjacent protrusions. FIG. 15 shows a texture 60a in which the topographical features are square depressions into the surface rather than protrusions, and in which the sides of the square depressions are formed at an oblique angle θ relative to the horizontal surface between the depressions, so that each depression is shaped as an inverted 4-sided pyramid with a flat bottom rather than a sharp apex. FIGS. 16 and 17 are top and sectional views of an alternative texture 1605 in which the depressions are rounded or hemispherical in shape.

Figure 18:
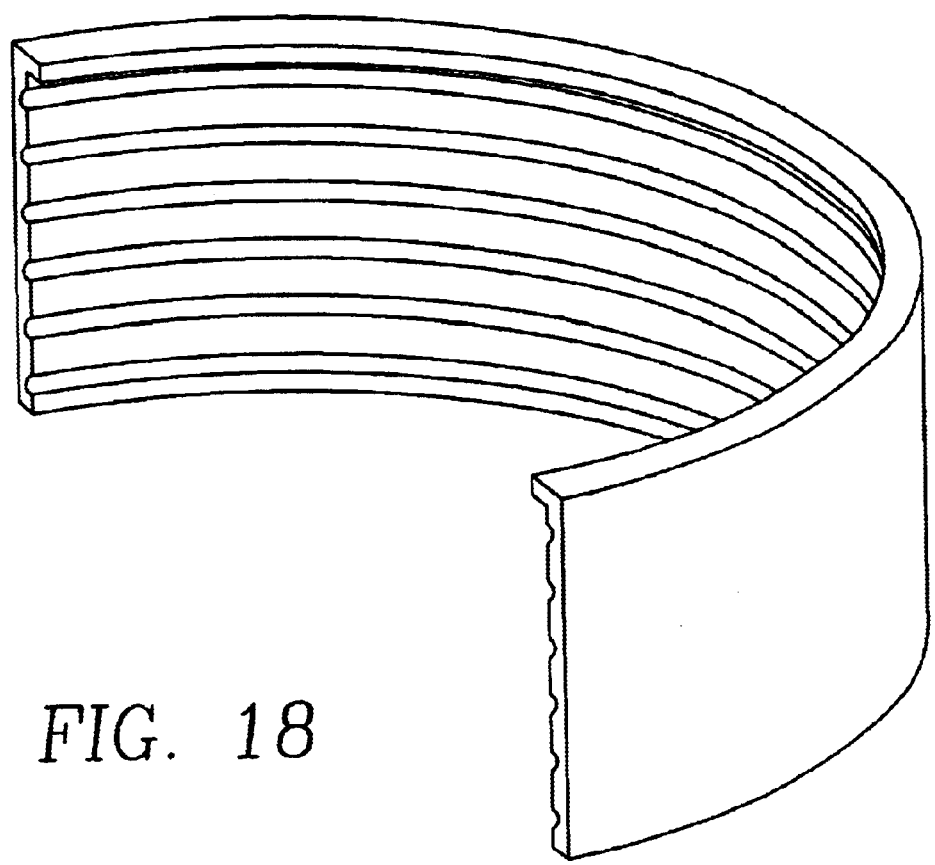
FIGS. 18 and 19 are perspective and sectional views, respectively, of a texture consisting of a series of circumferential grooves in a cylindrical side wall liner.
Figure 19:
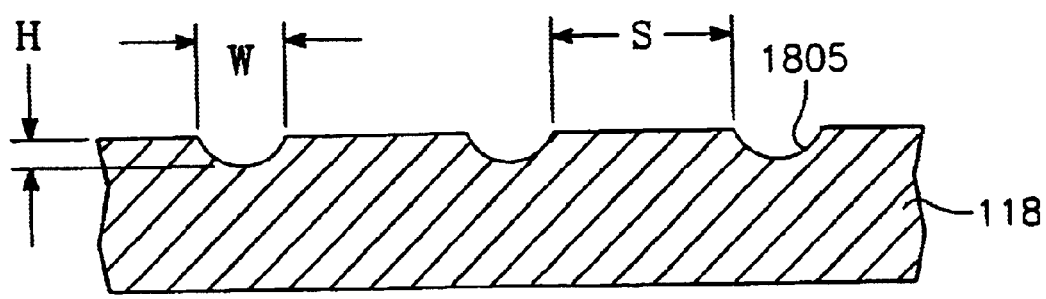

FIGS. 18 and 19 are perspective and sectional views, respectively, of a texture consisting of a plurality of circumferential grooves 1805 in a liner 118.

Figure 20:
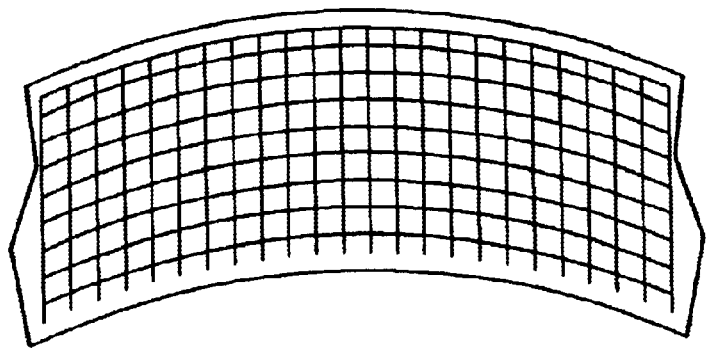
FIG. 20 is a perspective view of a cylindrical liner having both circumferential and longitudinal grooves.

FIG. 20 is a perspective view of a liner 118 having both circumferential 1805 and longitudinal 1810 grooves.

While each topographical feature has been characterized as either a protrusion or a depression, it is equivalent to consider the area between the depressions to be protrusions on the surface. In other words, it is arbitrary whether the protrusions or the depressions are designated as the topographical features. Therefore, referring for example to FIG. 17, the spacing S between depressions or protrusions preferably should be the same order of magnitude as the width W. More preferably, the spacing S and width W should differ by a factor of 2 or less. Similarly, the height H preferably should be the same order of magnitude as the width W and spacing S, and more preferably should be within a factor of 2 of those other two dimensions.

In any of the embodiments, we expect the adhesion of the deposited film to the textured surface will maximized if there are no sharp corners in the textured surfaces of the chamber components, because sharp corners generally increase stress in the film. Consequently, the edges of the topographical features should have rounded corners, with as high a radius of curvature as practical. Preferably, the radius of curvature ranges from between 130 microns (0.13 mm) to about 500 microns (0.5 mm).

Test Results—Control

We tested the invention by using a plasma etch chamber to perform a plasma process for etching films of silicon dioxide on silicon wafers, using a conventional fluorocarbon etchant gas mixture including $C_4F_8$ and CO. For the control, the process chamber had an aluminum nitride ceramic roof and an anodized aluminum side wall liner, both of which were smooth (i.e., had no surface texture treatments to improve adhesion.)

The etching process produces fluorocarbon reaction products which form polymer films on exposed inner surfaces of the chamber roof and side walls. We found that, with conventional smooth roof and side wall liner, the polymer deposited on these surfaces began flaking off after the polymer film reached a thickness of 0.6 to 0.65 mm. The thickness at which flaking occurred was independent of changes in process parameters.

EXAMPLE 1

Pyramid Depressions in Aluminum Nitride Roof

We fabricated a chamber roof (gas distribution plate) as a circular disk of aluminum nitride ceramic, 0.5 inch (13 mm) thick, in which we divided the lower circular surface of the roof (the surface exposed to the chamber interior) into four quadrants, with four different surface textures fabricated in the four quadrants. The first quadrant was smooth, and the second quadrant was bead blasted with silicon carbide particles.

The third and fourth quadrants both had the pyramid texture 60a shown in FIG. 15, with bead blasting subsequently applied to the fourth quadrant but not the third. The dimensions of the pyramid features were: angle θ=45°, height H=0.6 mm, width W=1.5 mm, spacing S=0.6 mm. We calculate that the third quadrant had a surface area 30% greater than that of the first quadrant due to its pyramid texture.

TABLE 1

| | Example 1 | |
|---|---|---|
| Quadrant | Pyramid Texture | Bead Blasting |
| 1 | No | No |
| 2 | No | Yes |
| 3 | Yes | No |
| 4 | Yes | Yes |

We expect that a pattern of square depressions or protrusions 60 as shown in FIG. 14 would be preferable to the pyramid-shaped depressions actually tested, because the square features have a greater surface area. As stated earlier, we expect that maximizing the surface area of the surface contour is advantageous in order to maximize the adhesion of the material deposited thereon.

We installed the roof in a conventional plasma etch chamber and performed the same plasma etch process performed in the Control. We found that the third quadrant of the roof exhibited the best polymer adhesion. Compared to the smooth first quadrant, we were able to process 2.5 times more wafers before material deposited on the third quadrant began flaking. At this point, the polymer layer deposited on the third quadrant had a thickness of 1.2 mm, which is 85% thicker than the maximum polymer thickness that could be deposited on a conventional smooth or bead blasted surface without flaking.

Because bead blasting conventionally had been used to improve adhesion of deposited material, we were surprised to observe that bead blasting the pyramid textured surface was detrimental to adhesion. Specifically, when we halted the test after depositing 1.2 mm of polymer on the lid, we observed a small amount of flaking from the fourth quadrant, and no flaking whatsoever from the third quadrant. We surmise that the bead blasting created sharp corners in the surface of the roof that increased stress in the polymer film, thereby promoting cracks in the film.

EXAMPLE 2

Different Pyramid Dimensions in Aluminum Nitride Roof

A second aluminum nitride roof (gas distribution plate) was fabricated as described for Example 1. The four quadrants were textured with pyramids having different dimensions, as summarized in Table 1. In the first quadrant, the pyramid dimensions were identical to those of quadrant 3 of Example 1. In the other three quadrants, the height H of the pyramid depressions was increased to 1.1 mm. In quadrants 3 and 4, the angle θ of the pyramid walls relative to the horizontal surface was decreased to 30°. In quadrants 2 and 4, the width W and spacing S were increased to 2.5 mm and 1.0 mm, respectively. All four quadrants exhibited no flaking of the polymer deposits.

TABLE 2

| | Example 2 | | | |
|---|---|---|---|---|
| Quadrant | Angle θ | Height H | Width W | Spacing S |
| 1 | 45° | 0.6 mm | 1.5 mm | 0.6 mm |
| 2 | 45° | 1.1 mm | 2.5 mm | 1.0 mm |
| 3 | 30° | 1.1 mm | 1.5 mm | 0.6 mm |
| 4 | 30° | 1.1 mm | 2.5 mm | 1.0 mm |

EXAMPLE 3

Hemispherical Depressions in Aluminum Oxide Roof

We fabricated a roof of a 0.5 inch (13 mm) thick plate of aluminum oxide (alumina) ceramic. Alumina has a much lower thermal conductivity than aluminum nitride, but it has the advantage of being readily machinable. We created the pattern of depressions shown in FIGS. 16 and 17 by drilling in the alumina an array of approximately hemispherical holes, or holes having an arcuate cross section, having a hole diameter W of 4 mm and a spacing S between the perimeters of adjacent holes of 1 mm. We tested two prototypes in which the depth of the holes (the topographical feature height H) were 1 mm and 2 mm, respectively. Both prototypes exhibited no flaking of the polymer deposits.

EXAMPLE 4

Square Protrusions in Anodized Aluminum

FIGS. 13 and 14 show an aluminum roof in which we machined an array of square protrusions. While the section is illustrated as solid the same features or protrusions may be incorporated into the top ceiling 316 having a plurality of gas inlets 350 or mini-gas distribution plates 220. The aluminum was anodized after the machining. In one prototype the protrusions had 1 mm width W, 1.5 mm height H, and 3 mm spacing S. In a second prototype, the protrusions had 2 mm width W, 2 mm height H, and 5 mm spacing S. Both prototypes exhibited no flaking of the polymer deposits.

In the second prototype, we also tested an implementation of the gas inlet holes in the gas distribution plate. Instead of a conventional array of gas inlet holes uniformly distributed over the surface of the plate, we installed in the plate only eleven quartz discs (not shown), where each quartz disc was 10 mm diameter and included eleven gas inlet holes 0.6 mm diameter.

EXAMPLE 5

Grooves in Anodized Aluminum

FIGS. 18 and 19 are perspective and sectional views, respectively, of a cylindrical side wall liner 118 composed of anodized aluminum in which we machined a series of circumferential grooves 1805 using a lathe. Each groove had 1 mm width and 1 mm depth, and adjacent grooves were spaced apart along the axis of the cylindrical liner by 3 mm. The aluminum was anodized after the machining.

FIG. 20 is a perspective view of a similar cylindrical liner having both circumferential 1805 and longitudinal 1810 grooves of the same width, depth, and spacing dimensions stated in the preceding paragraph.

Both prototypes exhibited no flaking of the polymer deposits. However, the FIG. 20 embodiment is expected to provide superior adhesion because its surface area is greater than that of the embodiments illustrated in FIGS. 18 and 19.

An advantage of the embodiments of FIGS. 18, 19 and 20 is that machining grooves in aluminum typically is less expensive than the other fabrication methods described earlier.

While the different textures may be illustrated and described with regard to first liner 134 or second liner 118, it is to be appreciated that the textures described herein may be applied to either or both liners 134, 118. In alternative embodiments, liner 134 may have a different surface treatment than liner 118. In one specific embodiment, liner 134 may have texture 1605 while liner 118 has circumferential groove texture 1805.

V. Plasma Confinement

Another aspect of the byproduct management feature of the present invention is the use of a plasma confinement system to contain the plasma in the processing region 112. Containing the plasma within the processing region 112 helps prevent byproduct accumulation in the pumping volume 114. Reducing or eliminating byproduct accumulation in pumping volume 114 reduces the likelihood that byproduct deposition will occur in and potentially damage pump 109. The plasma confinement feature of the present invention may be better appreciated through reference to FIG. 21.

Figure 21:
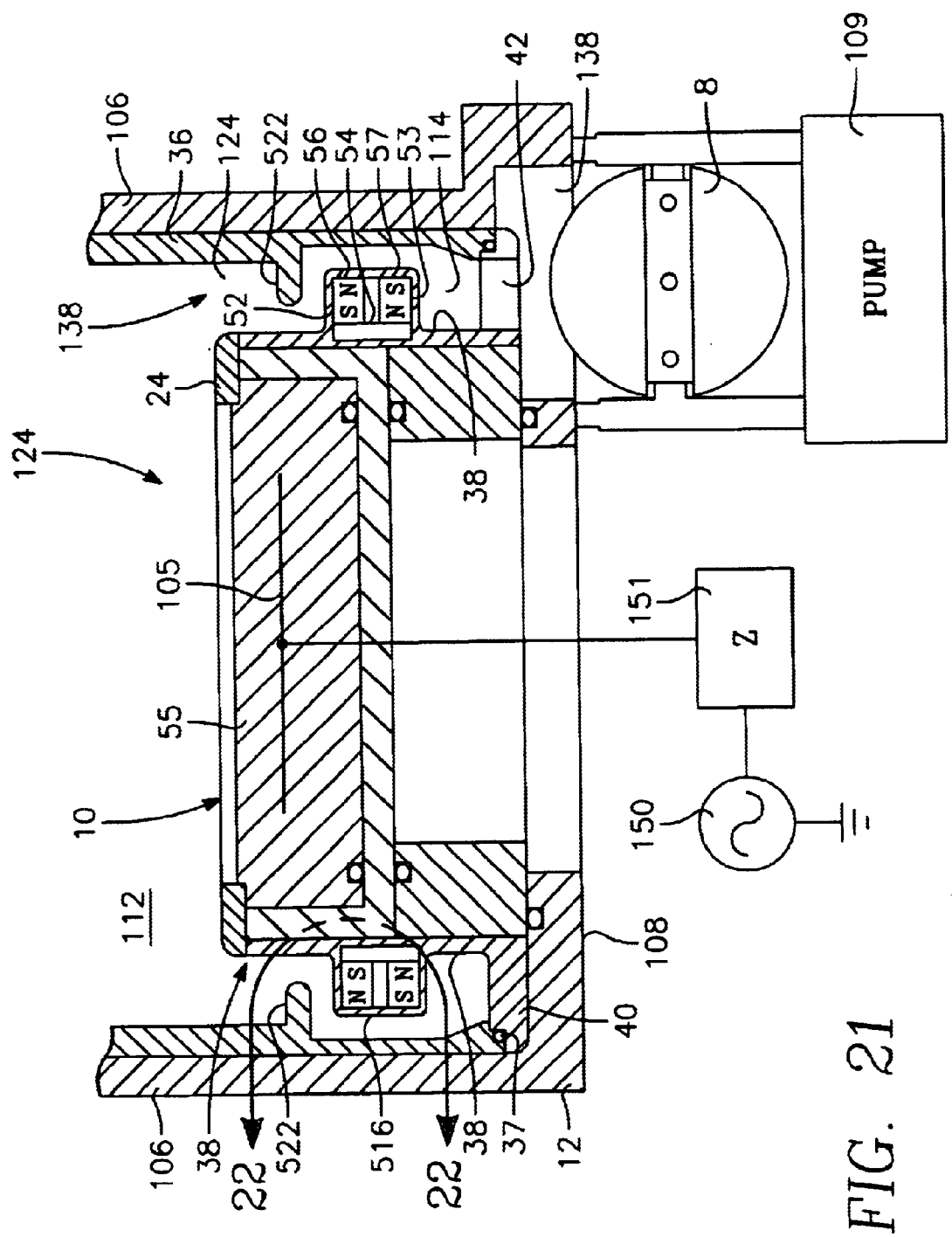
FIG. 21 is a plan view of a plasma etching chamber with an exhaust manifold having an annular, U-shaped magnet system embedded within an annular protrusion according to the invention.

FIG. 21 is an enlarged partial view of the etched chamber 100 of FIG. 1. Lid 102 has been removed for clarity. A vacuum pump 109 exhausts gases from the processing volume 112 through annular exhaust manifold and cylindrical pumping channel 138 so as to reduce the total gas pressure in the chamber to a level suitable for the plasma process intended to be performed in the chamber. A throttle valve 8 is mounted within the pumping volume 114. The throttle valve 8 regulates the gas pressure within the chamber by controlling the impedance to gas flow within the pumping channel 138, thereby controlling the pressure drop across the pumping channel as required to maintain the desired chamber pressure.

While described as separate liners, it is to be appreciated that liners 36 and 38 could be combined into a single liner such as described above with regard to liner 118. It is to be appreciated that each of the plasma confinement features described herein with regard to liners 36, and 38 apply to liner 118. It is to be further appreciated that liners 36 and 38 are equipped with internal conduits such as conduit 119 of liner 118 for circulating temperature controlled fluid as described above with regard to FIG. 6 and liners 118 and 143.

The inner liner 38 and the lower half of the outer liner 36 respectively function as the inner and outer walls of the annular exhaust volume 114. The annular flange 40 at the bottom of the inner liner 38 includes an arcuate aperture 42, aligned with the cylindrical pumping channel 138, to permit exhaust gases to flow from the annular exhaust manifold, through the flange aperture 42, and then through the cylindrical pumping port 138 to the throttle valve 8 and the pump 109.

The exhaust channel of the illustrated chamber includes an annular exhaust manifold and a cylindrical pumping channel. The annular exhaust manifold is coaxial with the chamber interior and extends around all or most of the azimuth of the chamber interior. The cylindrical pumping channel is coupled to the exhaust manifold at one azimuthal position. Some conventional plasma chambers include an annular exhaust manifold coupled directly to the exhaust pump without any intermediate pumping channel. Other conventional plasma chambers couple the pump to the chamber interior using only a pumping channel that does not extend around the azimuth of the chamber interior. In this patent specification, the term "exhaust channel" or "exhaust passage" encompasses either an annular exhaust manifold or a pumping channel, or the two in combination.

Exhaust Channel and Magnet for Confining Plasma

Figure 22:
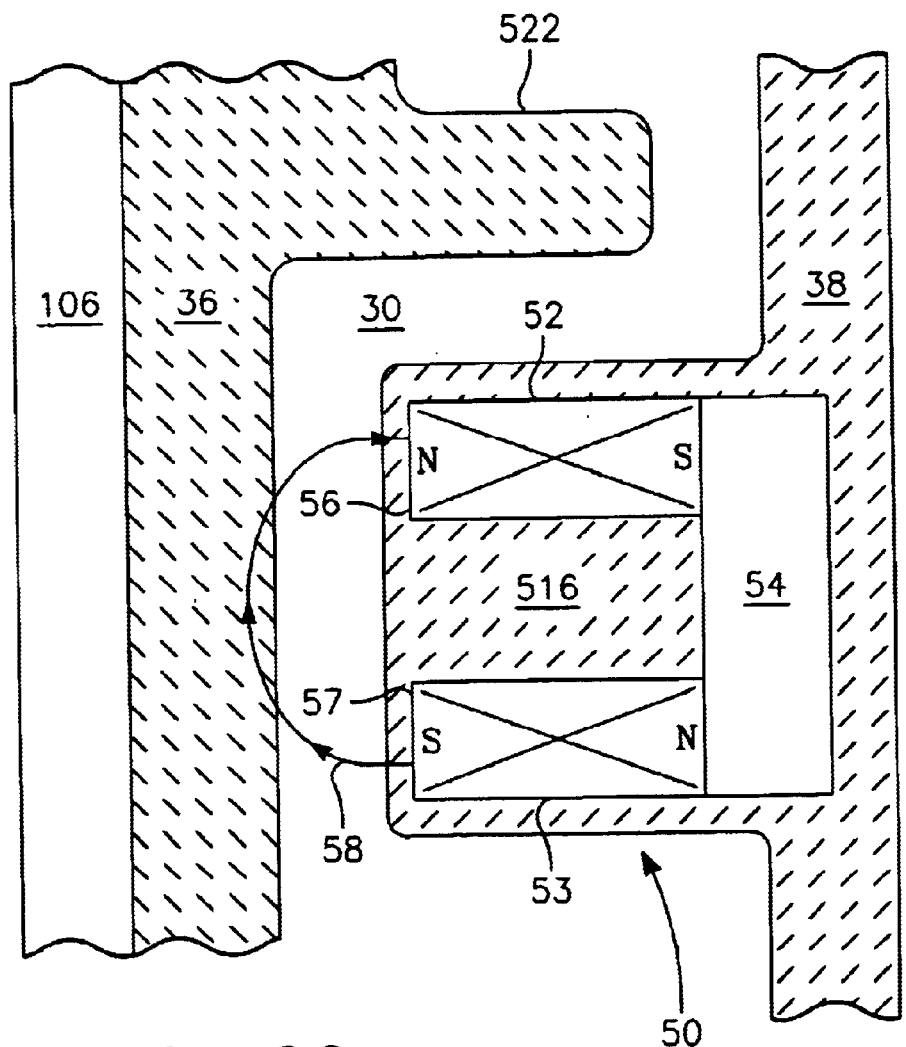
FIG. 22 is a detail of the magnet system and annular protrusions in the FIG. 21 chamber.
Figure 23:
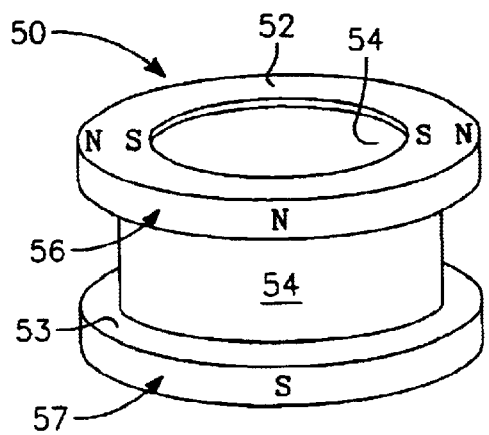
FIG. 23 is a perspective view of an annular, U-shaped magnet system with magnetic poles facing radially outward.

An exemplary embodiment of the invention, shown in FIGS. 21–23, employs two features—a gas flow deflector 522, 516 and a magnet system 50—that operate synergistically to prevent the plasma body within the chamber interior from reaching the exhaust pump. In addition to its beneficial functions as detailed below, this arrangement assists in providing high pumping capacity while avoiding polymer deposition in the pumping system. That is, as explained in the present disclosure, one feature of the inventive chamber is the high flow pumping capability for reduced residence time of the gas molecules. However, for maintenance reasons, it is advisable to constrain or limit the plasma from reaching to the pumping area of the chamber. The arrangement described below assists in achieving this goal.

Specifically, the interior of the exhaust manifold 30 includes at least one deflector 522, 516 that deflects at least a substantial portion of the exhaust gases transversely, instead of allowing all of the exhaust gases to flow in an unobstructed straight path through the exhaust manifold. (By "transversely" we mean perpendicular to the direction of the path along which the gases would flow in the absence of the deflector.)

The deflector creates turbulence in the flow of exhaust gases that increases the rate of collisions of reactive species in the gases with the deflector and with the walls of the exhaust manifold near the deflector. The collisions promote surface reactions among the reactive species so as to produce deposits on the walls. This depletes the exhaust gases of the reactive species that tend to produce such deposits, thereby greatly reducing or eliminating the concentration of such reactive species in the exhaust gases downstream of the deflector, and therefore greatly reducing or eliminating undesirable deposits on the throttle valve 8 and pump 109.

The deflector also increases the rate of collisions of charged particles in the exhaust gases so as to promote recombination of such charged particles, thereby reducing the concentration of charged particles in the exhaust gases.

Additionally, a magnet system 50 (52–57) is positioned near the deflector 522, 516 so as to produce a magnetic field within the exhaust manifold near the deflector. The magnetic field preferably has a substantial component directed transverse to the direction of exhaust gas flow through the manifold. The transverse component of the magnetic field transversely deflects moving electrons so that they are more likely to recombine with positive ions, thereby reducing the concentration of charged particles in the exhaust gases.

Since the deflector and the magnetic system both reduce the concentration of charged particles in the exhaust gases, the two in combination can reduce the concentration sufficiently to extinguish the plasma downstream of the deflector and magnet system. Specifically, the magnetic field should be strong enough, and the turbulence caused by the one or more deflectors should be great enough, so that the combined effects of the magnetic field and the deflector prevent the plasma body within the chamber from reaching the throttle valve 8 and exhaust pump 109.

The plasma confinement effect of the magnetic field permits the use of a wider and/or less sinuous exhaust channel than would be required to block the plasma without the magnetic field. Therefore, the pressure drop across the exhaust channel can be reduced in comparison with prior art designs that rely entirely on the sinuousness of the exhaust manifold to block the plasma.

In the embodiment shown in FIGS. 21–23, the deflector consists of two coaxial, annular protrusions 522, 516 extending into the gas passageway of the exhaust manifold 30 from the walls of the manifold. The upper protrusion 522 extends radially inward from the outer liner 36, and the lower protrusion 516 extends radially outward from the inner liner or cathode shield 38. Because the two protrusions overlap each other radially, they do not permit any of the exhaust gases to travel in a straight line through the exhaust manifold, thereby maximizing the likelihood that reactive species in the exhaust gases will collide with either the protrusions or the walls of the exhaust manifold.

We define a "magnet system" as one or more magnets in combination with zero, one or more magnetically permeable pole pieces to form a magnetic circuit having a north pole and a south pole. In the embodiment of FIGS. 21–23, the magnet system 50 consists of two annular magnets 52, 53 mounted coaxially with the annular exhaust manifold 30 and spaced apart along the axis of the manifold. The two annular magnets are identical, except that the first magnet 52 has its north and south poles at its radially inner and outer ends, respectively, whereas the second magnet 53 has its north and south poles at its radially outer and inner ends, respectively. The magnet system 50 also includes a cylindrical, magnetically permeable pole piece 54 mounted coaxially with the two magnets 52, 53 so as to abut and extend between the radially inner ends of the two magnets, thereby completing a magnetic path or "magnetic circuit" between the two magnets.

Consequently, the north pole 56 of the magnet system 50 is the north pole of the first annular magnet 52, i.e., the pole of the first magnet opposite the pole that abuts the pole piece 54. The south pole 57 of the magnet system 50 is the south pole of the second annular magnet 53, i.e., the pole of the second magnet opposite the pole that abuts the pole piece 54.

The magnet system 50 preferably is mounted within the lower protrusion 516 so that the ends of the north and south poles 56, 57 of the magnet system are as close as possible to the narrow portion of the gas passageway within the exhaust manifold that is radially outward of the protrusion. Mounting the magnet system close to the narrowest portion of the exhaust manifold passageway is desirable to maximize the magnetic field strength to which the exhaust gases are subjected.

An exemplary implementation of the magnet system just described has a U-shaped cross section as shown in FIGS. 21–23, with the base of the "U" pointing radially inward and the open end of the "U" pointing radially outward. More specifically, the shape of the magnet system is that of a U-shaped horseshoe magnet that is revolved around the longitudinal axis of the chamber.

The magnetic field pattern produced by this U-shaped magnet system, represented by field line 58 in FIG. 22, is desirable because it is concentrated primarily within the passageway of the exhaust manifold. This concentration has at least two advantages. One advantage is that, as stated above, it maximizes the magnetic field strength to which the exhaust gases are subjected, thereby maximizing the effectiveness of the magnet in extinguishing the plasma downstream of the magnet.

A second advantage of the U-shaped magnet system is that the magnetic field strength declines rapidly along the longitudinal axis of the chamber, so that the magnetic field strength is low at the workpiece 10. To minimize the risk of damaging the workpiece by ion bombardment or electrostatic charge accumulation, the magnetic field strength at the workpiece 10 should be as low as possible, preferably no greater than 5 gauss, and more preferably no greater than 3 gauss. The magnet system is mounted in the lower protrusion 516 rather than the upper protrusion 522 in order to position the magnet system as far as possible from the workpiece 10, thereby minimizing the strength of the magnetic field at the workpiece 10.

Figure 24:
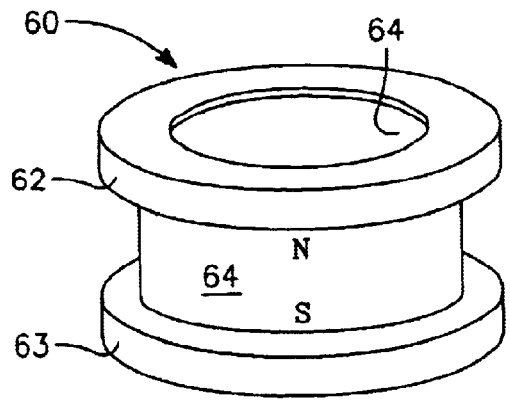
FIG. 24 is a perspective view of a magnet system whose magnets and pole pieces are interchanged relative to the embodiment of FIG. 23.

FIG. 24 shows an alternative magnet system 60 whose magnets and pole pieces are interchanged relative to the embodiment of FIGS. 21–23. Specifically, the upper and lower annular members 62, 63 are magnetically permeable pole pieces rather than magnets. The cylindrical member 64 is a magnet rather than a pole piece, the cylindrical magnet having a north magnetic pole at the upper end of its longitudinal axis abutting the upper pole piece 62 and a south magnetic pole at the lower end of its axis abutting the lower pole piece 63.

A possible alternative implementation of the exhaust manifold could omit the upper protrusion 522, relying on the combination of the lower protrusion 516 and the magnet system 50 to block the plasma.

Figure 25:
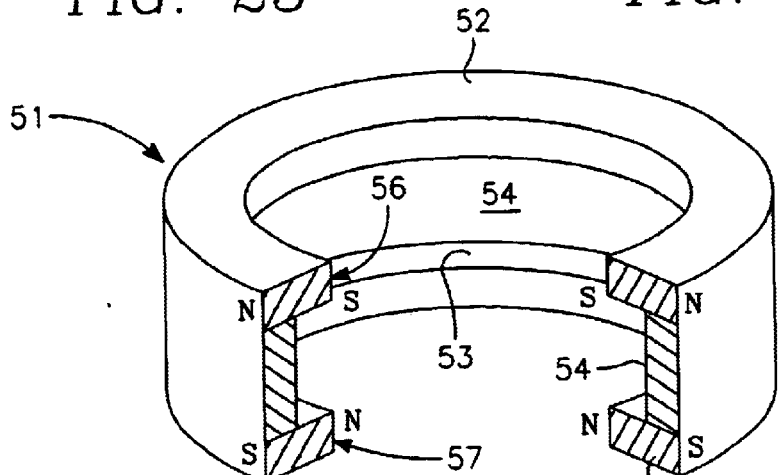
FIG. 25 is a perspective view of an annular, U-shaped magnet system with magnetic poles facing radially inward.

Another alternative exhaust manifold design would omit the lower protrusion 516 (which extends radially outward from the inner liner 38) and substitute a modified magnet system 51, shown in FIG. 25, that is mounted within the upper protrusion 522 (which extends radially inward from the outer liner 36). The north and south magnetic poles 56, 57 of the modified magnet system 51 should be adjacent the gas passageway at the radially inner end of the protrusion 44. This can be accomplished using the same magnets 52, 53 and pole piece 54 as in the FIG. 23 magnet system, but with the pole piece 54 moved from the radially inner end to the radially outer end of the two magnets, as shown in FIG. 25.

Figure 26:
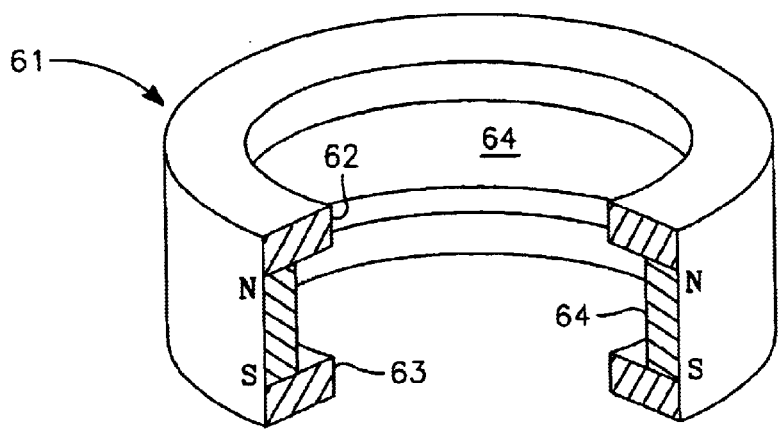
FIG. 26 is a perspective view of a magnet system whose magnets and pole pieces are interchanged relative to the embodiment of FIG. 25.

FIG. 26 shows an alternative magnet system 61 that differs from the FIG. 25 magnet system 51 in that the magnets and pole pieces are interchanged. (See the discussion of the FIG. 24 embodiment above.)

Figure 27:
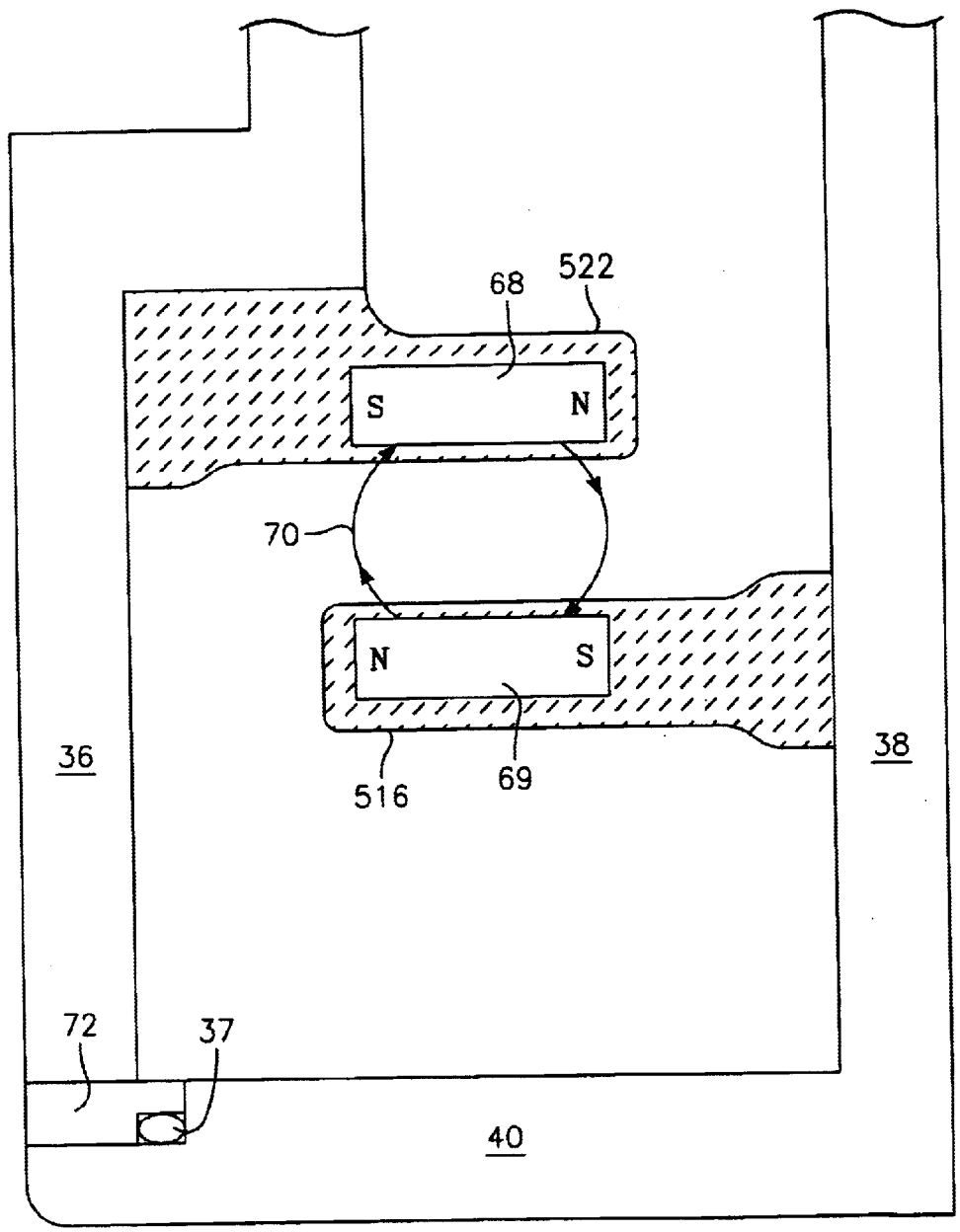
FIG. 27 is a detailed plan view of an exhaust manifold having two annular magnets respectively embedded within two annular protrusions according to the invention.

We also tested the exhaust manifold design shown in FIG. 27 in a plasma chamber that otherwise was identical to the chamber shown in FIG. 21. The exhaust manifold of FIG. 27 includes upper and lower annular magnets 68, 69 mounted within the upper and lower protrusions 522, 516, respectively, of the exhaust channel 30. The upper magnet 68 has north and south poles at its radially inner and outer ends, respectively. The lower magnet 69 has north and south poles at its radially outer and inner ends, respectively. Consequently, the north and south poles of the upper magnet are aligned with the south and north poles of the lower magnet. The resulting magnetic field, depicted by magnetic field lines 70, is highly concentrated in the region of the exhaust manifold channel or passageway between the two protrusions. As explained in the preceding discussion of the FIG. 21 embodiment, such concentration is desirable to maximize the strength of the magnetic field to which the exhaust gases are subjected and to minimize the magnetic field at the workpiece 10.

To facilitate testing the FIG. 27 embodiment with different gaps between upper and lower protrusions 522, 516, our prototype included an annular dielectric spacer 72 below the outer dielectric liner 36. By substituting a thicker spacer 72, we could increase the height of the upper protrusion 522 and thereby increase the gap between the two protrusions. We used the same magnets 68, 69 for every spacer thickness we tested. Therefore, when we substituted a thicker spacer, we both increased the gap and decreased the magnetic field strength in the gap.

In these tests we found that the plasma was successfully blocked from extending below the lower protrusion when the gap between the upper and lower protrusion was 0.5 inch or less and the magnetic field strength in the gap was at least 100 or 150 gauss. We also found that, in the illustrated chamber, the magnetic field strength declined fast enough away from the magnets so that the magnetic field strength at the workpiece 10 was less than 3 gauss, which we consider low enough to avoid risk of damage to the workpiece However, when we tested a wider gap between the two protrusions, and therefore a lower magnetic field strength in the gap, we found that the plasma was not successfully blocked.

We currently prefer the FIG. 21 embodiment because more manufacturing labor is required to mount magnets within two protrusions as in the FIG. 27 design in comparison with mounting magnets in only one protrusion as in the FIG. 21 design.

Another alternative embodiment of the exhaust manifold would be to omit one protrusion and its corresponding magnet from the FIG. 27 embodiment. We tested a prototype that was identical to the one shown in FIG. 27, except that the upper protrusion 522 and the upper magnet 68 was omitted leaving only the lower protrusion and magnet as illustrated in FIG. 28. While this prototype successfully, blocked the plasma from extending below the lower protrusion, we considered the magnetic field at the workpiece to be undesirably strong. However, this embodiment might be suitable for use in semiconductor fabrication processes in which the workpiece is not overly susceptible to damage by ion bombardment or electrostatic charge accumulation.

More generally, the deflector 522, 516 need not be one or more protrusions extending from the walls of the exhaust channel, but can be any structure within the exhaust channel that causes substantial turbulence in the exhaust gases. As described earlier, such turbulence will promote recombination of charged particles so as to help extinguish the plasma downstream of the turbulence, and it will promote surface reactions among reactive species so that reaction products will be deposited on surfaces near the deflector rather than on pumping components 8,109 downstream.

The deflector and magnet system can be mounted in any part of the exhaust channel, such as the pumping channel 32, even though they are mounted in the annular exhaust manifold in the preferred embodiment.

Of course, any materials between the magnet system and the interior of the exhaust channel should be non-magnetic so as to avoid blocking the magnetic field from reaching the exhaust gases. As stated earlier, in the preferred embodiment the protrusions in which the magnet system is mounted are anodized aluminum.

To equalize the exhaust gas flow rate around the azimuth of the chamber, it is preferable to slightly reduce the radial width of the exhaust manifold near the azimuth of the pumping channel and to slightly increase its radial width near the opposite azimuth, i.e., near the azimuth 180 degrees away from the pumping channel.

The directions of the magnetic fields can be reversed without affecting the operation of the invention. Therefore, all references to north and south poles can be interchanged.

The illustrated plasma chamber has circular symmetry because it is intended for processing a a single, circular semiconductor wafer. In plasma chambers having other geometries, such as chambers for processing multiple substrates or rectangular substrates, the components of the invention such as the deflector and magnet system would be expected to have rectangular or more complex geometries. The term "annular" as used in this patent specification is not intended to limit the described shape to one having a circular inner or outer perimeter, but encompasses rectangular and more complex shapes.

VI. Alternative Chamber Embodiments of the Present Invention

FIG. 28 is a cross sectional view of a capacitively coupled. Magnetically Enhanced Reactive Ion Etch (MERIE) chamber having embodiments of the improvements of the present invention. FIG. 28 illustrates an etch processing system 2800 similar having the same systems as processing system 50 of FIG. 1. Etch processing system 2800 includes MERIE chamber 2850. MERIE chamber 2850 is similar to chamber 100 described above with the inclusion of a number of paired electromagnets. For example, four electromagnets 2810, 2812, 2814, and 2816, typically mounted in a generally rectangular array, one each on the alternating walls of chamber sidewall 106 each having a suitable power supply 2830, 2832, 2834 and 2836. For clarity, only electromagnets 2810 and 2812 and their respective power supplies 2830 and 2832 are illustrated in FIG. 28. Under the control of controller 140, the coil pairs 2810 and 2812 and 2814 and 2816 cooperatively provide a quasi-static, multi-directional magnetic field which can be stepped or rotated about the wafer 10. Electromagnets 2810, 2812, 2814 and 2816 generate a controllable magnetic field with a magnitude from about 0 Gauss to about 150 Gauss. Also, the magnitude of the magnetic field can be adjusted to select etch rate and vary ion bombardment. Additional details of MERIE chamber operation are provided in commonly assigned U.S. Pat. No. 4,842,683 entitled. "Magnetic Field-Enhanced Plasma Etch Reactor."

FIG. 28 also illustrates an alternative embodiment of the second liner 118 having only the lower protrusion 516. Magnetic confinement system 52 is disposed within lower protrusion 516. While the magnetic confinement system 52 is illustrated, it is to be appreciated that any of the magnetic confinement systems described above in the section entitled "Plasma Confinement" may be modified for use in the single protrusion embodiment of the liner 118.

Figure 29:
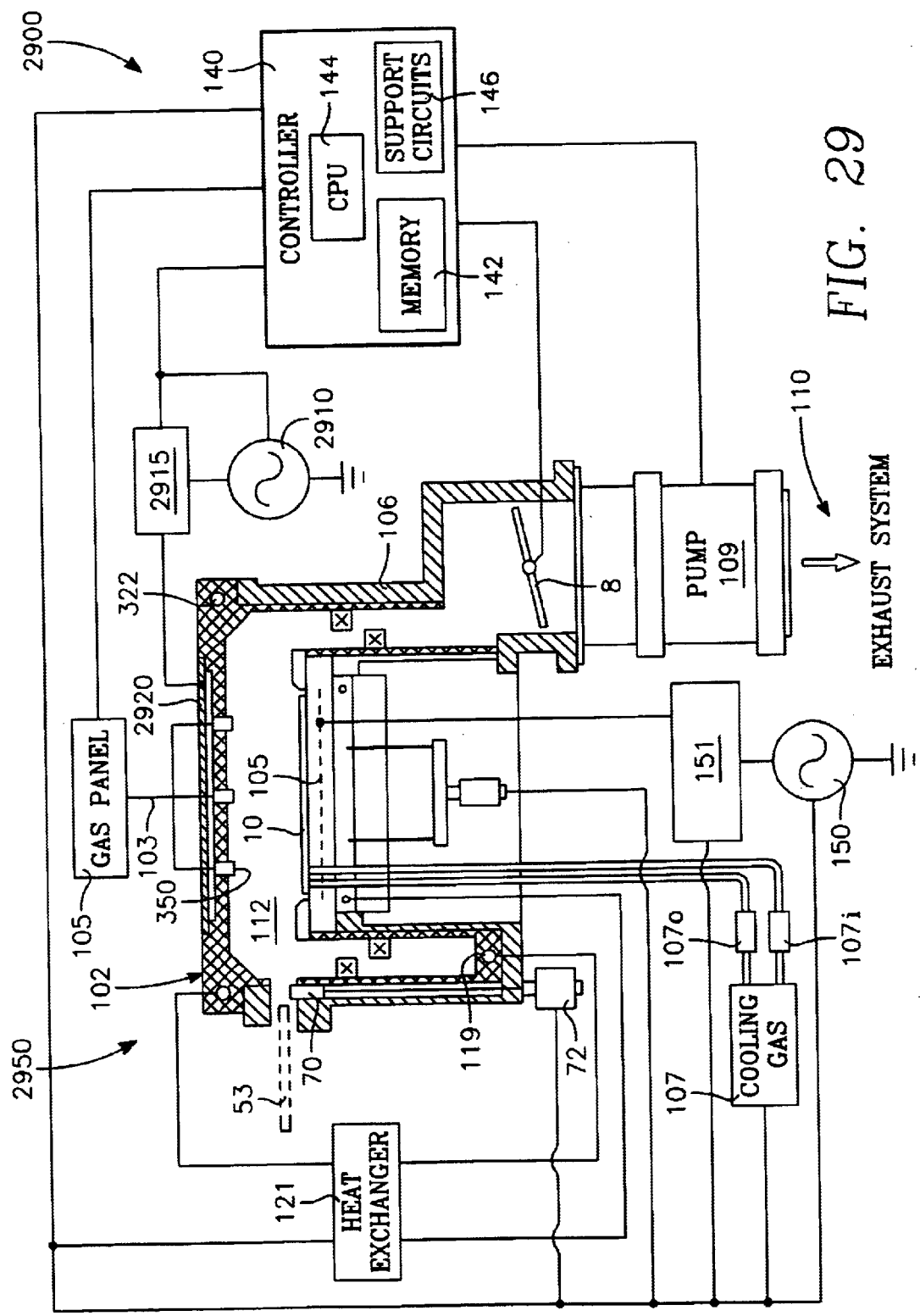
FIG. 29 is a cross-section partial schematic view of an alternative embodiment of the present invention in a parallel plate etch processing system.

FIG. 29 is a cross sectional view of another type of etch chamber having embodiments of the present invention. FIG. 29 illustrates an etch processing system 2900 having an etch processing chamber 2950. Processing system 2900 is similar to processing system 50 of FIG. 1 with the addition of a second RF generator 2910 and impedance matching circuits 2915. Processing chamber 2950 is similar to processing chamber 100 with the addition of parallel plate 2920. In operation, RF signals from RF generators 150 and 2910 are provided under the control of controller 140, via impedance matching circuitry 151 and 2915, respectively, to electrode 105 and parallel plate electrode 2920, respectively. In one alternative embodiment, RF generators 150 and 2920 provide RF signals at the same frequency. In an alternative embodiment, RF generators 150 and 2920 provide RF signals at different frequencies.

Figure 30:
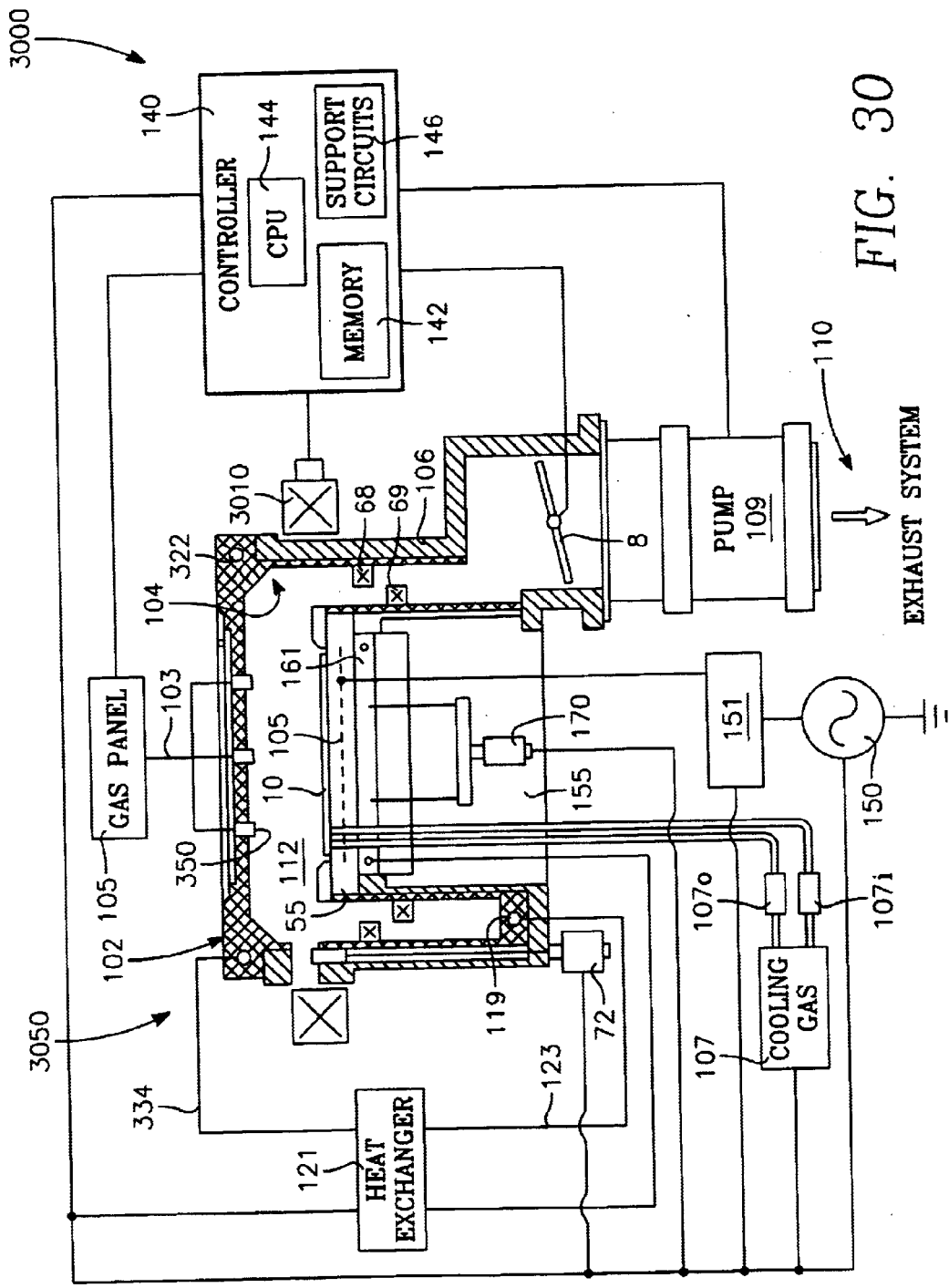
FIG. 30 is a cross-section partial schematic view of an alternative embodiment of the present invention in a, capacitively coupled, magnetically enhanced reactive ion etch (MERIE) processing system generated by a rotating magnetic field.

FIG. 30 is a cross sectional view of another processing chamber incorporating embodiments of the present invention. FIG. 30 illustrates an etch processing system 3000 having a magnetically enhanced etch chamber 3050. Processing system 3000 is similar to processing system 50 with the addition of controller 140 operating a magnetic field generating mechanism 3010. Processing chamber 3050 is similar to processing chamber 100 with the addition of the magnetic field generating mechanism 3010. The magnetic field generating mechanism 3010 is disposed on the outer peripheral surface of the cylindrical wall 106 of the process chamber 3050. The magnetic field generating mechanism 3010 comprises a plurality of circumferentially arranged permanent magnets having a predetermined polarity which enables generation of a magnetic field parallel to the upper surface of the wafer 10, and a driving mechanism for revolving the magnets around the processing chamber 3050. The magnetic field generating mechanism 3010 generates a rotational magnetic field, which rotates about the vertical center axis of the process chamber 3050 or of the wafer 10, in the processing volume 112 region. Additional details regarding the magnetic field generating mechanism 3010 is disclosed in, for example, U.S. Pat. No. 5,980,687.

Figure 31:
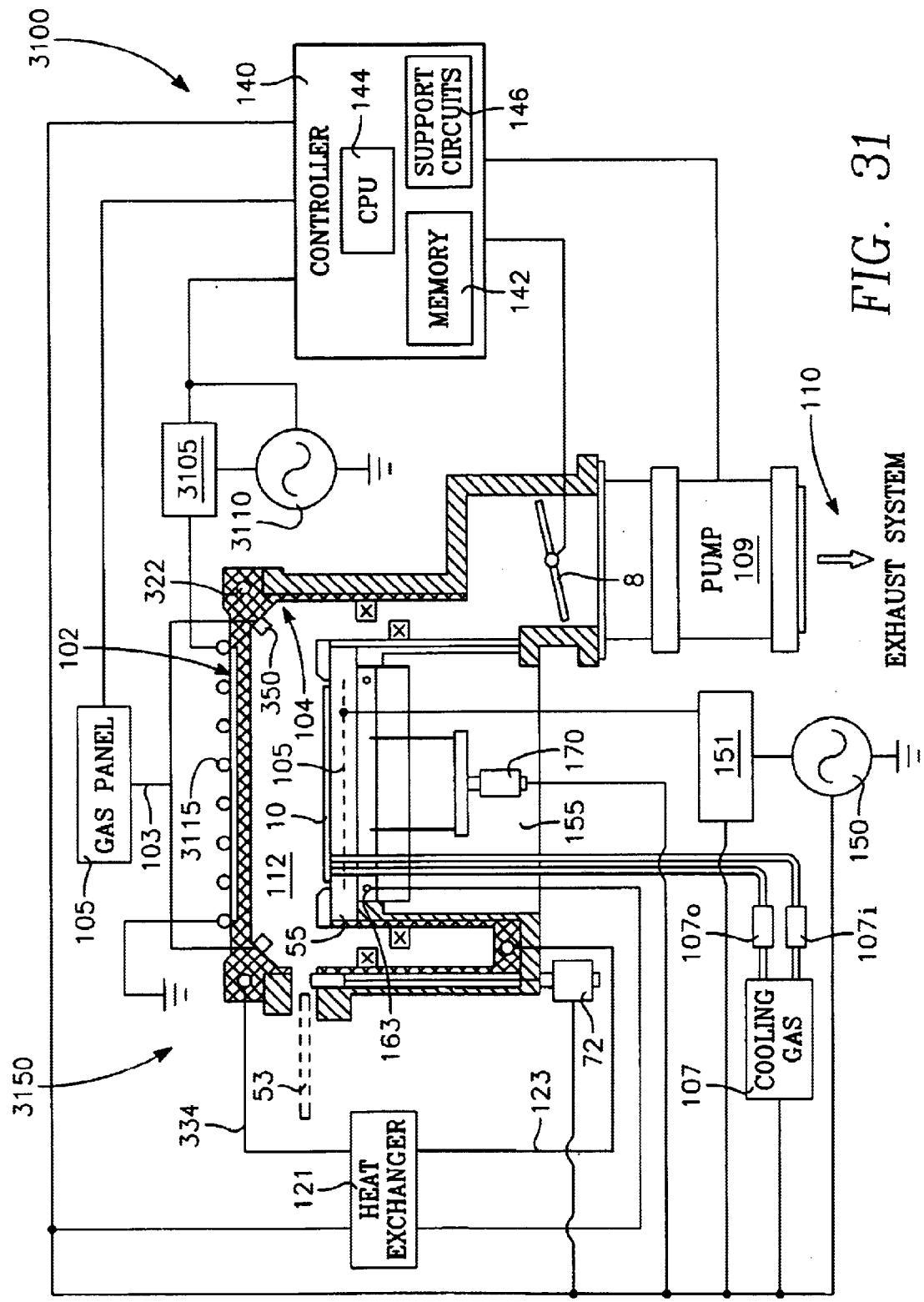
FIG. 31 is a cross-section partial schematic view of an alternative embodiment of the present invention in an etch processing system having an RF driven inductive member.

FIG. 31 is a cross sectional view of another processing chamber incorporating embodiments of the present invention, FIG. 31 illustrates an etch processing system 3100 having an etch chamber 3150. Processing system 3100 is similar to processing system 50 with the addition of a second RF generator 3110 and impedance matching circuitry 3105 operated by controller 140. Processing chamber 3050 is similar to processing chamber 100 with the addition of modifications to lid 102 to accommodate antenna 3115 mounted to the lid 102 and acting as an inductive member for coupling RF power from RF generator 3110 into processing volume 112. Impedance matching circuitry 3105 couples the RF signal from generator 3110 to antenna 3115. Nozzles 350 have been positioned at the periphery of lid 102 to accommodate the efficient inductive coupling of RF energy from antenna 3115 to a plasma formed in processing volume 112. FIG. 31 illustrates antenna 3115 in a flat coil arrangement. Other arrangements of antenna 3115 are possible, such as, for example, a ring arrangement, spiral arrangement, stacked arrangement, or, additionally, multiple antenna segments could be employed with each antenna segment of a multiple antenna segment coupled to an RF generator.

Figure 32:
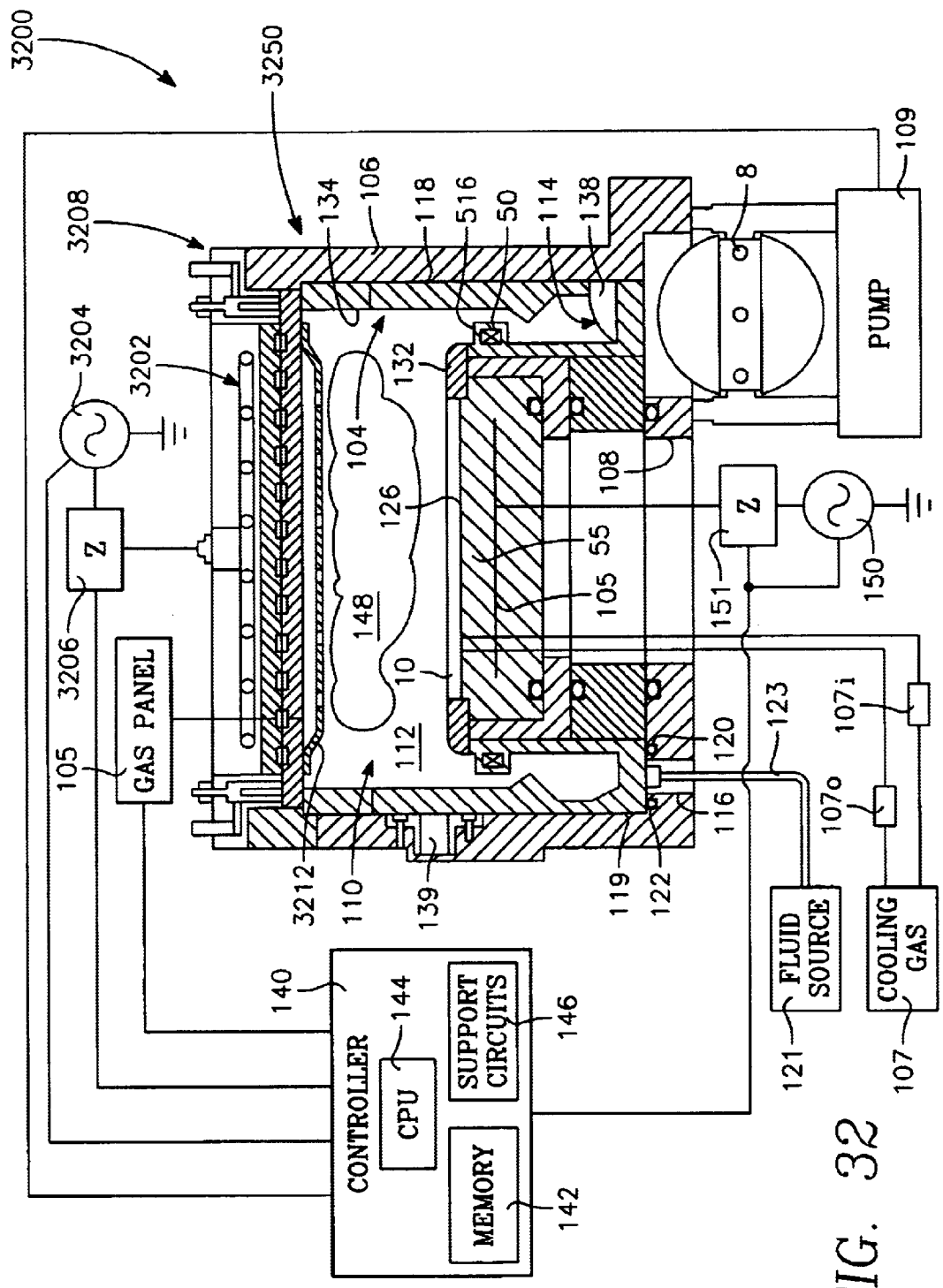
FIG. 32 is a cross-sectional schematic view of another semiconductor wafer processing system having a chamber liner with a showerhead gas distribution system and an inductive coil.

FIG. 32 is a cross sectional view of another embodiment of an etch chamber having the improvements of the present invention. FIG. 32 illustrates an etch processing system 3200 having an etch chamber 3250. Processing system 3200 is similar to processing system 50 of FIG. 1 with the addition of the second RF generator 3204 and impedance matching circuit 3206. Etch chamber 3250 is similar to etch chamber 100 with the addition of a flat inductive coil 602 and a showerhead style gas injection system instead of injector nozzles 350. The etch chamber 3250 has a temperature controlled chamber liner 104 which regulates the temperature of the chamber liner 104 in the manner described above. The chamber 3250 has a lid assembly 3208 that, with the chamber walls 106 and chamber bottom 108, define the process volume 110. A showerhead 3212 is disposed beneath the lid assembly 3208. Process and other gases from a gas panel 105 pass through a passage in the lid assembly 3208 and are dispersed into the chamber volume 110 through a plurality of holes in the showerhead 3212. Although shown with a first liner 118 and a second liner 134, the etch chamber 3250 may comprise one or both of the first and second liners 118 and 134. Etch chamber 3250 also illustrates a liner 118 having only a single protrusion 516 with magnetic system 50 disposed therein.

VII. Chamber Process Window and Representative Critical Dielectric Etch Processes Embodiments of the improvements of the present invention provide expanded dielectric etch processing capability. The dielectric etch process window enabled by combining the various improvements surpasses the dielectric etch window enabled by conventional etch chambers.

For example, a magnetically enhanced reactive ion etch chamber having embodiments of the present invention, such as, for example, MERIE chamber 2800 of FIG. 28, has several processing advantages over conventional MERIE processing reactors. Since it is not uncommon for dielectric etch processes to generate polymeric byproducts, several aspects of the present invention cooperatively provide improved polymer adhesion control. First, direct temperature control liners on the walls and cathode help minimize the heating effects caused by plamsa cycling. Plasma cycling occurs when the plasma heats portions of the chamber during processing. Polymer adhesion generally decreases with increasing temperature. As a result, those areas heated by plasma cycling are more likely to have polymer depositions that tend to flake off and cause particle contamination. By controlling and uniformly reducing the temperature of the liners, adhesion of the polymeric byproducts to the liners is improved thereby reducing the likelihood that the polymer byproducts will flake off and form particles. Second, use of minimized size gas inlet nozzles 350 ensures that the nozzles are heated by the plasma to temperatures above which the likelihood that by products will form on or adhere to the nozzle openings is reduced. Another advantage of minimized gas inlet nozzles 350 is that because of the small gas inlet nozzle area most of the plasma and by products contact the temperature controlled lid. Like the byproducts that come into contact with the temperature controlled liners, byproducts contacting the temperature-controlled lid will also preferentially deposit on and adhere to the temperature controlled lid and not on the plasma heated minimized size gas distribution nozzles. Third, the cathode and wall temperature controlled liners and the temperature-controlled lid may also further improve byproduct adhesion by incorporating surface texturing features such as those described above in Section IV. Thus, the combination of temperature controlled wall and cathode liners and temperature controlled lid together with minimized gas inlets ensures that most of the plasma processing region comprises temperature controlled surfaces with, preferably, high adhesion texturing.

Processing chambers having embodiments of the present invention enable dielectric etch processes employing high magnetic fields as high as about 120G and RF energy up to about 2500 W. Embodiments having a high chamber volume, such as a chamber volume of about 25,000 cc, and high capacity vacuum pumping systems such as, for example, a pump system having a pumping speed of from about 1600 l/s to about 2000 l/s enable a high gas flow-low chamber pressure processing regime that is not available in conventional magnetically enhanced and reactive ion etch processing reactors. One advantage of the high pumping speed is an improved capability to control reactive species formation and residence time. Residence time is directly related to the amount of reactive gas dissociation occurring in the plasma. The longer a gas molecule remains exposed to a plasma, the more likely it is that dissociation of that gas molecule will continue. Thus, etch processing reactors having embodiments of the present invention provide desirable plasma gas compositions by enabling improved residence time control.

Attempts have been previously made and reported on the use of $C_4F_6$ for dielectric etch processes. However, these reports have taught away from using a parallel plate reactor, such as the reactor of the present invention, for dielectric etch using $C_4F_6$, especially for the linear form of $C_4F_6$, e.g., hexafluoro-1,3-Butadiene (CF2=CFCF=CF2). Moreover, for the best knowledge of the inventors, none of the reported attempts have been successfully transferred into production lines.

For example, Yanagida discloses the use of a chain, hexafluorocyclobutene (c-$C_4F_6$), rather than linear ($C_4F_6$) in U.S. Pat. No. 5,338,399. On the other hand, in U.S. Pat. No. 5,366,590, Kadamura suggests that either linear of chain $C_4F_6$ may be used, but that a high density plasma, such as that generated using ECR plasma source, inductively coupled plasma source, or transformer coupled plasma source, must be used with either gas. Similarly, in Japanese Application Hei 9[1997]-191002 Fukuda discloses his work with linear $C_4F_6$, also using high density plasma generated using ECR plasma source. Chatterjee et al., report their work with hexafluoro-2-buttyne and hexafluoro-1,3-Butadiene, also using high density plasma generated by inductively coupled plasma source. Evaluation of Unsaturated Fluorocarbons for Dielectric Etch Applications, Ritwik Chatterjee, Simon Karecki, Laura Pruette, Rafael Reif, Proc. Electrochem. Soc. PV 99-30 (1999). Thus, the prior art teaches that in order to achieve acceptable etch results using linear $C_4F_6$, such as hexafluoro-1,3-Butadiene, one should use high density plasma, and not low or medium density plasma, such as that achieved using a capacitively coupled plasma source.

However, the present inventors have shown admirable results of etching using linear $C_4F_6$ in a capacitively coupled plasma source of the invention. The present inventors believe that the high energy generated by high density plasma chambers causes excessive dissociation of the linear $C_4F_6$. Therefore, they believe that improved results can be achieved using a capacitively coupled chamber, so as to limit the dissociation of the molecules. Also, the present inventors further limit dissociation by using the high pumping capacity enabled by the inventive etch chamber.

While not desiring to be bound by theory, it is believed that as an etchant gas, such as for example, linear $C_4F_6$, enters the plasma region of a processing chamber and is exposed to the plasma, it is cracked or dissociated into smaller entities. Generally, for fluorocarbon process gases, shorter residence times provide a capability to produce an increased percentage of the desirable fluorocarbon radical $CF_x^*$ while longer residence times produce an increased fraction of the fluorine radical $F^*$. Too much fluorine radical production may reduce photoresist selectivity and/or reduce sidewall profile control. Applicants have found that photoresist selectivity is generally improved with a residence time of less than about 70 ms, and preferably a residence time of less than about 50 ms. Applicants have found that oxide etch rate is improved with a residence time of about 40 ms. Such residence time is made possible by the processing reactor of the present invention and enables etching using linear $C_4F_6$ in a capacitively coupled RIE mode.

Another useful method of controlling the degree of radical formation in a gas composition is by incorporating an inert gas into the reactive gas composition. It is believed that increasing the amount of inert gas in a reactive gas composition reduces the amount of radicals formed from the reactive gas when the reactive gas/inert gas mixture is exposed to a plasma. Inert gas flow rate to reactive gas flow rate ratios from about 5:1 to about 20:1 are preferred. Total gas flows from about 50 sccm to about 1000 sccm with inert gas flow to reactive gas flow ratios of between about 12:1 to about 16:1 being more preferred.

Dielectric etch chambers having embodiments of the present invention enable a dielectric etch process window comprising up to 2500 W RF power, magnetic fields from about 0 to about 150 Gauss, total gas flows from 40 sccm to 1000 sccm, chamber pressures from about 20 mT to about 250 mT and liner temperatures ranging from about −20° C. to about 50° C. As described below with regard to FIGS. 33–38, the expanded process window enabled by etch reactors having embodiments of the present invention provide improved dielectric etch process performance, reliability and process tuning versatility for a wide variety of critical dielectric and oxide etch applications.

Figure 33A:
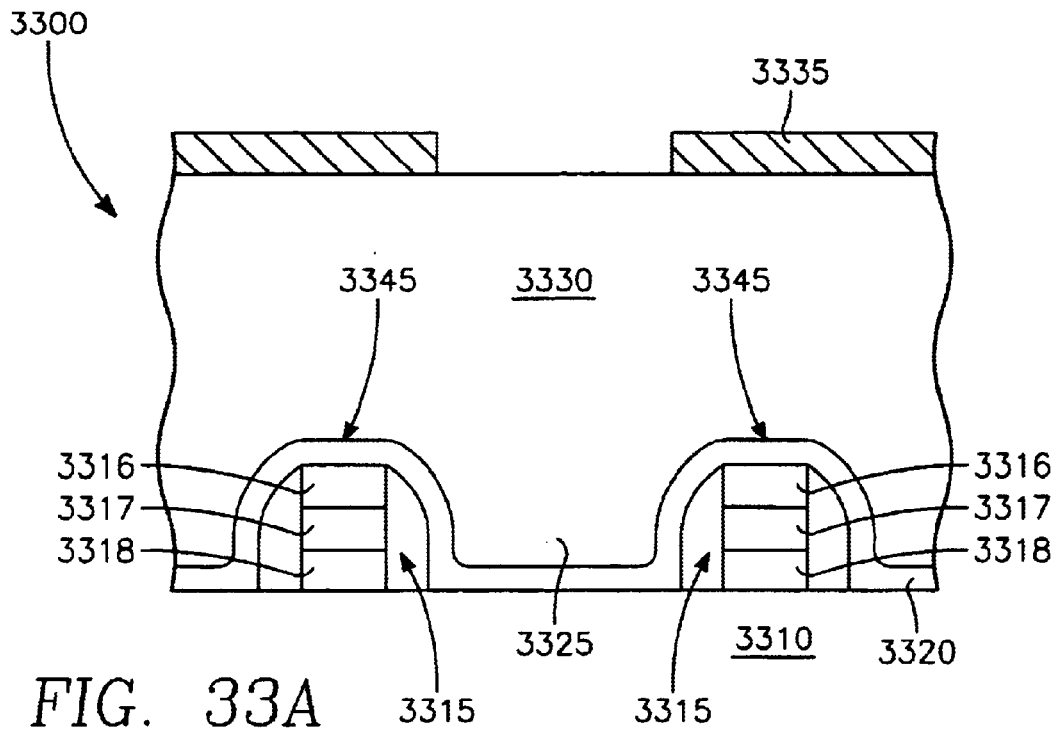
FIGS. 33A and 33B are cross-section views of a representative self-aligned contact feature.
Figure 33B:
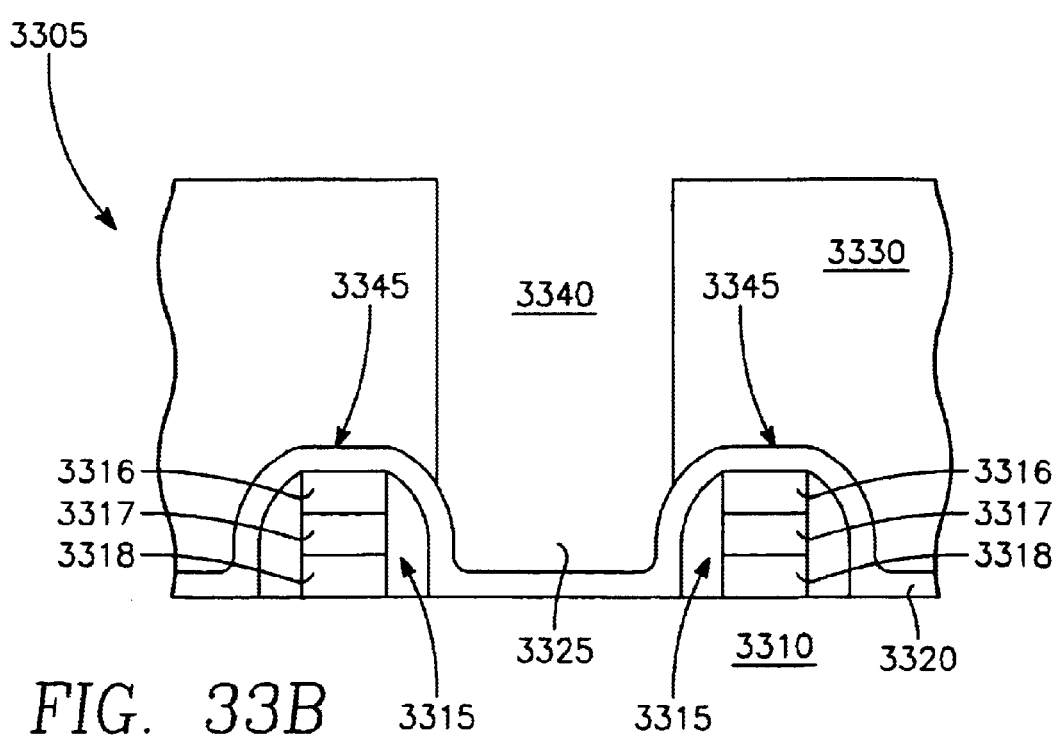

A representative self-aligned contact feature is illustrated in FIGS. 33A and 33B, which are not to scale. FIG. 33A represents pre-etch self aligned contact structure 3300. FIG. 33B represents post etch self-aligned contact structure 3305. Both self aligned contact structures 3300 and 3305 are formed on a silicon substrate 3310. Generally, word lines 3315 typically comprise and oxide layer 3316, a $WSi_x$ layer 3317 and a polysilicon layer 3318. Word lines 3315 are covered by a liner layer 3320 that is typically formed from silicon nitride. A representative bitline region 3325 is illustrated between adjacent word lines 3315. Dielectric layer 3330 is formed over liner layer 3320 and is typically formed from a silicon dioxide, such as, for example, and oxide layer formed from $O_3$-TEOS based processes. Alternatively, the dielectric layer 3330 may be formed from a doped silicon oxide film, such as, for example, a boron and phosphorus doped silicon glass (BPSG). Self aligned contact feature 3300 may include other layers, such as, for example, an anti-reflective coating may be utilized between pattern layer 3335 and dielectric layer 3330.

Also illustrated in pre-etch self-aligned contact feature 3300 of FIG. 33A is a mask pattern layer 3335. When pre-etch self aligned contact feature 3300 is exposed to a suitable etch process, dielectric layer 3330 is etched thereby transferring the pattern of mask layer 3335 onto the dielectric layer 3330. As illustrated in FIG. 33B, a contact area 3340 is formed when a portion of dielectric layer 3330 adjacent contact region 3325 is removed.

The exact dimensions of the self aligned contact structure 3300 and 3305 will vary depending upon a number of considerations, such as for example, device application, to design rules and critical dimensions of contact area 3340. For example, for purposes of illustration and not limitation, the self aligned contact structure 3300 may be a 0.25 micron design rule device having an overall dielectric layer 3300 thickness of about 6000 angstroms, a liner layer 3320 thickness of about 650 angstroms and a mask layer 3335 thickness of more than about 7000 angstroms with a pattern opening of about 0.25 microns. The self aligned contact etch processes enabled by the present invention are capable of etching self-aligned contacts having design rules with critical dimensions of less than about 0.25 microns and preferably having critical dimensions of between about 0.1 microns and to less than about 0.18 microns.

Etching of a self-aligned contact feature is a critical dielectric etch application in part because of the need to avoid etch stop or residual oxide at the word line sidewall. Additionally, a suitable self aligned contact etch process must maximize selectivity to the nitride shoulder 3345. Preferably, nitride shoulder selectivity is greater than about 20:1.

A suitable self aligned contact etch process chemistry comprises a fluorocarbon gas, and an oxygen comprising gas and an inert gas where the total gas flow is more than about 700 sccm and the inert gas comprises more than about 90% of the total gas flow. Reactive gas ratio refers to the ratio of the inert gas flow to the reactive gas flow. In this example, reactive gas ratio would be the ratio of the inert gas flow rate to the combined gas flow rates of the fluorocarbon gas and the oxygen comprising gas. A suitable self-aligned contact etch process has a reactive gas ratio of from about 12:1 to about 16:1 with a preferred reactive gas ratio of about 14.5:1. In a specific embodiment, the ratio of the flow rate of the fluorocarbon gas to the flow rate of the oxygen comprising gas is from about 1.5:1 to about 2:1. The chamber pressure is maintained from about 30 mT to about 40 mT, RF power is maintained from about 1800W to about 2000 W, the magnetic field is about 50G and the etch chamber is exhausted at a rate of from about 1600 l/sec to about 2000 l/sec. In a specific preferred embodiment, the etch chamber is exhausted at a rate of from about 48 chamber volumes to about 80 chamber volumes per second. In another preferred embodiment, the substrate support or cathode is maintained at between about 15° C. to about 20° C. while the temperature of a wall or, preferably a temperature controlled liner adjacent the substrate is maintained at about 50° C. In a specific, preferred embodiment the fluorocarbon gas is $C_4F_6$, the oxygen comprising gas is $O_2$ and the inert gas is Ar.

Figure 34A:
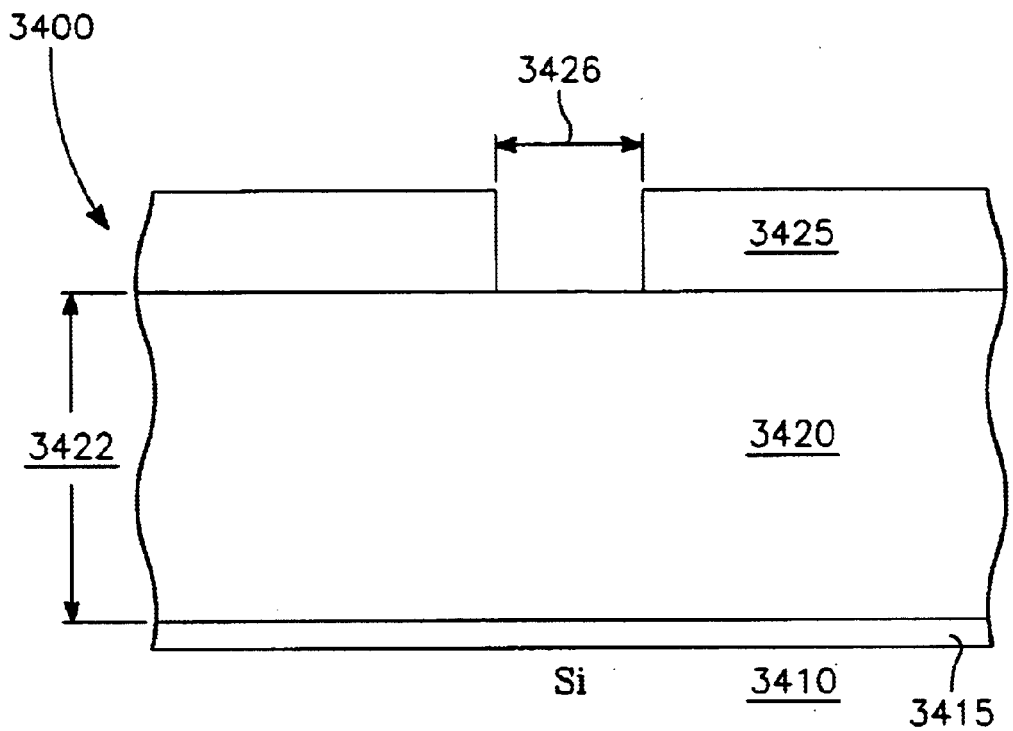
FIGS. 34A and 34B are cross-section views of a representative high aspect ratio contact feature.
Figure 34B:
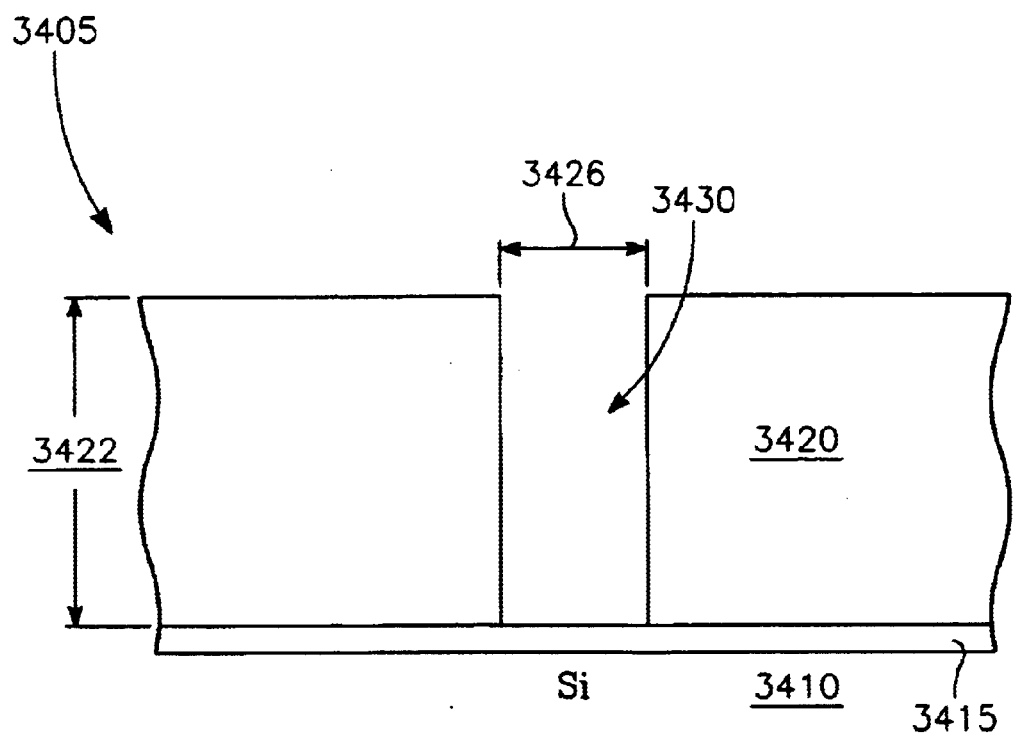

A representative high aspect ratio dielectric etch process will now be described with reference to FIGS. 34A and 34B. FIG. 34A illustrates a pre-etch high aspect ratio structure 3400 and FIG. 34B illustrates a post etch high aspect ratio structure 3405. Neither structure 3400 nor 3405 are illustrated to scale. In this context, a high aspect ratio dielectric etch process is defined as etching features having aspect ratios greater than about 5:1 to about 6:1 while a very high aspect ratio process is defined as etching features having aspect ratios in the range of from about 10:1 to about 20:1. For example, the aspect ratio of the feature 3430 in FIG. 34B is the ratio of the dielectric layer thickness 3422 to the feature width 3426. Magnetically enhanced and reactive ion etch chambers having embodiments of the present invention are capable of etching both high and very high aspect ratio features.

Turning now to FIG. 34A, a representative pre-etch high aspect ratio structure 3400 is illustrated that comprises a stop layer 3415 formed over a silicon substrate 3410. A dielectric layer 3420, having a thickness 3422, is formed over the stop layer 3415. A mask layer 3425 is formed over the dielectric layer 3420. Stop layer 3415 could be formed from a suitable stop layer material, such as silicon nitride for example. Of course, the specific type of stop layer material will depend upon the device type and design rules of a particular device.

FIG. 34B illustrates post etch high aspect ratio structure 3405 comprising high aspect ratio feature 3430. High aspect ratio feature 3430 is formed in the dielectric layer 3420 by transferring the pattern of mask layer 3425 onto dielectric layer 3420. The pattern of mask layer 3425 is transferred onto dielectric layer 3420 by conducting a suitable high aspect ratio dielectric etch process in and etch processing reactor having embodiments of the present invention as described in greater detail below. While a specific feature width 3426 will vary depending upon design rules, in general, feature width 3426 varies from about 0.25 micrometers to about 0.1 micrometers. The feature depth corresponds to the thickness of dielectric layer 3420.

As dielectric layer thickness 3422 increases, the selectivity of the high aspect ratio dielectric etch process to the mask layer 3425 photoresist material becomes even more critical. The possibility of etch stop also increases with increasing dielectric layer thickness 3422. Shrinking feature width 3426 also poses challenges for maintaining an appropriate sidewall profile of contact 3430. Bowing or a re-entrant sidewall profile of contact 3430 can lead to an unacceptably small diameter at the bottom of contact 3430 adjacent stop layer 3415. High aspect ratio contact etching is a critical dielectric etch process because of the challenges posed by shrinking feature width, increasing contact depth, selectivity to photoresist materials and sidewall profile control.

High aspect ratio feature etching may also be complicated by a dielectric layer 3420 comprising a doped silicon oxide such as, for example, BPSG. Dielectric layers 3420 comprising a plurality of dielectric materials forming a multi-level structure also pose many challenges to high aspect ratio feature etching. One example of such a multilevel structure is a feature structure having a dielectric layer 3420 comprising multiple intermediate stop layers at different depths, such as for example, those features seen mainly in the peripheral areas of stack capacitor DRAM structures.

The exact dimensions of the high aspect ratio structure 3400 will vary depending upon a number of considerations, such as for example, the device application, and the design rules of a particular device. For example, the representative high aspect ratio structure 3400 may have a mask with 3426 of about 0.25 microns, a mask layer 3425 thickness of about 7000 angstroms, a dielectric layer thickness 3422 of about 15,000 angstroms and a stop layer 3415 thickness of about 500 angstroms. It is to be appreciated that the above specific dimensions or for illustration and not for limitation. Magnetically enhanced and reactive ion etch chambers having embodiments of the present invention are capable of etching high aspect ratio and very high aspect ratio features having aspect ratios from about 5:1 to about 20:1 with critical dimensions (i.e., contact with 3426, for example) of from about 0.25 microns to about 0.1 microns.

Suitable high aspect ratio dielectric feature etch process window that meets the above challenges includes high magnetic field of up to about 100G, high RF power of up to about 2000W and high inert gas flow of between about 500 sccm and about 1000 sccm. Increased magnetic field provides increased selectivity to the photomask material in the mask layer and reduces the likelihood of sidewall bowing. Increased inert gas flow provides a wider range of reactive gas dilution thereby decreasing residence time and reactive species formation which in turn further improve photoresist selectivity. In addition, the increased pump speeds of the present invention described above with regard to self aligned contact etching may also be employed in high aspect ratio etching to further improve control of residence time and reactive species a formation.

The suitable high aspect ratio dielectric etch process comprises a fluorocarbon gas, and oxygen comprising gas and an inert gas where the total gas flow is more than about 700 sccm an and the inert gas comprises more than about 90 percent of the total gas flow. A suitable high aspect ratio dielectric etch process has a reactive gas ratio of from about 10:1 to about 15:1. In a specific embodiment, the ratio of the flow rate of the fluorocarbon gas to the flow rate of the oxygen comprising gas is about 1.5:1. In a specific embodiment the gas composition used for etching comprises a fluorocarbon gas flow that provides from about 3 percent to about 6 percent of the total gas flow, an oxygen comprising gas comprising from about one percent to about four percent of the total gas flow and an inert gas making up more than 90 percent of the total gas composition flow.

In the specific embodiment, the chamber pressure is maintained from about 20 mT to about 60 mT, the RF power is from about 1,000 watts to about 2,000 watts, the magnetic field is maintained at about 100G, and the etch chamber is exhausted at a rate from about 48 chamber volumes to about 80 chamber volumes per second. In another preferred embodiment, the substrate support is maintained at about −20 degrees C. while a wall or preferably, direct temperature control liner, is maintained at about 15C. In a specific preferred embodiment, the fluorocarbon gas is $C_4F_6$, the oxygen comprising gas is $O_2$ and the inert gas is argon.

Figure 35A:
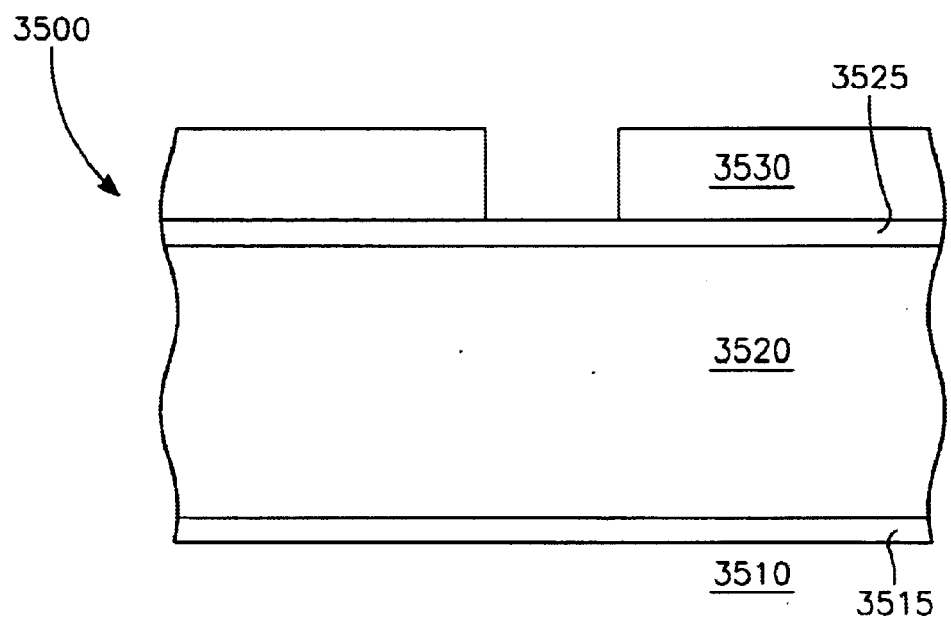
FIGS. 35A and 35B are cross-section views of a representative via feature.
Figure 35B:
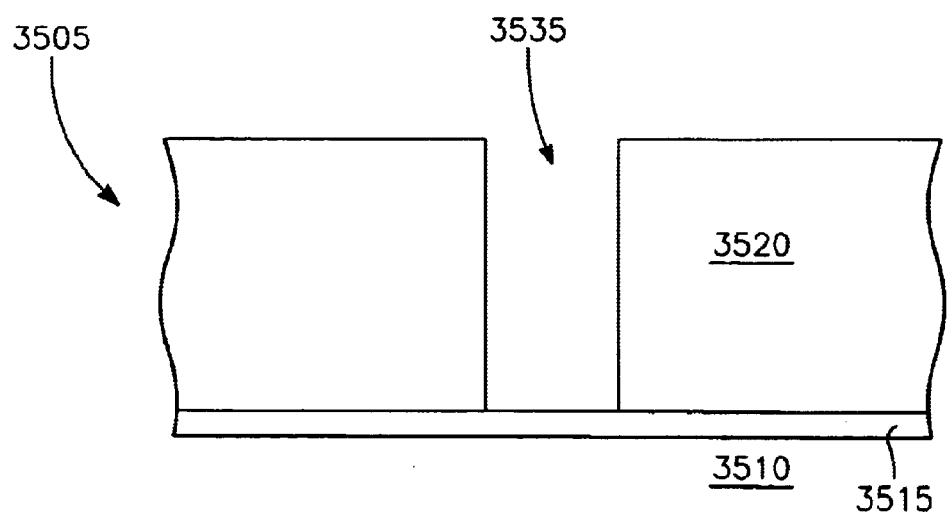

FIGS. 35A and 35B illustrate, respectively, representative pre- and post-metal via etch structures 3500 and 3505. Generally, metal via etch processes are important in forming interconnect structures between metal layers in an electronic device. Typically, the via formed in the dielectric material during a metal via etch is later filled by a metal such as, for example, a tungsten plug commonly used in aluminum based metalization schemes. Suitable metal via etch processes are selective to the barrier layer 3515 or alternatively, selective to the underlying metal layer 3510.

FIG. 35A represents pre-etch metal via fill structure 3500 formed over metal layer 3510. A barrier layer 3515, such as for example, a layer comprising titanium and titanium nitride, is formed over metal layer 3510 and separates dielectric layer 3520 from metal layer 3510. The dielectric layer 3520 is typically a TEOS based silicon dioxide and may, alternatively, be an HDP-CVD silicon dioxide film as well. FIG. 35A also illustrates the use of an anti-reflective coating layer 3525 under masking layer 3530.

The specific dimensions of metal via etch structures 3500 and 3505 such as the thickness of dielectric layer 3520 and the width of contact via 3535 vary depending upon the type of via structure and upon the design rules used in a particular device. For example, the 0.25 micron feature device may have a dielectric layer 3520 about 10,000 angstroms thick and formed from TEOS with a barrier layer 3515 about 500 angstroms thick and formed from titanium nitride. Etch reactors having embodiments of the present invention are capable of etching contact vias having critical dimensions of from about 0.25 microns to about 0.1 microns and vias having aspect ratios of up to about 5:1.

A suitable metal via etch gas composition chemistry comprises a fluorocarbon gas, and an oxygen comprising gas and an inert gas wherein the total gas flow is less than about 500 sccm. In a particular embodiment, the inert gas flow rate provides about 85 percent of the total gas composition flow and the ratio of the inert gas to the reactive gases (i.e., the ratio of the inert gas flow rate to the combined flow rates of the fluorocarbon gas and the oxygen comprising gas) is between about 4:1 to about 6:1. In a specific preferred embodiment, the fluorocarbon gas provides about 9.5 percent of the total gas composition flow, the chamber is maintained at about 20 mT, the RF power is about 1500 watts, the magnetic field is about 50 Gauss and the substrate support and a wall, or preferably a temperature control liner adjacent the substrate support, are maintained at about the same temperature.

In an alternative embodiment, the gas composition for a metal via etch process comprises a first fluorocarbon gas having a carbon to fluorine ratio of 1:3, a second fluorocarbon gas having a carbon to fluorine ratio of about 2:1 and any inert gas wherein the total gas flow of the gas composition is from about 200 sccm and to about 300 sccm. In a specific preferred embodiment, the first fluorocarbon gas comprises from about 14 percent to about 18 percent of the total gas composition flow, and the second fluorocarbon gas comprises from about 13 percent to about 16 percent of the total flow of the gas composition. In a specific preferred embodiment, the ratio of the first fluorocarbon gas flow rate to the inert gas flow rate and the ratio of the second fluorocarbon gas flow rate to the inert gas flow rate is from about 0.2 to about 0.25. In another specific embodiment, the first fluorocarbon gas is $C_2F_6$, the second fluorocarbon gas is $C_4F_8$, the inert gas is argon, the chamber is maintained at below about 200 mT, the RF power is about 1800 watts, the magnetic field is about 30 G and the chamber is exhausted at from about 1,600 liters per second to about 2,000 liters per second.

Figure 36A:
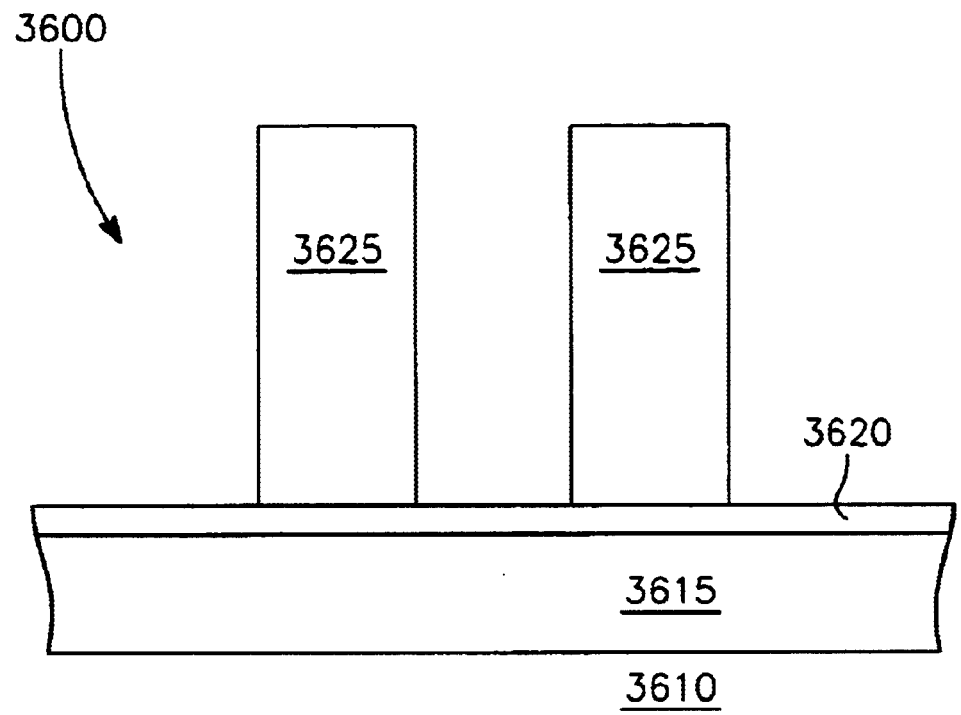
FIGS. 36A and 36B are cross-section views of a representative mask open feature.
Figure 36B:
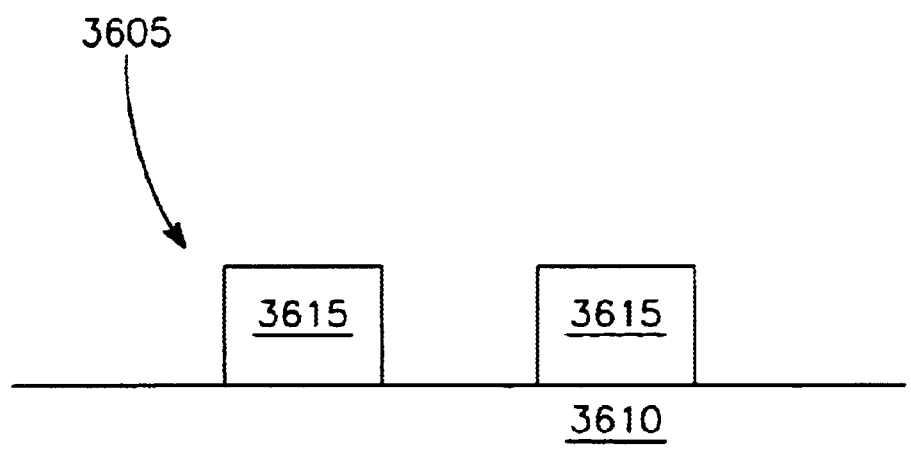

FIGS. 36A and 36B illustrate feature structures representative of a mask open application. FIGS. 36A and 36B are not drawn to scale. Some mask materials, such as for example, silicon nitride, are considerably more difficult to etch than other mask materials and are referred to as "hard masks." FIG. 36A illustrates pre-hard mask etch structure 3600. While hard masked layer 3615 may be formed over a wide variety of other layers and materials, FIGS. 36A and 36B illustrate a hard mask layer 3615 deposited directly on a silicon substrate 3610 formed from a suitable hard mask material, such as for example, silicon nitride. Nitride hard masks comprise, for example, active area hard mask etching and deed conductor hard mask etching. FIG. 36A also illustrates the use of an antireflective coating layer 3620 below photomask pattern layer 3625. FIG. 36B illustrates post hard mask etch structure 3605 where the pattern of photomask layer 3625 has been transferred into hard mask layer 3615 by a suitable hard mask etch process performed in and etch processing chamber having embodiments of the present invention.

The suitable hard mask open process chemistry comprises a gas composition comprising a hydrofluorocarbon gas, a fluorocarbon gas and an oxygen comprising gas wherein the total gas flow of the gas composition is from about 50 sccm to about 200 sccm. In a specific embodiment, the hydrofluorocarbon gas comprises more than about half of the total gas composition flow rate and the oxygen comprising gas flow rate comprises less than about 15 percent of the total gas composition flow rate. In another specific embodiment, the ratio of the flow rate of the hydrofluorocarbon gas to the flow rate of the fluorocarbon gas is about 1.5:1. In another specific embodiment, the ratio of the combined hydrofluorocarbon gas flow rate and the fluorocarbon gas flow rate to the flow rate of the oxygen comprising gas is about 5.5:1.

In a specific preferred embodiment, the hydrofluorocarbon gas is a $CHF_3$, the fluorocarbon gas is a $CF_4$, the oxygen comprising gas is $O_2$, the pressure in the process chamber is maintained from about 20 mT to about 80 mT and the RF power is about 500 watts. In yet another specific embodiment, the substrate support is maintained about 15 degrees Celsius higher than a temperature of an adjacent wall, or preferably, a temperature controlled liner.

Figure 37A:
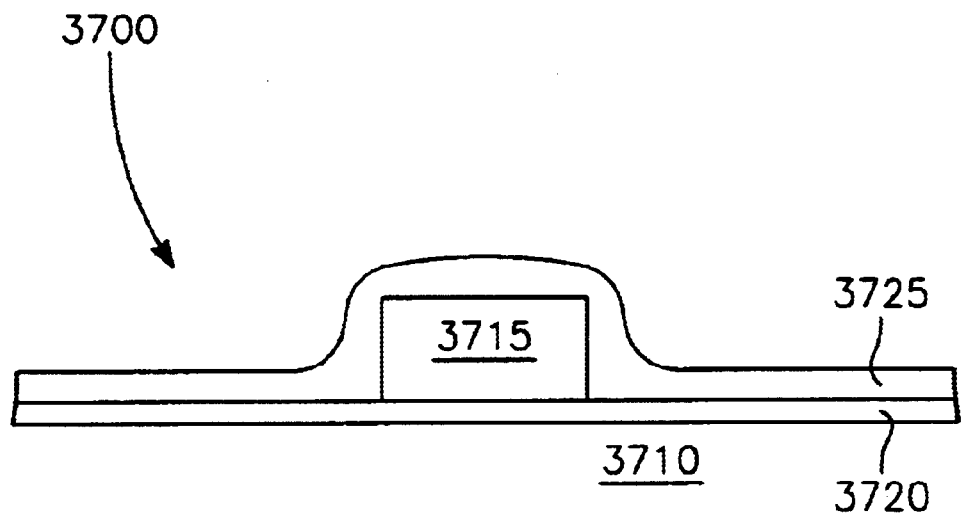
FIGS. 37A and 37B are cross-section views of a representative spacer feature.
Figure 37B:
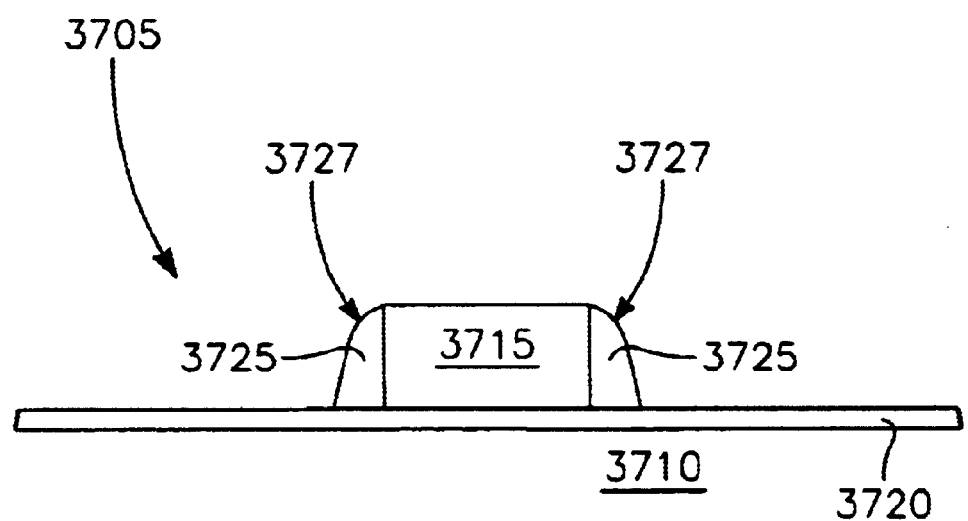

FIGS. 37A and 37B illustrate, respectively, pre-etch spacer structure 3700 and post etch spacer structure 3705. FIGS. 37A and 37B are not illustrated to scale. Pre-etch spacer structure 3700 illustrates a feature 3715 formed over an underlayer 3720 on top of a silicon substrate 3710. A dielectric layer 3725 is formed over both the feature 3715 and the underlayer 3720. Post etch spacer structure 3705 of FIG. 37B is formed after conducting a suitable spacer etch process as described in greater detail below. In post spacer etch structure 3705, spacer feature 3725 is formed by etching dielectric layer 3725 to expose the top portion of the feature 3715 and remove most of the underlayer 3720. In a representative spacer structure, feature 3715 could be formed from polysilicon and the underlayer 3720 could be formed from silicon dioxide.

In general, spacer etch processes may be divided into two categories based upon selectivity to the underlayer 3720. For example, in the illustrated spacer structure described above, the spacer etch process is selective to an underlying silicon dioxide layer. Alternatively, when removal of both dielectric layer 3725 an underlying layer 3720 is desired, a spacer etch process selective to the silicon substrate 3710 may be used in order to etch both dielectric layer 3725 and underlying layer 3720 before stopping upon reaching silicon substrate 3710.

The gas composition used to form a suitable spacer etch process chemistry comprises a hydrofluorocarbon gas, a fluorocarbon gas, an oxygen comprising gas and an inert gas with a total gas flow of the gas composition is from about 50 sccm to about 200 sccm. In a specific embodiment, the hydrofluorocarbon gas flow comprises more than about 40 percent of the total gas flow and the oxygen comprising gas comprises less than about 5 percent of the total gas composition flow rate. In another specific embodiment, the ratio of the hydrofluorocarbon gas flow to the fluorocarbon gas flow is about 2.5:1. In yet another specific embodiment, the combined flow rate of the hydrofluorocarbon gas and the fluorocarbon gas to the flow rate of the inert gas is about 1.75:1.

In a specific preferred embodiment, the fluorocarbon gas is $CF_4$, the hydrofluorocarbon gas is $CHF_3$, the oxygen comprising gas is $O_2$, the inert gas is argon, the pressure of the etch chamber is maintained at between about 20 mT to about 80 mT, the RF power is about 400 watts, the substrate support is maintained at a temperature about 25 degrees Celsius higher than an adjacent wall, or preferably, an adjacent direct temperature controlled liner.

Figure 38A:
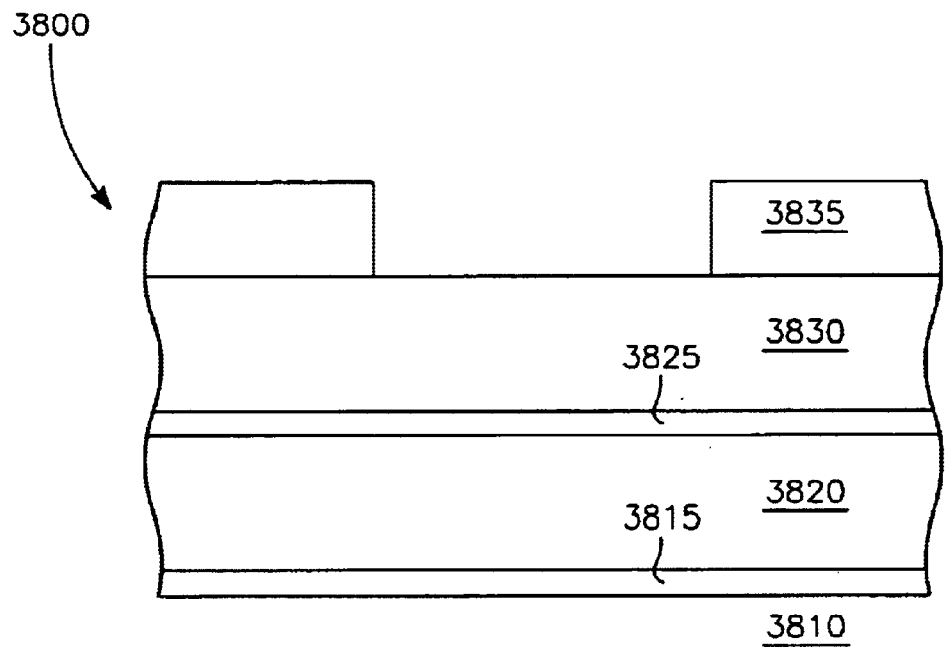
FIGS. 38A and 38B are cross-section views of a representative dual damascene feature.
Figure 38B:
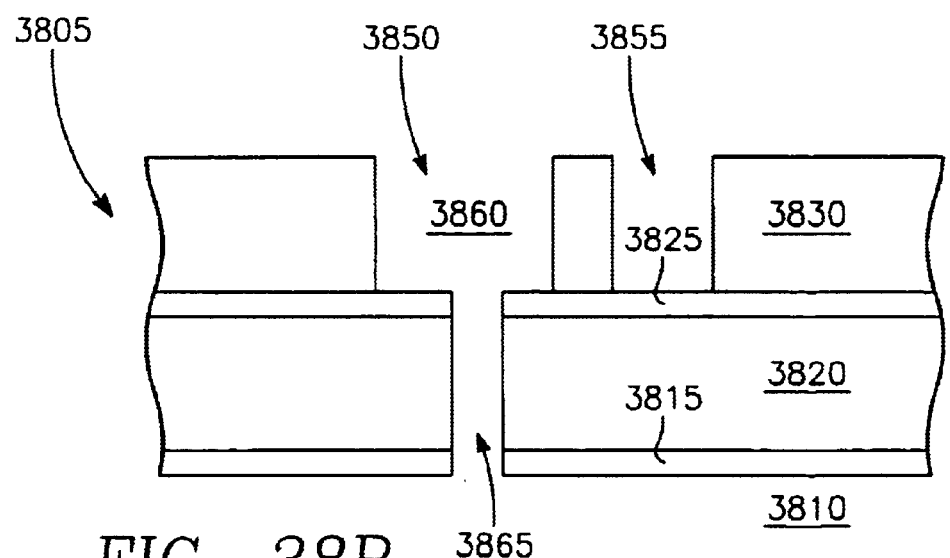

FIGS. 38A and 38B illustrate representative structures for etching dual damascene features. FIG. 38A illustrates pre-dual damascene dielectric etch structure 3800 and FIG. 38B illustrates post dual damascene dielectric etch structure 3805. FIGS. 38A and B are not illustrated to scale.

FIG. 38A illustrates a basic dual damascene structure formed over in metal layer, such as for example, a copper layer 3810. Two dielectric layers, namely trench dielectric layer 3830 and via dielectric layer 3820, are etched during a suitable dual damascene dielectric etch process, such as those discussed in more detail below. A bottom nitride layer 3815 separates the copper layer 3810 from the via dielectric layer 3820. Intermediate nitride layer 3825 separates the trench dielectric layer 3830 from the via dielectric layer 3820. In some dual damascene etch processes, the intermediate nitride layer 3825 is used as a stop layer for etching the trench dielectric layer 3830 and the bottom nitride layer 3815 is used as a stop layer for etching the via dielectric layer 3820. FIG. 38B illustrates post dual damascene etch structure 3805 that includes a via feature 3850 and an interconnect feature 3855. Typically, the via feature 3850 and the interconnect feature 3855 are filled by subsequent metalization processes.

There are at least three fundamental process flows used to form dual damascene features: self aligned, trench first, and via first. While other structures may be and are used, in general, typical dual damascene etch processes begin with a pre-etch structure, such as structure 3800 of FIG. 38A, and finish with a structure having a via feature 3850 and an interconnect feature 3855 as illustrated in FIG. 38B.

In a self aligned dual damascene process, a via pattern is etched first by opening intermediate nitride layer 3825. During a subsequent etch step that uses bottom nitride layer 3815 as an etch stop layer, both the via feature 3850 and the interconnect feature 3855 are formed. Finally, the bottom nitride layer 3815 is removed to expose copper layer 3810.

In a trench first dual damascene process, the mask pattern layer 3835 forms the pattern for the interconnect feature 3855 and the upper portion 3860 of the via feature 3850. The resulting intermediate structure comprises interconnect 3855 and the upper portion of via feature 3860. This intermediate structure is then patterned and etched to form the lower portion of via feature 3865 using bottom nitride layer of 3815 as an etch stop layer. A subsequent etch step is then used to remove bottom nitride layer 3815 and expose the copper layer 3810.

In a via first dual damascene process, a via pattern is formed by the mask pattern layer 3835. The via pattern is subsequently transferred to both of the dielectric layers 3830 and 3820 and to the intermediate nitride layer 3825. This step forms an intermediate structure comprising the lower portion 3865 of via structure 3850. Next, a trench mask pattern is formed over this intermediate structure to pattern the trenches, namely the interconnect feature 3855 and the upper portion of contact feature 3860. The bottom nitride layer 3815 is subsequently removed exposing the copper layer 3810.

The exact dimensions of the dual damascene structures 3800 and 3805 will vary depending upon a number of considerations, such as for example, the type of dual damascene process sequence and the design rules of a particular device. The particular design rules determine the dimensions for trench feature 3855, via feature 3850 and, more importantly, the critical dimension of contact region 3865. Etch process chambers having embodiments of the present invention are capable of etching dual damascene structures having critical dimensions of about 0.3 microns to about 0.25 microns and even structures having critical dimensions of about 0.1 microns to about 0.2 microns.

A suitable dual damascene trench etch process chemistry comprises a fluorocarbon gas having a carbon to fluorine ratio of about 1:3 and a gas comprising carbon and oxygen. In a preferred embodiment, most of the gas composition comprises a gas comprising carbon and oxygen with the total flow of the gas composition being from between about 200 sccm to about 400 sccm. In a specific preferred embodiment, at least about 60 percent of the gas composition comprises a gas comprising oxygen and carbon. In another specific embodiment, the ratio of the flow rate of the gas comprising oxygen and carbon to the flow rate of the fluorocarbon gas is about 1.67:1. In yet another specific preferred embodiment, the fluorocarbon gas is $C_2F_6$, the gas comprising oxygen and carbon is CO, the pressure to processing chamber is maintained at between about 100 mT to about 200 mT, the magnetic field in the processing region is about 30G and the RF power is about 1500 watts.

In an alternative embodiment where the dual damascene structure comprises a nitride stop layer, a suitable dual damascene etch process chemistry comprises a gas composition comprising a polymerizing fluorocarbon having a C:F ratio of about 1:2, and oxygen comprising gas and an inert gas. In a specific preferred embodiment, the inert gas comprises more than about 90 percent of the total gas composition flow, and the oxygen comprising gas comprises less than about 1 percent of the total gas composition flow. In another specific preferred embodiment, the ratio of the inert gas flow to the combined flow rates of the polymerizing fluorocarbon gas and the oxygen comprising gas is from about 20:1 to about 22:1. In a specific preferred embodiment the polymerizing fluorocarbon gas is $C_4F_8$ and the oxygen comprising gas is $O_2$ and the ratio of the $C_4F_8$ flow rate to the $O_2$ flow rate is about 3:1 about 4:1. In a specific preferred embodiment, the gas composition comprises a $C_4F_8$, $O_2$ and Ar wherein the Ar flow rate is more than about 95 percent of the total gas composition flow rate, the $C_4F_8$ flow rate comprises more than about three percent of the total gas composition flow rate, the chamber is maintained at about 80 mT, the RF power level is about 1800 watts, the magnetic field in a processing region is about 20G, the substrate support is maintained at about 10 degrees Celsius higher than the temperature of an adjacent wall or, preferably, a temperature controlled liner.

One suitable dual damascene via etch chemistry comprises a gas composition comprising a fluorocarbon gas having a C:F ratio of about 2:3, and oxygen comprising gas and an inert gas. In a specific preferred embodiment, the etch chamber is maintained between about 30 mT to about 80 mT, the total gas composition flow rate is from about 300 sccm to about 500 sccm an and the ratio of the inert gas flow rate to the combined flow rates of the fluorocarbon gas having a C:F ratio of about 2:3 and an oxygen comprising gas is from about 5:1 to about 7:1 and more preferably, about 6:1. In a specific preferred embodiment, the fluorocarbon gas having a C:F ratio of about 2:3 is $C_4F_6$, the oxygen comprising gas is $O_2$ and inert gas is argon, the $C_4F_6$ comprises about 5% to about 9% of the total gas composition flow and the inert gas flow comprises more than about 80 percent of the gas composition flow, the chamber is maintained at about 50 mT, the RF power is about 1800 watts and a magnetic field in the processing region is about 50 G.

In another alternative embodiment, a two-step dual damascene via etch process may be used. A suitable to two-step dual damascene via etch process chemistry comprises a gas composition comprising a polymerizing fluorocarbon gas, a hydrofluorocarbon gas, an oxygen comprising gas and an inert gas wherein the ratio of the inert gas flow to the combined gas flows of the polymerizing fluorocarbon gas, the hydrofluorocarbon gas and the oxygen comprising gas is from about 4:1 to about 6:1; and the polymerizing fluorocarbon gas used in the second step is greater than the first step. In a specific preferred embodiment of a suitable two-step dual damascene via process, the first step gas composition comprises less than about three percent polymerizing fluorocarbon gas, about 4 percent to about 5 percent oxygen comprising gas, about 7 percent to about nine percent hydrofluorocarbon gas and more than about 80 percent inert gas while the second step comprises more than about 4 percent polymerizing fluorocarbon gas, about 4 percent to about 5 percent oxygen comprising gas, about 7 percent to about 8 percent hydrofluorocarbon gas and more than about 80 percent inert gas. In a specific preferred embodiment, the total gas composition flow rate in each etch step is from about 500 sccm to about 1,000 sccm, the pressure is about 50 mT, the RF power level is about 2,000 watts and the magnetic field apply to the processing region is about 15G. In another specific preferred embodiment, the polymerizing fluorocarbon gas is $C_4F_6$, the hydrofluorocarbon gas is $CHF_3$, the oxygen comprising gas is $O_2$ and the inert gas is Ar.

It is to be appreciated that each of the alternative etch process chamber embodiments and critical etch processes described above may incorporate aspects of the high exhaust pump rate and reduced reactive species residence time control feature of the present invention.

The terms "below", "above", "bottom", "top", "up", "down", "first", and "second" and other positional terms are shown with respect to the embodiments in the figures and may be varied depending on the relative orientation of the processing system.

Furthermore, in this specification, including particularly the claims, the use of "comprising" with "a" or "the", and variations thereof means that the item(s) or list(s) referenced includes at least the enumerated item(s) or list(s) and furthermore may include a plurality of the enumerated item(s) or list(s), unless otherwise stated.

Although the embodiment of the invention which incorporate the teachings of the present invention which has been shown and described in detail herein, those skilled in the art can readily devise other varied embodiments which still incorporate the teachings and do not depart from the spirit of the invention.

What is claimed is:

1. A method of etching features on a dielectric layer on a substrate with enhanced etch selectivity, comprising:
   (a) disposing a substrate in a processing region of a plasma etch chamber;
   (b) controlling the temperature of a substrate support;
   (c) flowing a gas composition comprising hexafluoro-1,3-Butadiene, oxygen and argon, into the processing region;
   (d) capacitively coupling RF energy into the processing region to form a plasma from the gas composition;
   (e) providing a magnetic field in the processing region; and
   (f) continuously evacuating the chamber at a pumping rate of a vacuum pump of at least about 1600 liter per second, wherein said pumping rate is sufficient to provide a residence time of reactive species in the processing region of less than about 70 ms.

2. The method of claim 1, wherein said flowing a gas composition is performed at total gas flow from 40 sccm to 1000 sccm.

3. The method of claim 1, wherein flow ratio of argon to hexafluoro-1,3-Butadiene is from about 5:1 to about 20:1.

4. The method of claim 1, wherein said evacuating comprises maintaining the chamber pressure from about 20 mT to about 250 mT.

5. The method of claim 1 wherein said flowing a gas composition is performed at a total gas flow from 40 sccm to 1000 sccm; and
   wherein said maintaining a low pressure comprises maintaining the chamber pressure from about 20 mT to about 250 mT.

6. A method of claim 5 wherein the step of disposing a substrate in a processing region comprises providing a volume on the order of about 20,000 cc in said processing region.

7. A method of plasma etching features on a dielectric layer on a substrate disposed in a capacitively coupled plasma etch chamber and enhancing etch selectivity, comprising:
   (a) disposing a substrate in a processing region of a capacitively coupled plasma etch chamber;
   (b) ccntrollinq the temperature of a substrate support;
   (c) flowing a gas composition comprising linear C4F6 oxygen and argon, into the processing region;
   (d) capacitively coupling RF energy into the processing region to form a plasma from the gas composition; and
   (e) evacuating the chamber at a pumping rate of a vacuum pump of at least 1600 liters per second in a continuous manner, wherein said pumping rate is sufficient to provide a residence time of reactive species in the processing region of less than about 70 ms.

8. The method of claim 7, wherein said flowing a gas composition is performed at a total gas flow from 40 sccm to 1000 sccm.

9. The method of claim 7, wherein flow ratio of argon to linear C4F6 is from about 5:1 to about 10:1.

10. The method of claim 7, wherein said evacuating comprises maintaining the chamber pressure from about 20 mT to about 250 mT.

11. The method of claim 7 wherein said pumping rate is sufficient to evacuate said chamber at a rate of 48 to 80 chamber volumes per second.

12. A method of etching features on a dielectric layer on a substrate and enhancing etch selectivity, comprising:

(a) disposing the substrate in a processing region of the reactor chamber;

(b) flowing a gas composition comprising linear C4F6, oxygen and argon into the processing region at a high gas composition flow rate and a high argon-to-C4F6 flow ratio;

(c) capacitively coupling RF energy into processing region to form a plasma from the gas composition; and (d) continuously evacuating said chamber at a vacuum pump rate of at least about 1600 liters per second, wherein said vacuum pump rate is sufficient to maintain a residence time of species of said gas composition on the order of about 70 ms or less.

13. The method of claim 12 wherein said low pressure is in a range of about 20 mT to 250 mT.

14. The method of claim 13 wherein said high gas composition flow rate is in a range of about 40 sccm to 1000 sccm.

15. The method of claim 14 wherein said high argon-to-C4F6 flow ratio is in a range of about 5:1 to 20:1.

16. The method of claim 12 further comprising providing a magnetic field in the processing region.

17. The method of claim 16 wherein said magnetic field is a rotating magnetic field.

18. The method of claim 17 wherein said magnetic field has a strength in the range of about 100 Gauss to 150 Gauss.

19. A method of etching features on a dielectric layer on a substrate with enhanced etch selectivity, comprising:

(a) disposing the substrate in a processing region of the reactor chamber;

(b) cooling said substrate;

(c) cooling a wall of said chamber to a sufficiently low temperature to promote adhesion of polymer materials on said wall;

(d) flowing a gas composition comprising linear a species containing hexafluorobutadiene, oxygen and argon through an overhead gas distribution apparatus into the processing region at a high gas composition flow rate and a high argon-to-fluorocarbon flow ratio;

(e) capacitively coupling RF energy into processing region to form a plasma from the gas composition; and (f) continuously evacuating said chamber at a vacuum pump rate of at least about 1600 liters per second, wherein said vacuum pump rate is sufficient to maintain a residence time of species of said gas composition on the order of about 70 ms or less.

20. The method of claim 19 wherein said low pressure is in a range of about 20 mT to 250 mT.

21. The method of claim 20 wherein said high gas composition flow rate is in a range of about 40 sccm to 1000 sccm.

22. The method of claim 21 wherein said high argon-to-fluorocarbon flow ratio is in a range of about 5:1 to 20:1.

23. The method of claim 22 further comprising providing magnetic field in the processing region.

24. The method of claim 23 wherein said magnetic field is rotating magnetic field.

25. The method of claim 24 wherein said magnetic field has a strength in the range of about 100 Gauss to 150 Gauss.

26. The method of claim 19 wherein the step of flowing a gas composition comprises introducing the gas composition through a gas distribution apparatus in a ceiling of the chamber overlying the substrate.

27. A method of performing a self-aligned contact etch process on a semiconductor substrate with a plasma etch reactor with enhanced etch selectivity, comprising:

(a) disposing the substrate in a processing region of the plasma reactor;

(b) flowing a gas composition comprising hexafluorobutadiene, oxygen and argon;

(c) capacitively coupling RF energy into processing region to form a plasma from the gas composition; and (d) continuously evacuating said chamber at a vacuum pump rate of at least about 1600 liters per second, wherein said vacuum pump rate is sufficient to maintain a residence time of species of said gas composition on the order of about 70 ms or less.

28. The method of claim 27 further comprising:

cooling a wall of said chamber to a sufficiently low temperature to promote adhesion of polymer materials on said wall.

29. The method of claim 27 wherein the step of flowing a gas composition comprises introducing the gas composition into the processing region through an overhead gas distribution apparatus.

30. The method of claim 27 wherein the step of flowing a gas composition is carried out at a high gas flow rate and a high argon-to-fluorocarbon flow ratio.

* * * * *